United States Patent
Chen et al.

(10) Patent No.: US 11,616,143 B2
(45) Date of Patent: Mar. 28, 2023

(54) SEMICONDUCTOR DEVICES WITH BACKSIDE POWER RAIL AND METHODS OF FABRICATION THEREOF

(71) Applicant: TAIWAN SEMICONDUCTOR MANUFACTURING CO., LTD., Hsinchu (TW)

(72) Inventors: Chun-Yuan Chen, Hsinchu (TW); Huan-Chieh Su, Changhua County (TW); Pei-Yu Wang, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 93 days.

(21) Appl. No.: 17/005,134

(22) Filed: Aug. 27, 2020

(65) Prior Publication Data

US 2022/0069116 A1    Mar. 3, 2022

(51) Int. Cl.
| | |
|---|---|
| *H01L 29/78* | (2006.01) |
| *H01L 21/8234* | (2006.01) |
| *H01L 27/088* | (2006.01) |
| *H01L 29/06* | (2006.01) |
| *H01L 29/417* | (2006.01) |
| *H01L 29/66* | (2006.01) |

(52) U.S. Cl.
CPC .... *H01L 29/785* (2013.01); *H01L 21/823431* (2013.01); *H01L 27/0886* (2013.01); *H01L 29/0649* (2013.01); *H01L 29/41791* (2013.01); *H01L 29/66795* (2013.01); *H01L 2029/7858* (2013.01)

(58) Field of Classification Search
CPC .............. H01L 29/785; H01L 29/0649; H01L 29/41791; H01L 29/66795; H01L 29/42392; H01L 29/78696; H01L 21/823431; H01L 27/0886; H01L 27/0924; H01L 2029/7858
USPC ................................ 257/365, 288, 369, 401
See application file for complete search history.

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 2019/0006486 A1* | 1/2019 | Ching | ................ H01L 27/0924 |

(Continued)

*Primary Examiner* — Dao H Nguyen
(74) *Attorney, Agent, or Firm* — NZ Carr Law Office

(57) ABSTRACT

Embodiments of the present disclosure provide a method for forming backside metal contacts with reduced $C_{gd}$ and increased speed. Particularly, source/drain features on the drain side, or source/drain features without backside metal contact, are recessed from the backside to the level of the inner spacer to reduce $C_{gd}$. Some embodiments of the present disclosure use a sacrificial liner to protect backside alignment feature during backside processing, thus, preventing shape erosion of metal conducts and improving device performance.

20 Claims, 43 Drawing Sheets

(56) References Cited

U.S. PATENT DOCUMENTS

| | | | | |
|---|---|---|---|---|
| 2020/0294998 A1* | 9/2020 | Li | .......................... | H01L 23/481 |
| 2021/0408246 A1* | 12/2021 | Ganguly | ............... | H01L 29/401 |
| 2021/0408285 A1* | 12/2021 | Hickey | ............. | H01L 29/66545 |
| 2022/0102506 A1* | 3/2022 | Cook | .................... | H01L 29/785 |

* cited by examiner

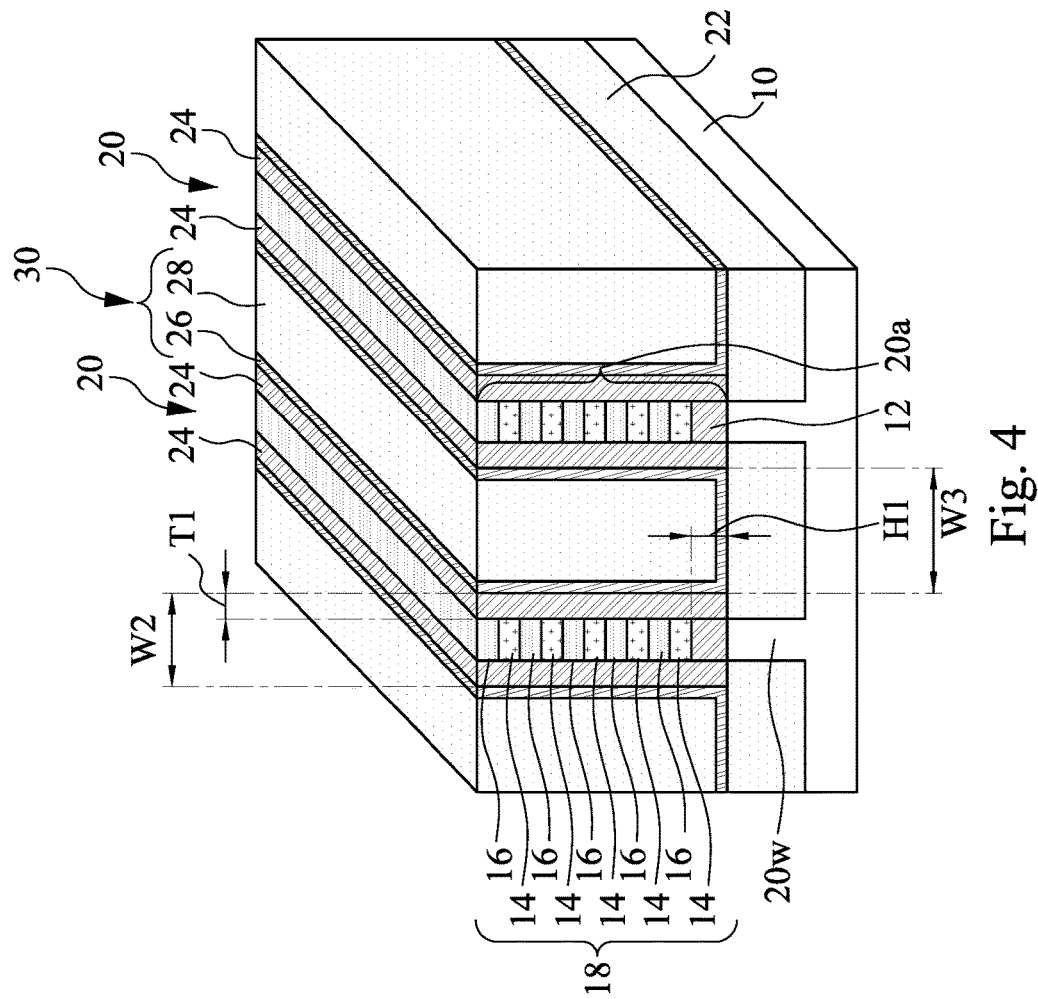
Fig. 4
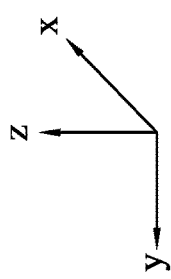

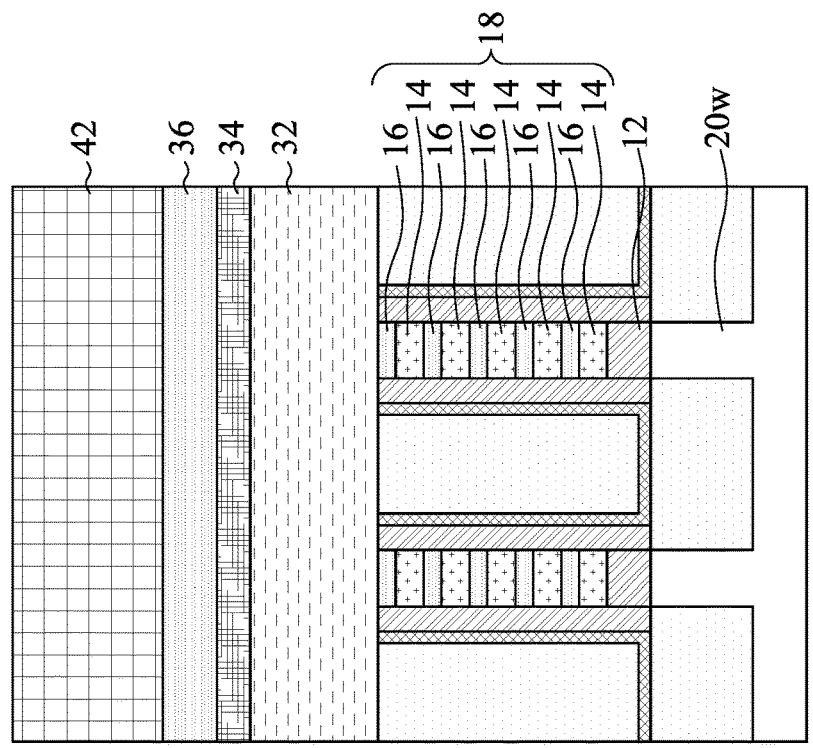
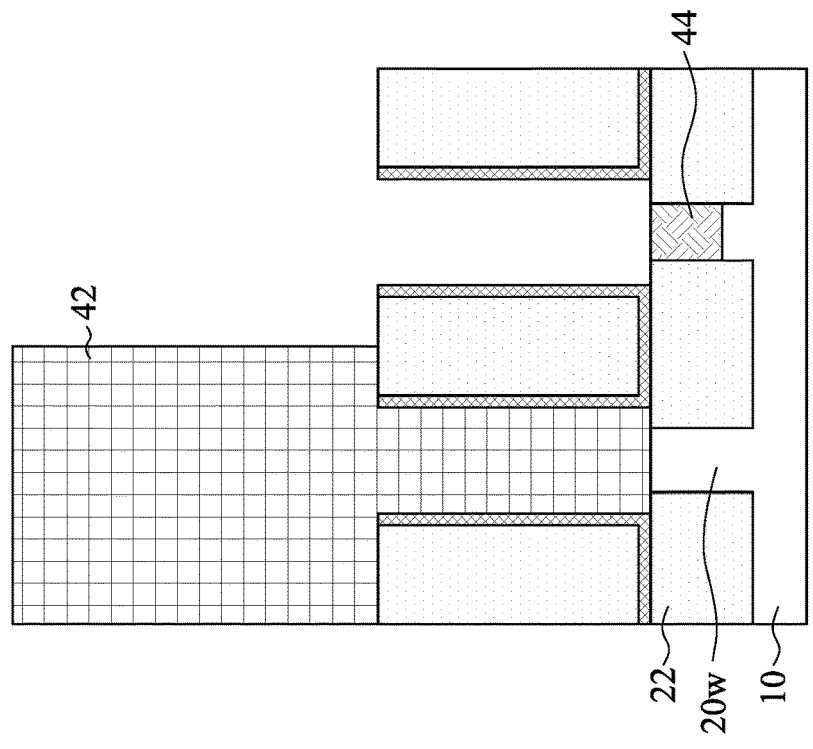
Fig. 8B
Fig. 8A

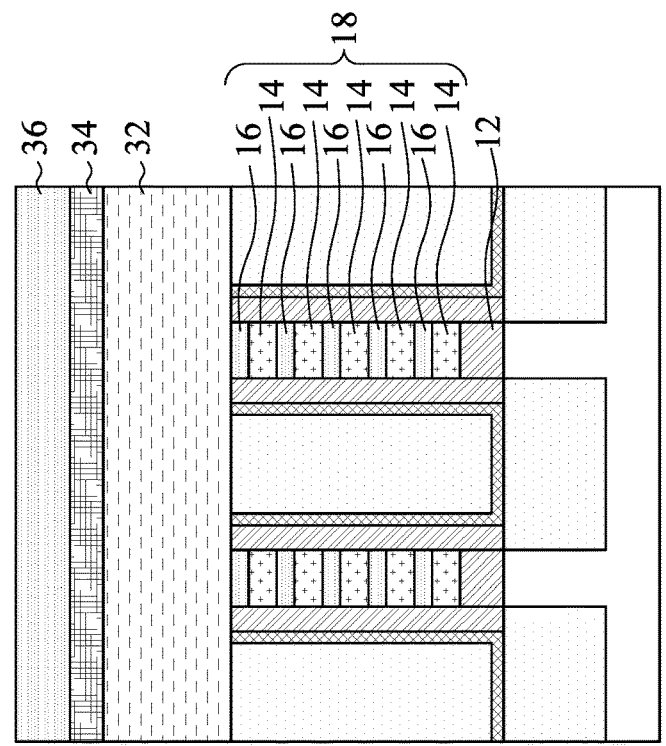
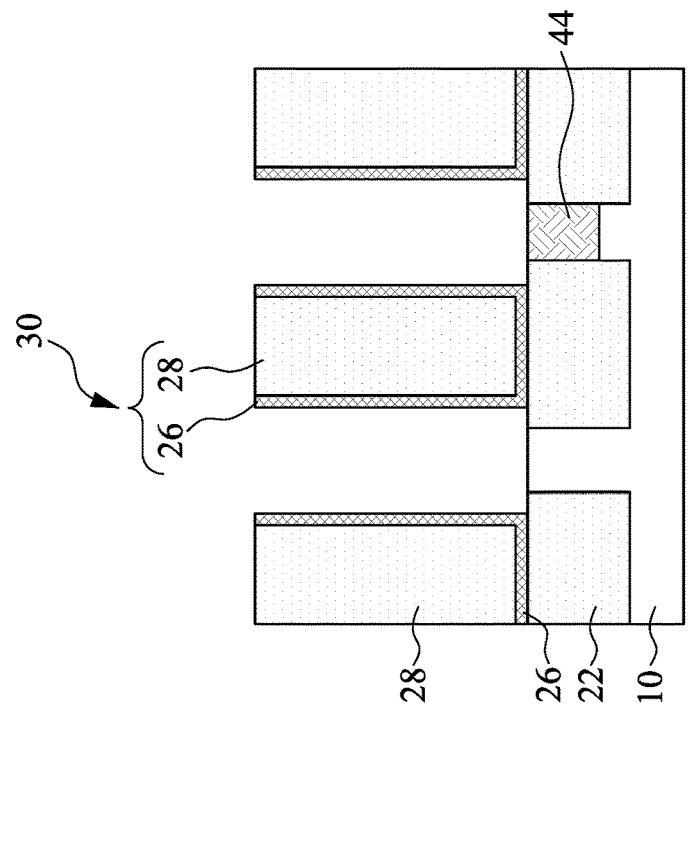
Fig. 9B
Fig. 9A

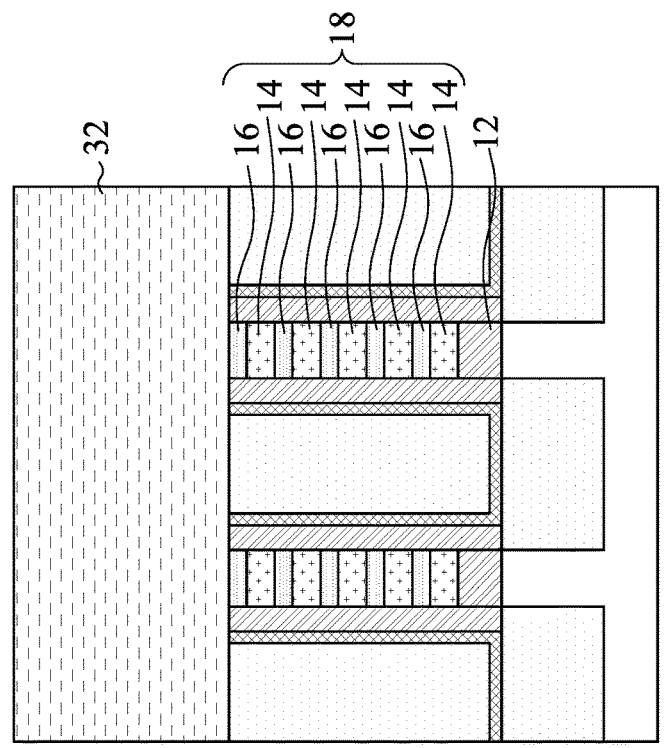
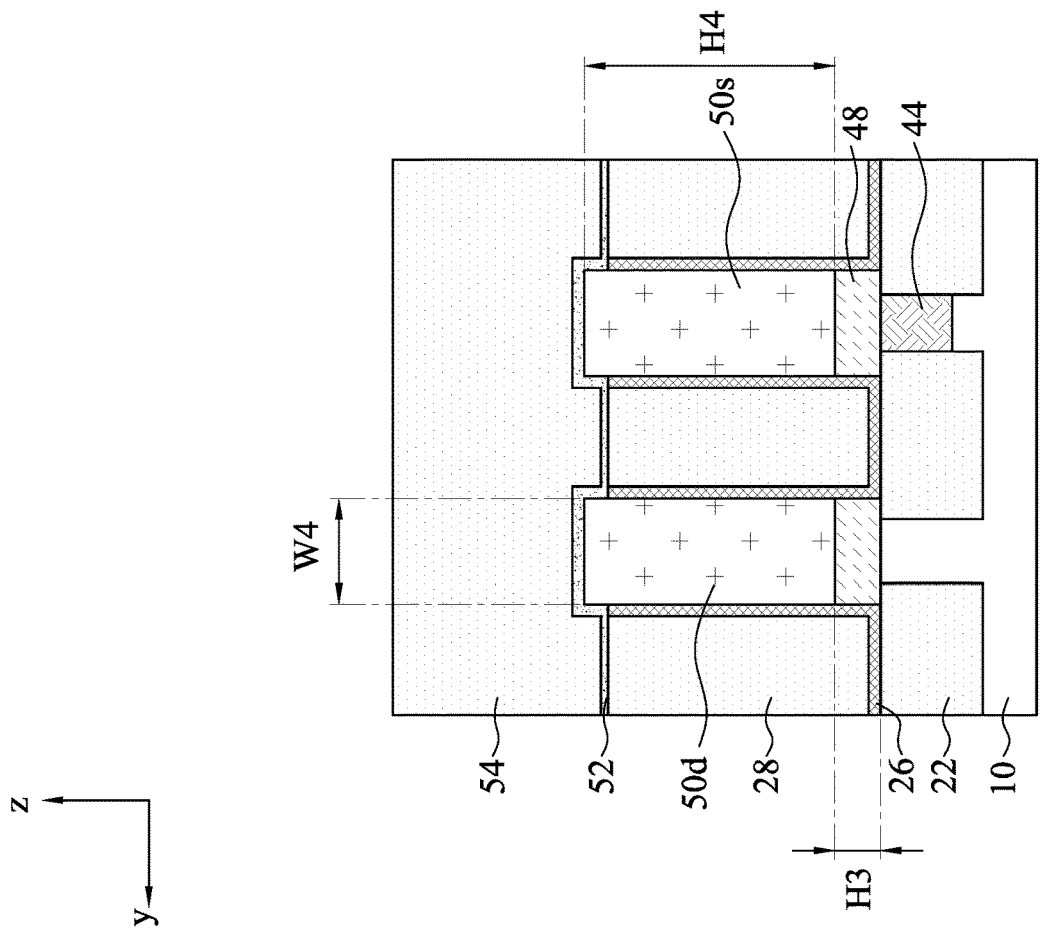
Fig. 10A
Fig. 10B

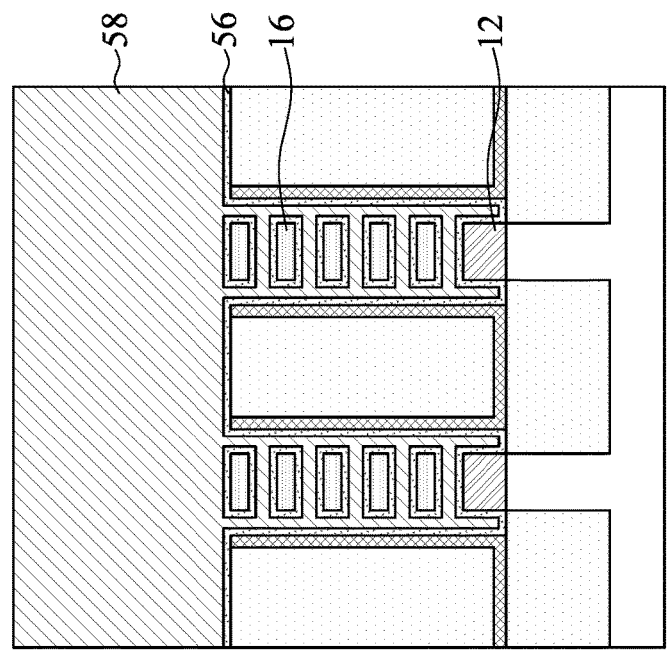
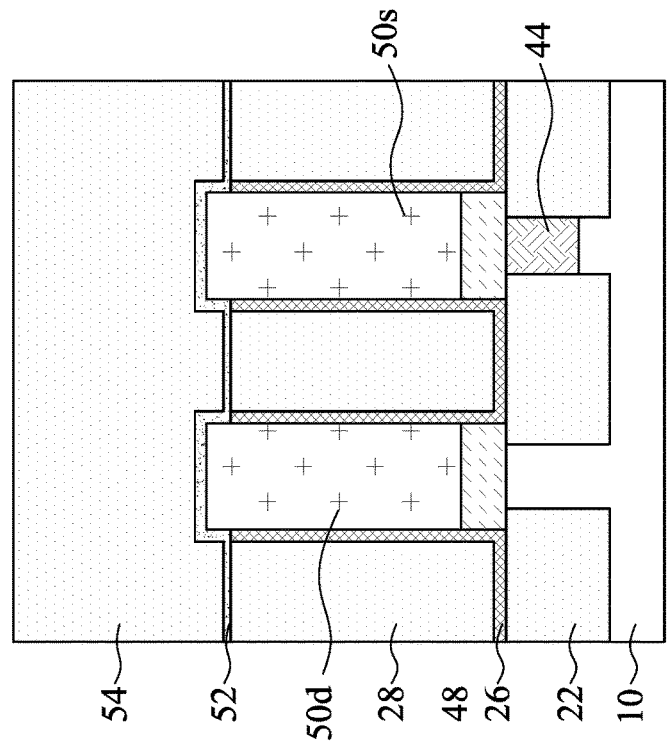
Fig. 12A
Fig. 12B

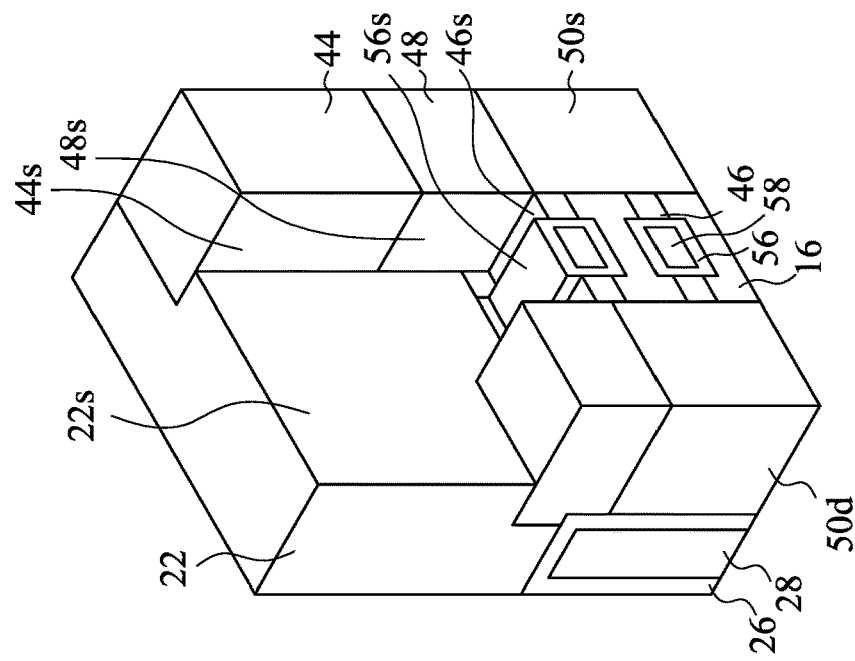
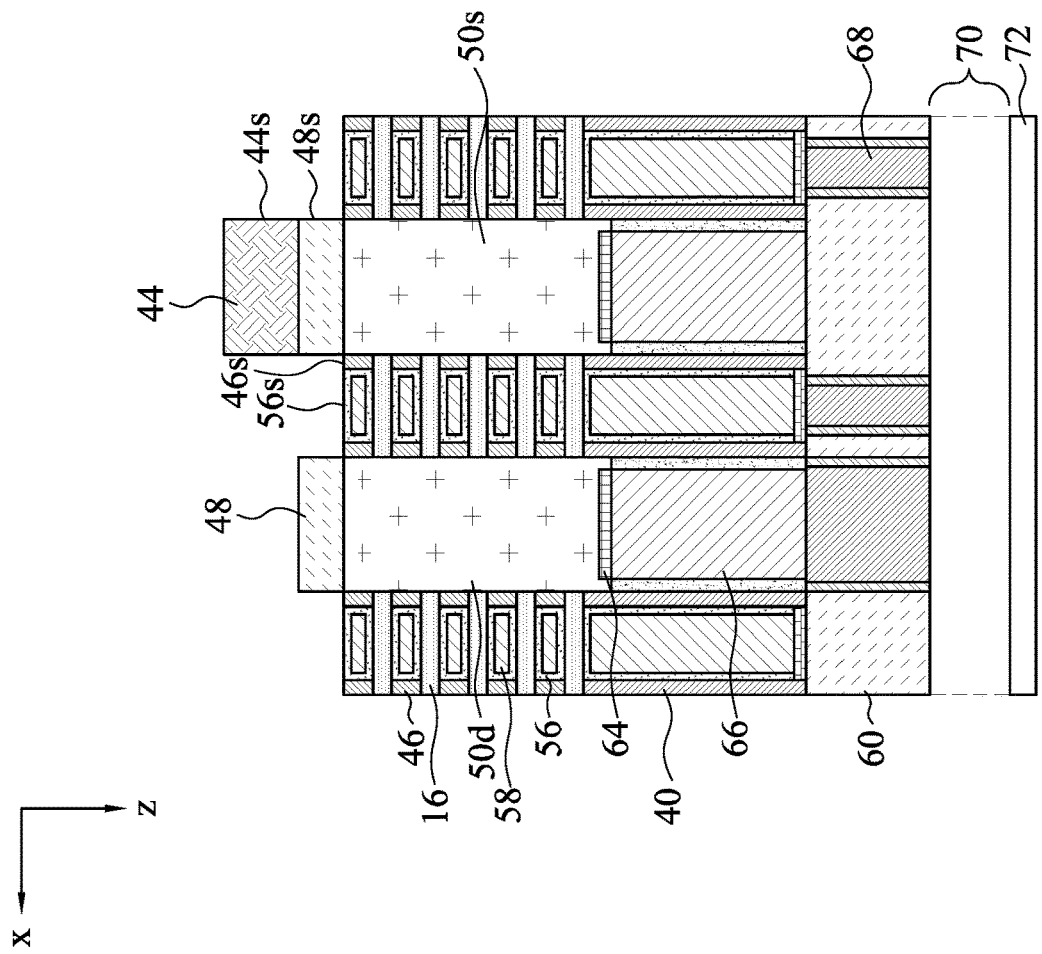
Fig. 16D
Fig. 16C

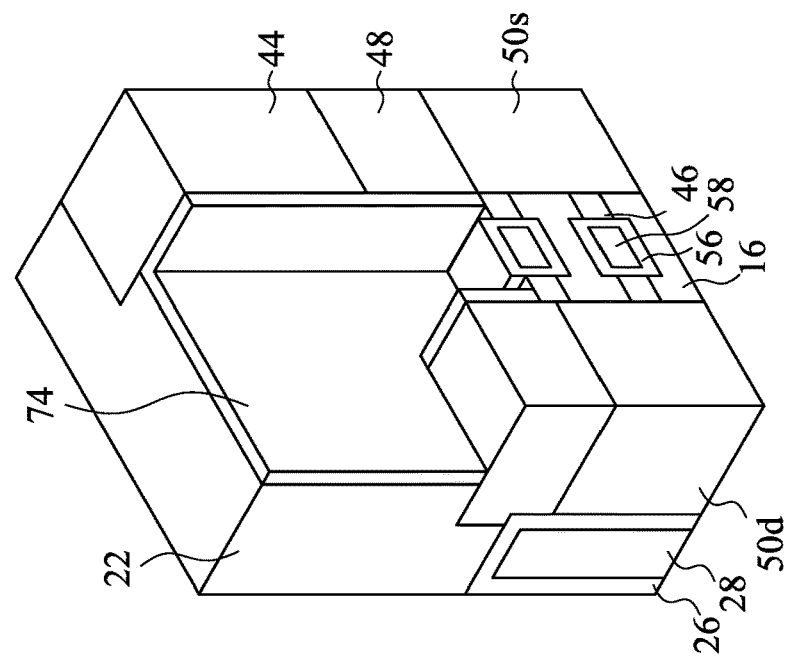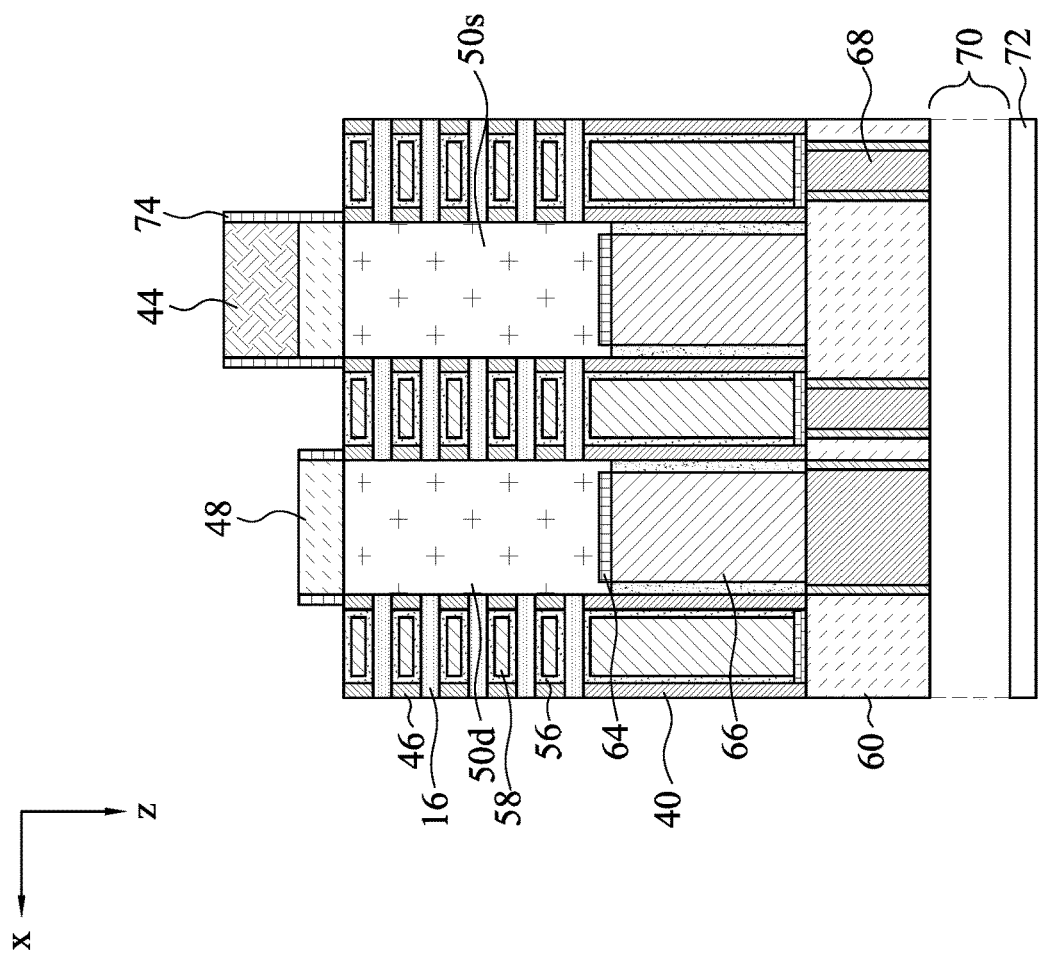
Fig. 17D
Fig. 17C

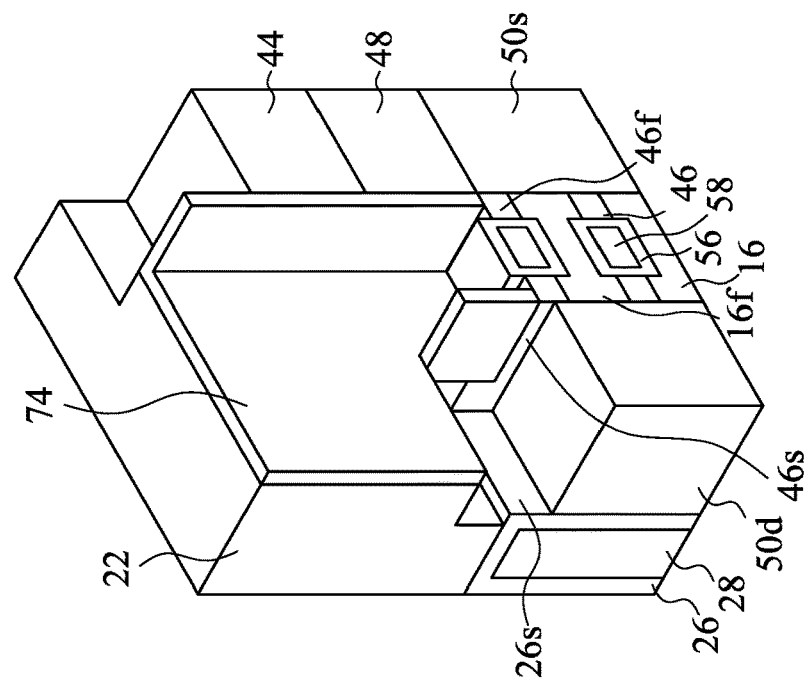
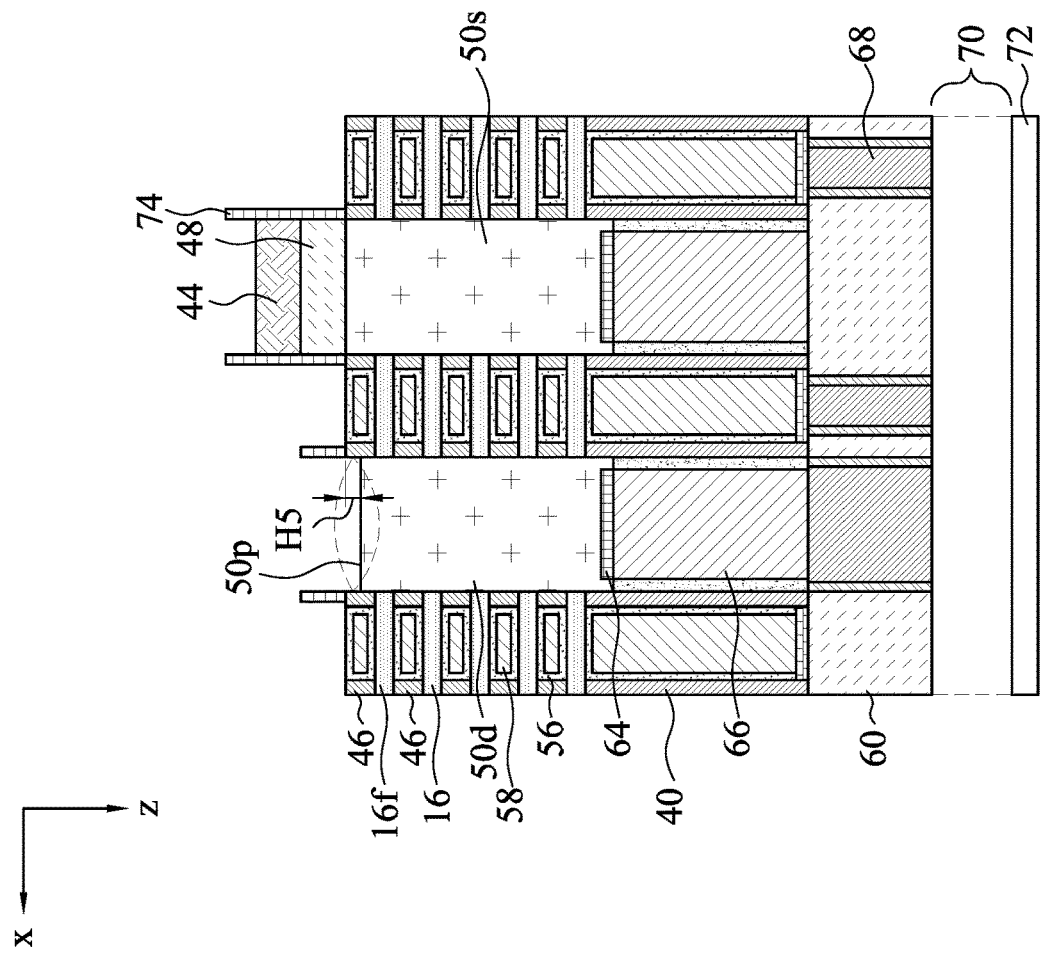
Fig. 18D
Fig. 18C

SEMICONDUCTOR DEVICES WITH BACKSIDE POWER RAIL AND METHODS OF FABRICATION THEREOF

BACKGROUND

The semiconductor industry has experienced continuous rapid growth due to constant improvements in the integration density of various electronic components. For the most part, this improvement in integration density has come from repeated reductions in minimum feature size, allowing more components to be integrated into a given chip area. As minimum feature size reduces, metal layer routing in the intermetal connection layers also becomes more complex. Therefore, there is a need to solve the above problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 to 6, FIGS. 7A-7C to 14A-14C, FIGS. 15A-15D to 21A-21D, and FIGS. 22A-22C schematically illustrate various stages of manufacturing a semiconductor device according to embodiments of the present disclosure.

DETAILED DESCRIPTION

Figure 1:
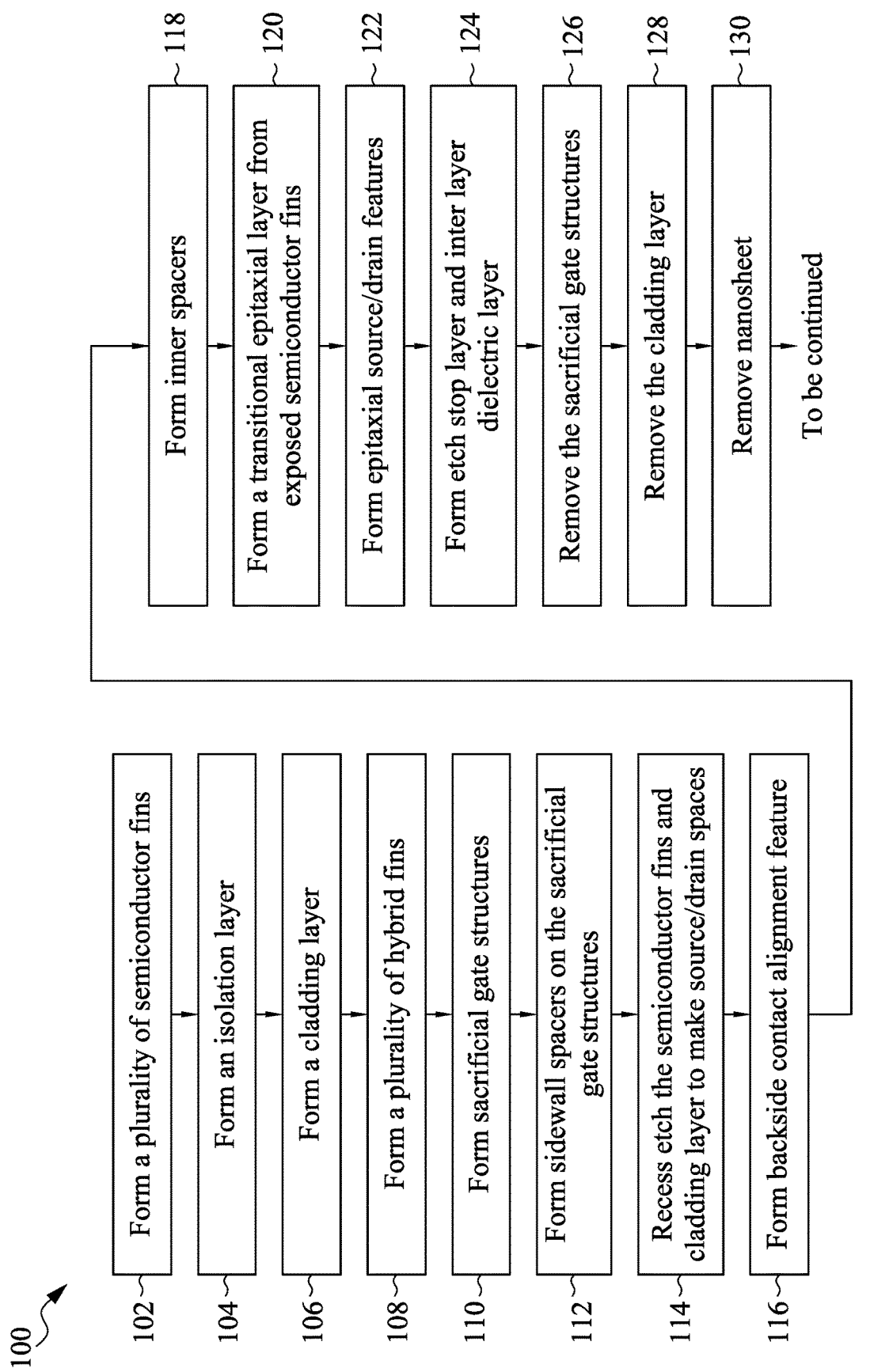
FIG. 1 is a flow chart of a method for manufacturing of a semiconductor substrate according to embodiments of the present disclosure.
Figure 1:
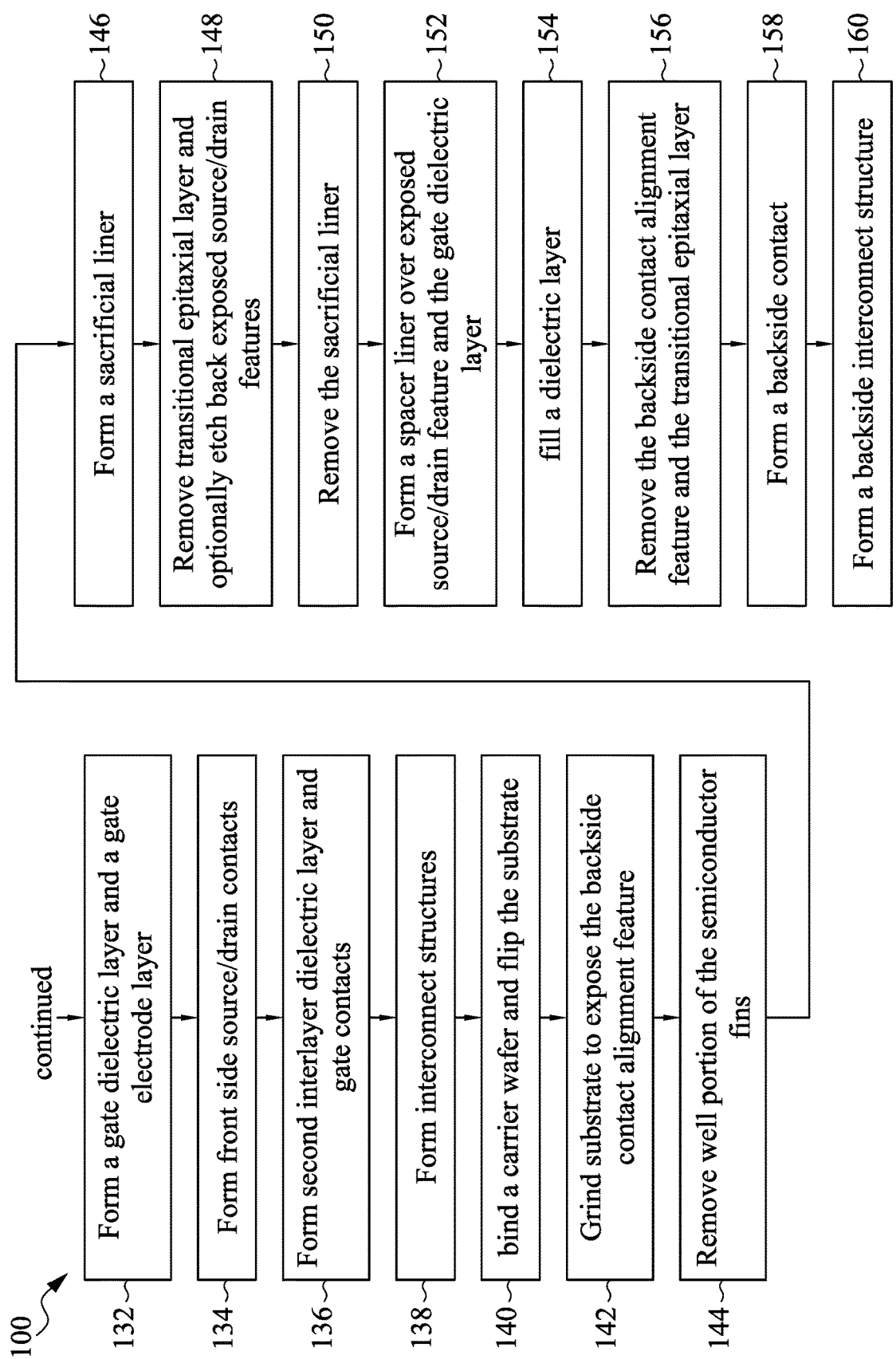

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 64 degrees or at other orientations) and the spatially relative descriptors used herein may likewise be interpreted accordingly.

The foregoing broadly outlines some aspects of embodiments described in this disclosure. While some embodiments described herein are described in the context of nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In addition, although method embodiments may be described in a particular order, various other method embodiments may be performed in any logical order and may include fewer or more steps than what is described herein. In the present disclosure, a source/drain refers to a source and/or a drain. A source and a drain are interchangeably used.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

An integrated circuit (IC) typically includes a plurality of semiconductor devices, such as field-effect transistors and metal interconnection layers formed on a semiconductor substrate. The interconnection layers, designed to connect the semiconductor devices to power supplies, input/output signals, and to each other, may include signal lines and power rails, such as a positive voltage rail (VDD) and a ground rail (GND). As semiconductor device size shrinks, space for metal power rails and signal lines decreases.

Embodiments of the present disclosure provide semiconductor devices having metal contacts for connecting to power rails formed on a backside of a substrate, and methods for fabricating such semiconductor devices. When the power rails are formed on the backside of the substrate, metal layers in the back end of line (BEOL) may be manufactured using reduced number of masks with improved performance, width of gates in field-effector transistors (FETs) can be enlarged, and width of power rails can also be increased.

Metal contacts on the backside and the backside power rail are formed by backside processes which are performed after completing BEOL processes and flipping the substrate over. The current technologies of forming backside source/drain contacts result in an increased capacitance between the gate electrode and the source/drain region. The increased capacitance may cause device performance to degrade. According to embodiments of the present disclosure, a portion of the source/drain feature is recessed to the level of an inner spacer during formation of backside contact to avoid high capacitance between the gate electrode and the source/drain region. In some embodiments, a sacrificial liner is used during recess of the source/drain feature to protect the isolation region and/or the backside contact alignment feature to prevent structure degradation.

FIG. 1 is a flow chart of a method 100 for manufacturing of a semiconductor substrate according to embodiments of the present disclosure. FIGS. 2 to 6, FIGS. 7A-7C to 14A-14C, FIGS. 15A-15D to 21A-21D, and FIGS. 22A-22C schematically illustrate various stages of manufacturing a semiconductor device according to the method 100. Additional operations can be provided before, during, and after operations/processes in the method 100, and some of the operations described below can be replaced or eliminated, for additional embodiments of the method. The order of the operations/processes may be interchangeable.

Figure 2:
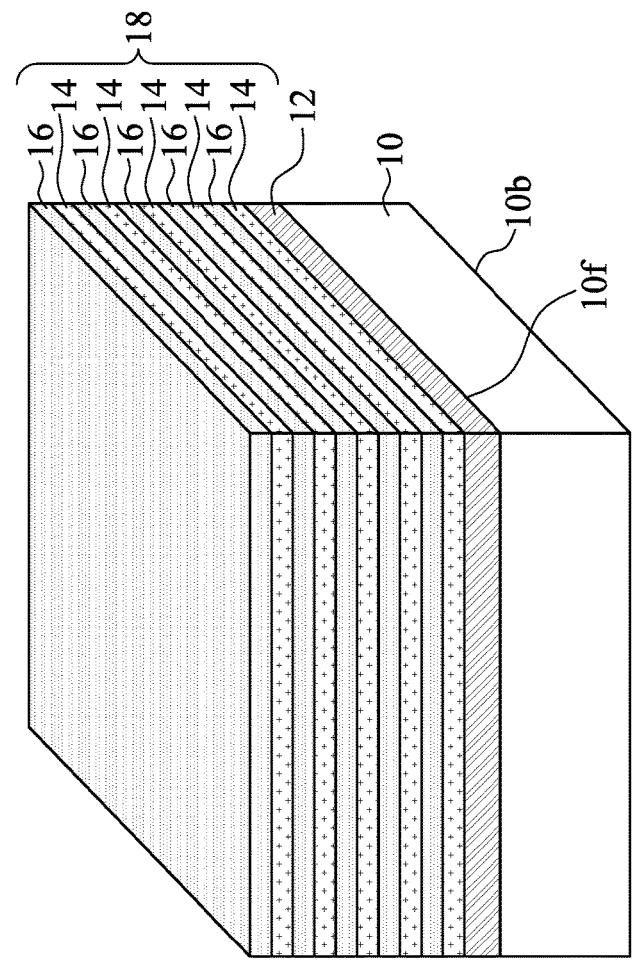
Figure 2:
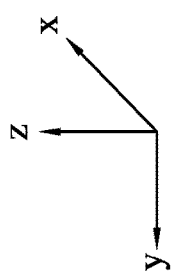
Figure 3:
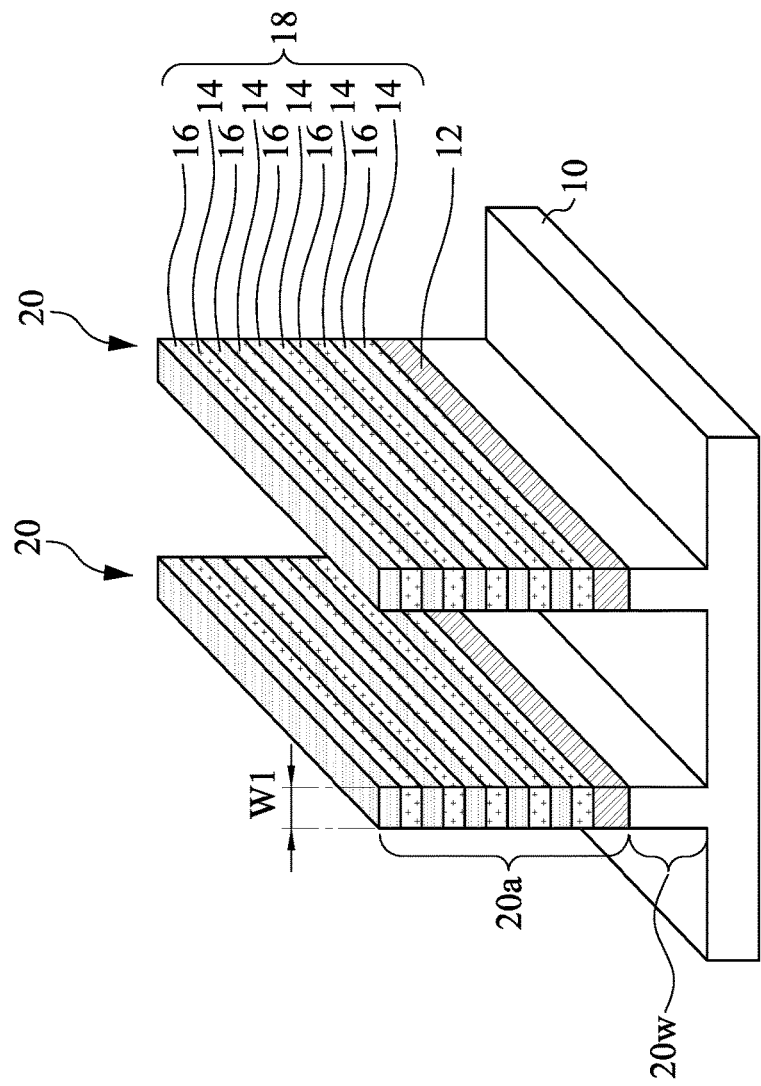

The method 100 begins at operation 102 where a plurality of semiconductor fins 20 are formed over a substrate 10, as shown in FIGS. 2 and 3 are schematic perspective views of the substrate 10 during operation 102.

In FIG. 2, the substrate 10 is provided to form a semiconductor device thereon. The substrate 10 may include a single crystalline semiconductor material such as, but not limited to Si, Ge, SiGe, GaAs, InSb, GaP, GaSb, InAlAs, InGaAs, GaSbP, GaAsSb, and InP. The substrate 10 may include various doping configurations depending on circuit design. For example, different doping profiles, e.g., n-wells, p-wells, may be formed in the substrate 10 in regions designed for different device types, such as n-type field effect transistors (NFET), and p-type field effect transistors (PFET). In some embodiments, the substrate 10 may be a silicon-on-insulator (SOI) substrate including an insulator structure (not shown) for enhancement.

The substrate 10 has a front surface 10f and a back surface 10b. In some embodiments, a buffer layer 12 is formed over a region on the front surface 10f of the substrate 10. The buffer layer 12 functions to gradually change the lattice constant from that of the substrate 10 to that of channel regions and source/drain regions to be formed over the substrate 10. The buffer layer 12 may be formed from epitaxially grown single crystalline semiconductor materials such as, but not limited to Si, SiGe, SiGe, SiGeB, SiP, SiAs, or other Si related material. In some embodiments, the buffer layer 12 has a thickness between about 5 nm and about 50 nm.

A semiconductor stack 18 is then formed over the buffer layer 12. The semiconductor stack 18 includes alternating semiconductor layers made of different materials to facilitate formation of nanosheet channels in a multi-gate device, such as nanosheet channel FETs. In some embodiments, the semiconductor stack 18 includes first semiconductor layers 14 interposed by second semiconductor layers 16. The first semiconductor layers 14 and second semiconductor layers 16 have different oxidation rates and/or etch selectivity.

In later fabrication stages, portions of the second semiconductor layers 16 form nanosheet channels in a multi-gate device. Five first semiconductor layers 14 and five second semiconductor layers 16 are alternately arranged as illustrated in FIG. 2 as an example. More or less semiconductor layers 14 and 16 may be included in the semiconductor stack 18 depending on the desired number of channels in the semiconductor device to be formed. In some embodiments, the number of semiconductor layers 16 is between 1 and 10.

The semiconductor layers 14, 16 may be formed by a molecular beam epitaxy (MBE) process, a metalorganic chemical vapor deposition (MOCVD) process, and/or other suitable epitaxial growth processes. In some embodiments, the semiconductor layers 16 include the same material as the substrate 10. In some embodiments, the semiconductor layers 14 and 16 include different materials than the substrate 10. In some embodiments, the semiconductor layers 14 and 16 are made of materials having different lattice constants. In some embodiments, the first semiconductor layers 14 include an epitaxially grown silicon germanium (SiGe) layer and the second semiconductor layers 16 include an epitaxially grown silicon (Si) layer. Alternatively, in some embodiments, either of the semiconductor layers 14 and 16 may include other materials such as Ge, a compound semiconductor such as SiC, GeAs, GaP, InP, InAs, and/or InSb, an alloy semiconductor such as SiGe, GaAsP, AlInAs, AlGaAs, InGaAs, GaInP, and/or GaInAsP, or combinations thereof.

In some embodiments, each second semiconductor layer 16 has a thickness in a range between about 5 nm and about 30 nm. In other embodiments, each second semiconductor layer 16 has a thickness in a range between about 10 nm and about 20 nm. In some embodiments, each second semiconductor layer 16 has a thickness in a range between about 6 nm and about 12 nm. In some embodiments, the second semiconductor layers 16 in the semiconductor stack 18 are uniform in thickness. The first semiconductor layers 14 in channel regions may eventually be removed and serve to define a vertical distance between adjacent channels for a subsequently formed multi-gate device. In some embodiments, the thickness of the first semiconductor layer 14 is equal to or greater than the thickness of the second semiconductor layer 16. In some embodiments, each semiconductor layer 14 has a thickness in a range between about 5 nm and about 50 nm. In other embodiments, each first semiconductor layer 14 has a thickness in a range between about 10 nm and about 30 nm.

In FIG. 3, the semiconductor fins 20 are formed from the semiconductor stack 18, the buffer layer 12, and a portion of the substrate 10. The semiconductor fins 20 may be formed by patterning a hard mask (not shown) formed on the semiconductor stack 18 and one or more etching processes. Each semiconductor fin 20 has an active portion 20a formed from the semiconductor layers 14, 16 and the buffer layer 12, and a well portion 20w formed from the substrate 10. In FIG. 3, the semiconductor fins 20 are formed along the X direction. A width W1 of the semiconductor fins 20 along the Y direction is in a range between about 3 nm and about 44 nm. In some embodiments, the width W1 of the semiconductor fins 20 along the Y direction is in a range between about 20 nm and about 30 nm.

In operation 104, an isolation layer 22 is formed in the trenches between the semiconductor fins 20, as shown in FIG. 4. The isolation layer 22 is formed over the substrate 10 to cover the well portion 20w of the semiconductor fins 20. The isolation layer 22 may be formed by a high density plasma chemical vapor deposition (HDP-CVD), a flowable CVD (FCVD), or other suitable deposition process. In some embodiments, the isolation layer 22 may include silicon oxide, silicon nitride, silicon oxynitride, fluorine-doped silicate glass (FSG), a low-k dielectric, combinations thereof. In some embodiments, the isolation layer 22 is formed to cover the semiconductor fins 20 by a suitable deposition process, such as atomic layer deposition (ALD), and then recess etched using a suitable anisotropic etching process to expose the active portions 20a of the semiconductor fins 20. In some embodiments, the isolation layer 22 is etched to expose a portion of the buffer layer 12 in the semiconductor fins 30. In other embodiments, the isolation layer 22 is etched to expose the entire thickness of the buffer layer 12.

In operation 106, after the isolation layer 22 is recess etched to expose the active portions 20a of the semiconductor fins 20, a cladding layer 24 is formed on exposed sidewalls of the semiconductor fins 20, as shown in FIG. 4. In some embodiments, the cladding layer 24 includes a semiconductor material, for example SiGe. In some embodiments, the cladding layer 24 may be grown epitaxially directly from the exposed semiconductor fins 20. In other embodiments, the cladding layer 24 may be formed by a process including first forming a semiconductor liner, such as a silicon liner conformally over exposed surfaces of the substrate 10, followed by an etch process to remove portions of the semiconductor liner formed on the isolation layer 22, and then epitaxially grown from the cladding layer 24 from the semiconductor liner.

In some embodiments, the cladding layer 24 on sidewalls of the active portions 20a of the semiconductor fins 20s functions as a sacrificial gate electrode layer on the sidewalls of the semiconductor fins 20. The thickness T1 of the cladding layer 24 formed on the sidewalls of the semiconductor fins 20 is selected to define the space suitable for a gate stack around the channels of the multi-channel FinFET devices, such as a nanosheet FinFET device, to be formed. In some embodiments, the thickness of T1 may be in arrange between about 0.5 nm and about 10 nm. If the thickness T1 of the cladding layer 24 is less than 0.5 nm, the space created by the subsequent removal of the cladding layer 24 may be too small to form the gate electrode layer. On the other hand, if the thickness of the cladding layer 24 is greater than 10 nm, the manufacturing cost is increased without significant advantage.

In some embodiments, the combined width W2 of the semiconductor fin 20 and the cladding layer 24 on each sidewall may be in a range between about 4 nm and about 44 nm. The W2 is selected according to desired width of source/drain regions in the device to be formed.

In operation 108, hybrid fins 30 are formed in the trenches between the neighboring semiconductor fins 20s after formation of the cladding layer 24, as shown in FIG. 4. The hybrid fins 30, also referred to as dummy fins or dielectric fins, include a high-k dielectric material layer, a low-k dielectric material layer, or a bi-layer dielectric material including high-k upper part and a low-k lower part. In some embodiments, the hybrid fins 30 include a high-k metal oxide, such as $HfO_2$, $ZrO_2$, $HfAlO_x$, $HfSiO_x$, $Al_2O_3$, and the like, a low-k material such as SiONC, SiCN, SiOC, or other dielectric material. In the example of FIG. 4, the hybrid fin 30 is a bi-layer structure including a liner layer 26 and a dielectric filling layer 28. In some embodiments, the liner layer 26 may include a low-k material, such as SiONC, SiCN, SiOC, or other dielectric material, that provide etch resistance during replacement gate processes. The dielectric filling layer 28 may be a low-k dielectric material, such as silicon oxide.

In some embodiments, a width W3 of the hybrid fins 30 along the Y direction is in a range from about 3 nm to about 50 nm. In some embodiments, the hybrid fins 30 may extend to the level of the buffer layer 12. For example, the bottom of the hybrid fin 30 may be at a height H1 below the top of the buffer layer 12 along the Z direction. In some embodiments, the height H1 is in a range between about 5 nm and 50 nm.

During processes in operations 104, 106, and 108, the mask layer used in operation 102 to form the semiconductor fins 20 may remain on the semiconductor fins 20 to protect the top layer of the semiconductor fins 20. After formation of the cladding layer 24 and the hybrid fins 30, a planarization operation, such as CMP, is performed to expose the topmost second semiconductor layer 16 on the semiconductor fins 20.

Figure 5:
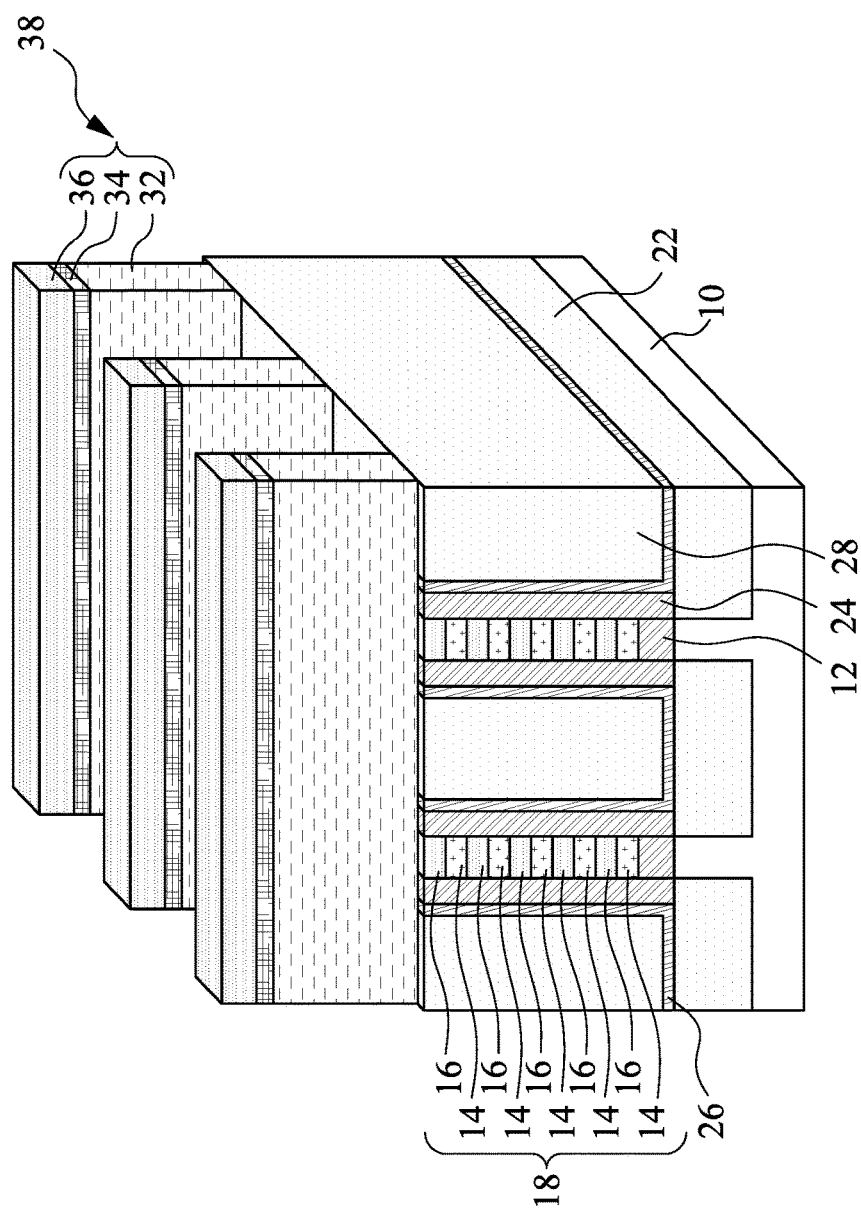

In operation 110, sacrificial gate structures 38 are formed as shown in FIG. 5. The sacrificial gate structures 38 are formed over the semiconductor fins 20 and the hybrid fins 30. The sacrificial gate structure 38 is formed over a portion of the semiconductor fin 20 which is to be a channel region. The sacrificial gate structure 38 may include a sacrificial gate electrode layer 32, a pad layer 34, and a mask layer 36.

The sacrificial gate electrode layer 32 may be blanket deposited on the over the semiconductor fins 20 and the hybrid fins 30. The sacrificial gate electrode layer 32 includes silicon such as polycrystalline silicon or amorphous silicon. The thickness of the sacrificial gate electrode layer is in a range between about 70 nm and about 200 nm. In some embodiments, the sacrificial gate electrode layer 32 is subjected to a planarization operation. The sacrificial gate electrode layer 32 may be deposited using CVD, including LPCVD and PECVD, PVD, ALD, or other suitable process.

Subsequently, the pad layer 34 and the mask layer 36 are formed over the sacrificial gate electrode layer 32. The pad layer 34 may include silicon nitride. The mask layer 36 may include silicon oxide. Next, a patterning operation is performed on the mask layer 36, the pad layer 34, the sacrificial gate electrode layer 32 to form the sacrificial gate structure 38.

Figure 6:
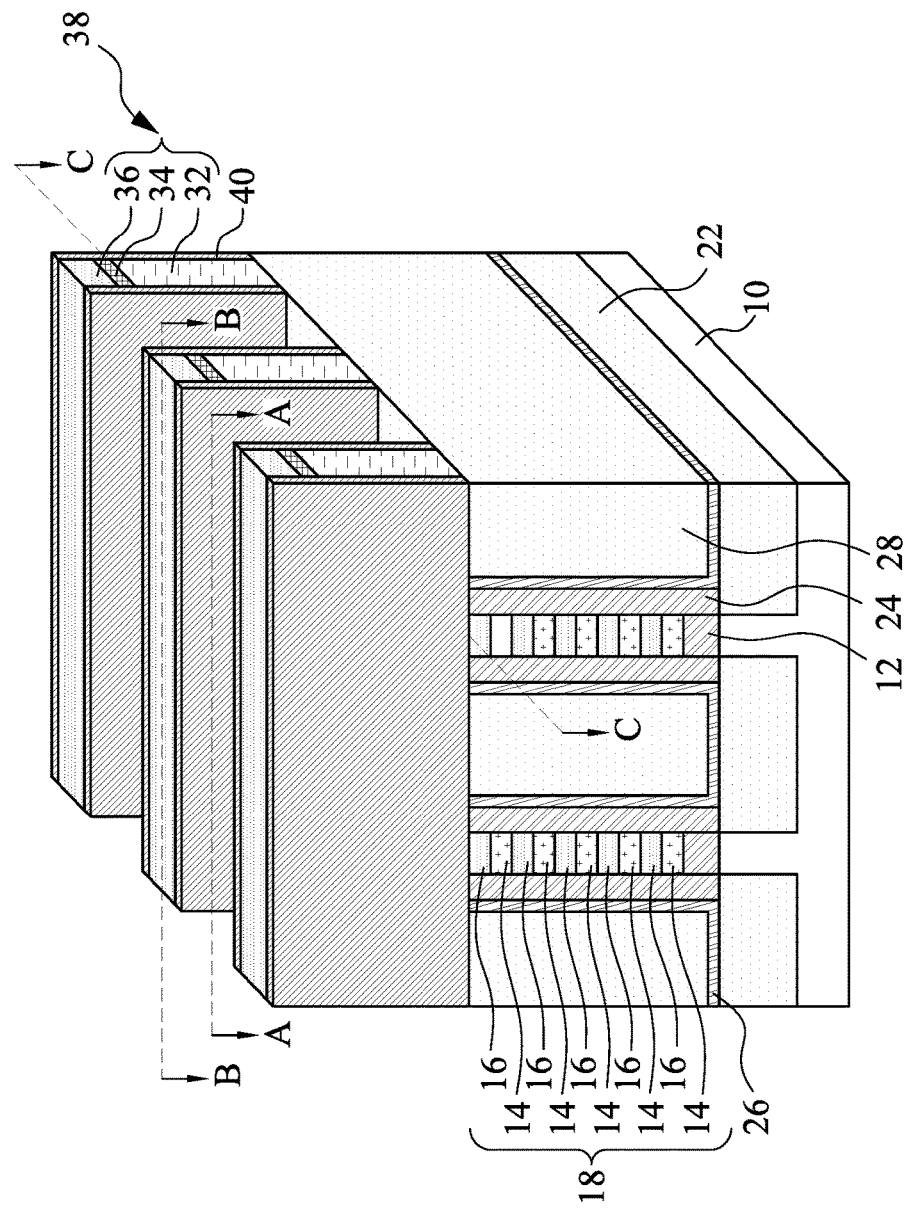

In operation 112, sidewall spacers 40 are formed on sidewalls of each sacrificial gate structure 38, as shown in FIG. 6. After the sacrificial gate structure 38 is formed, the sidewall spacers 40 are formed by a blanket deposition of an insulating material followed by anisotropic etch to remove insulating material from horizontal surfaces. The sidewall spacers 40 may have a thickness in a range between about 2 nm and about 10 nm. In some embodiments, the insulating material of the sidewall spacers 40 is a silicon nitride-based material, such as SiN, SiON, SiOCN or SiCN and combinations thereof.

Lines A-A, B-B, and C-C in FIG. 6 indicate cut lines of various views in FIGS. 7A-7C to FIGS. 24A-24C described below. Particularly, FIGS. 7A-24A are schematic cross-sectional views along lines A-A in FIG. 6. FIGS. 7B-24B are schematic cross-sectional views along lines B-B in FIG. 6. FIGS. 7C-24C are schematic cross-sectional view along lines C-C in FIG. 6.

Figure 7B:
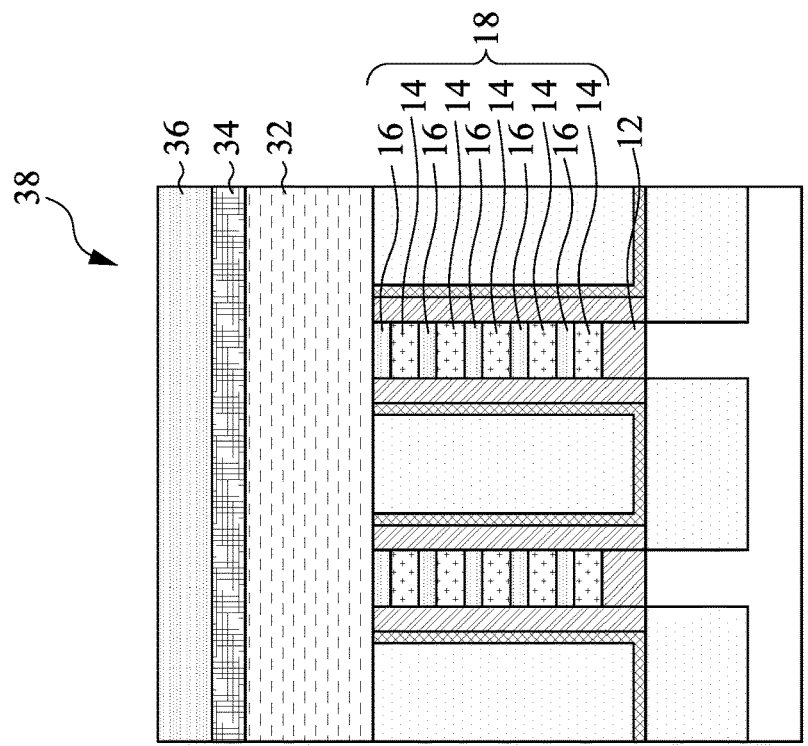
Figure 7A:
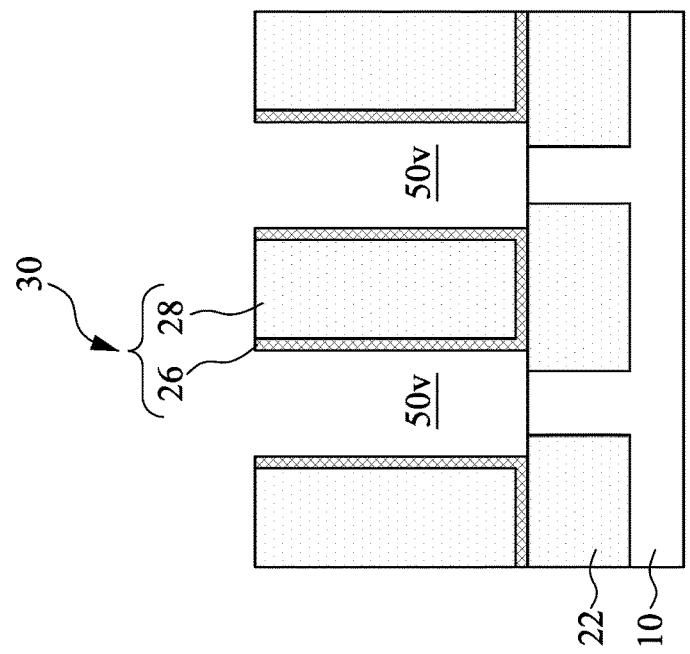
Figure 7C:
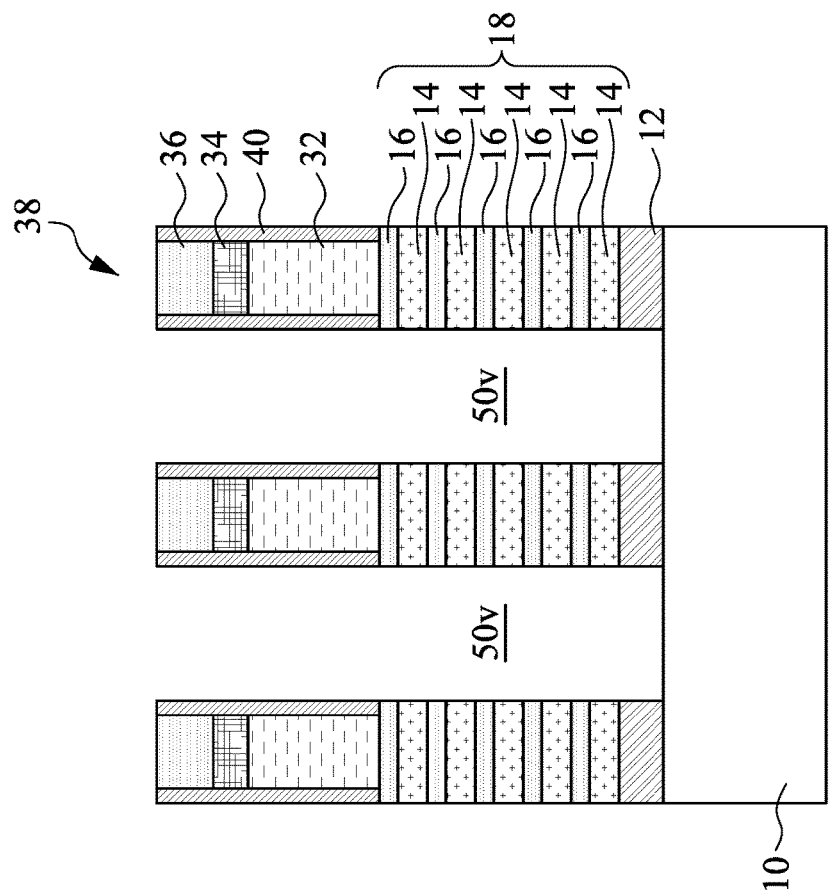

In operation 114, the semiconductor fins 20 on opposite sides of the sacrificial gate structure 38 are recess etched, forming source/drain spaces 50v between the neighboring hybrid fins 30 on either side of the sacrificial gate structure 38 as shown in FIGS. 7A-7C. The first semiconductor layers 14 and the second semiconductor layers 16 in the semiconductor fins 20 are etched down on both sides of the sacrificial gate structure 38 using etching operations. In some embodiments, all layers in the semiconductor stack 18 of the semiconductor fins 20 and the buffer layer 12 are etched to expose the well portion 20w of the semiconductor fin 20. In some embodiments, suitable dry etching and/or wet etching may be used to remove the first semiconductor layers 14, the second semiconductor layer 16, and the buffer layer 12, together or separately. As shown in FIG. 7A, the hybrid fins 30 separate neighboring source/drain spaces 50v on one side of the sacrificial gate structure 38. As shown in FIG. 7C, source/drain spaces 50v are formed on opposite sides of the sacrificial gate structure 38.

Figure 8C:
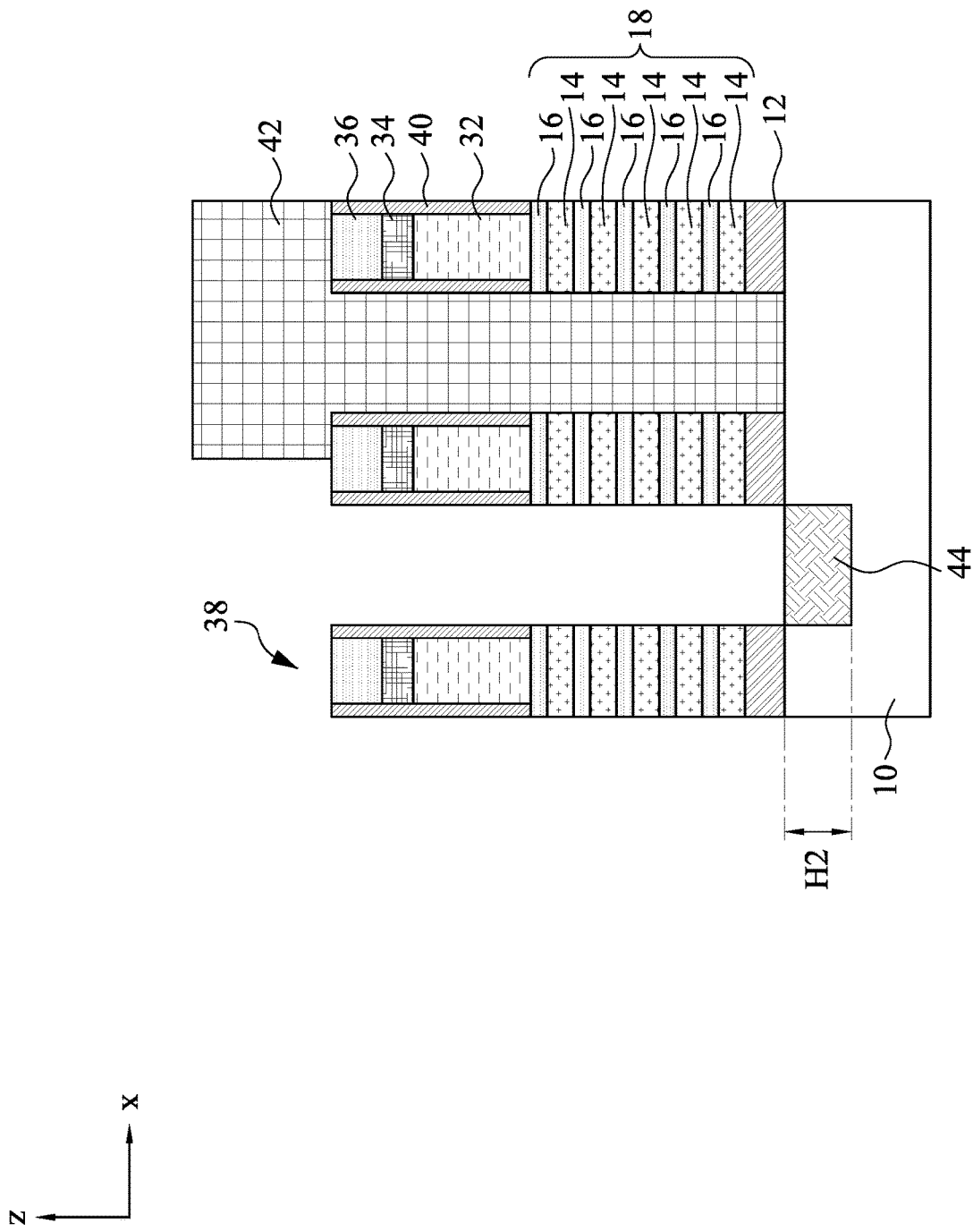

In operation 116, a backside contact alignment feature 44 is formed by removing a portion of the well portion 20w in the semiconductor fin 20, as shown in FIGS. 8A-8C. The backside contact alignment feature 44 is selectively formed under the source/drain spaces 50v where source/drain features formed therein are to be connected to a backside power rail.

In some embodiments, a patterned protective layer 42 may be deposited over the substrate and patterned to reveal the source/drain spaces 50v, under which the backside contact alignment feature 44 is to be formed. The patterned protective layer 42 may be a patterned stack including a photoresist layer and hard mask layer. The patterned protective layer 42 is used to expose areas where the backside contact alignment feature 44 is to be formed and to protect areas where the backside contact alignment feature 44 are not to be formed. After formation of the patterned protective layer 42, suitable dry etching and/or wet etching is performed to remove at least part of exposed well portions 20w of the semiconductor fins 20.

The backside contact alignment feature 44 is then formed by any suitable method, such as by CVD, CVD epitaxy, molecular beam epitaxy (MBE), or any suitable deposition technique. In some embodiments, the backside contact alignment feature 44 is formed by a selective deposition process. The backside contact alignment feature 44 will be removed to form a backside contact hole in the substrate 10 at a later stage.

The backside contact alignment feature 44 is formed from a material to have etch selectivity relative to the material of the substrate 10, material in the well portion 20w of the semiconductor fin 20 and the insulating material in the isolation layer 22. In some embodiments, the backside contact alignment feature 44 may fill a recess formed in the isolation layer 22 after removal of the portion of the well portion 20w of the semiconductor fin 20. Each backside contact alignment feature 44 has a height "H2", as shown in FIG. 8C. In some embodiments, the height H2 is in a range between about 10 nm and about 30 nm.

During backside processes, the material of the backside contact alignment feature 44 allows portions of the semiconductor fins 20 in the channel region and opposite source/drain region to be selectively removed. Additionally, the backside contact alignment feature 44 can be selectively removed without etching the dielectric materials in the isolation layer 22.

In some embodiments, the backside contact alignment feature 44 may include SiGe, such as a single crystal SiGe material. In some embodiments, the backside contact alignment feature 44 is formed from SiGe having a germanium composition percentage between about 50% and 95%. Alternatively, the backside contact alignment feature 44 may include other materials such as Si, Ge, a compound semiconductor such as SiC, GeAs, GaP, InP, InAs, and/or InSb, an alloy semiconductor such as GaAsP, AlInAs, AlGaAs, InGaAs, GaInP, and/or GaInAsP, or combinations thereof.

After the formation of the backside contact alignment feature 44 on one side of the sacrificial gate structure 38, the patterned protective layer 42 formed on the other side of the sacrificial gate structure 38 is removed.

Figure 9C:
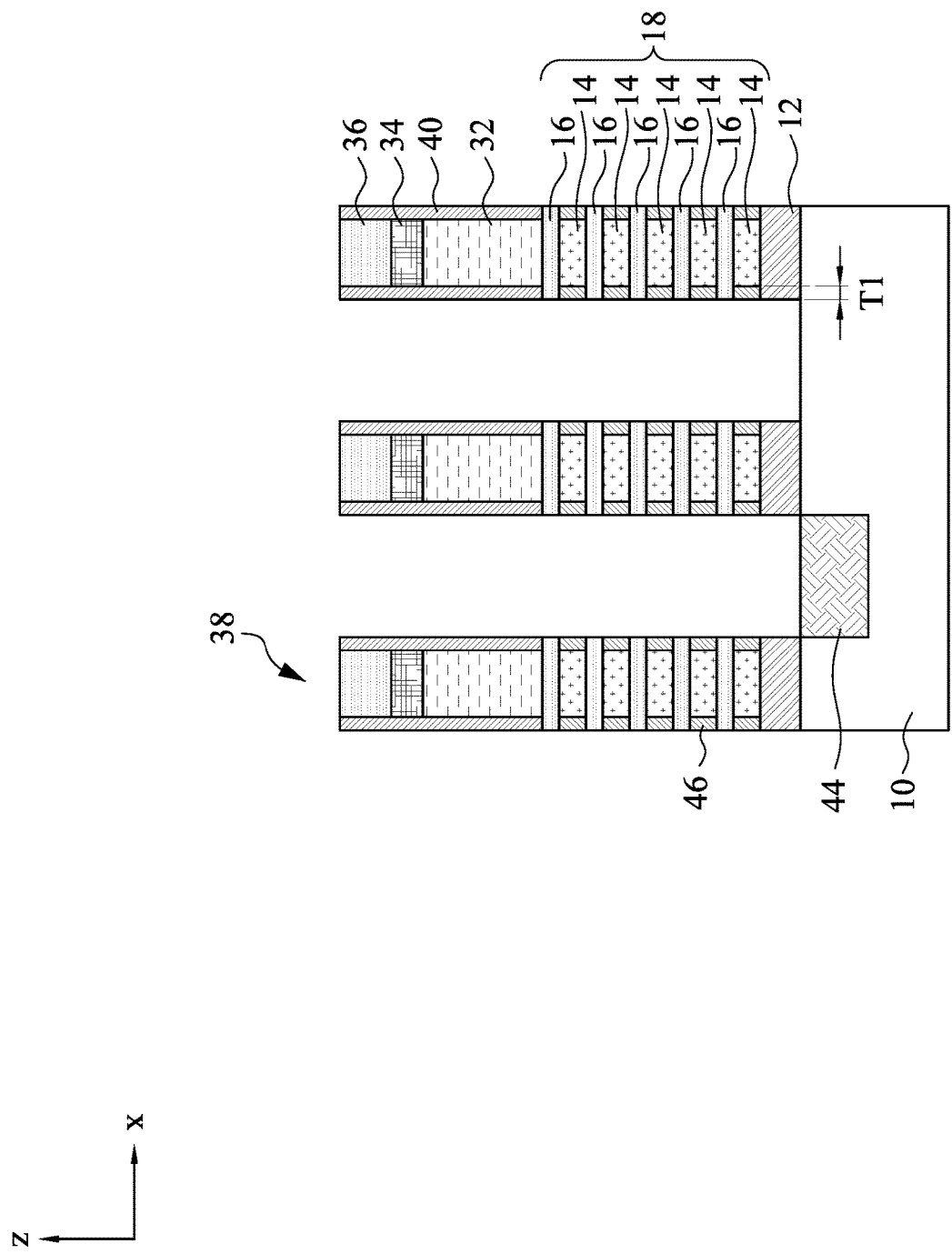

In operation 118, inner spacers 46 are formed on exposed ends of the first semiconductor layers 14 under the sacrificial gate structure 38, as shown in FIGS. 9A-9C. The first semiconductor layers 14 exposed to the source/drain spaces 50v are first etched horizontally along the X direction to form cavities. In some embodiments, the first semiconductor layers 14 can be selectively etched by using a wet etchant such as, but not limited to, ammonium hydroxide (NH$_4$OH), tetramethylammonium hydroxide (TMAH), ethylenediamine pyrocatechol (EDP), or potassium hydroxide (KOH) solutions. In some embodiments, the amount of etching of the first semiconductor layer 14 is in a range between about 2 nm and about 10 nm along the X direction. By selecting an appropriate crystal orientation of the first semiconductor layers 14 and an etchant, the cavity at the end of the first semiconductor layers 14 can have different shapes to form inner spacers of various shapes therein, such as a rectangular shape as shown in FIG. 9C or an open-triangle shape (not shown).

After forming cavities at opposite ends of the first semiconductor layers 14, the inner spacers 46 can be formed in the cavities by conformally deposit and then partially remove an insulating layer. The insulating layer can be formed by ALD or any other suitable method. The subsequent etch process removes most of the insulating layer except inside the cavities, resulting in the inner spacers 46. As shown in FIG. 9C, the inner spacer 46 includes two or more segments, alternately stacked with the second semiconductor layers 16.

The inner spacers 46 may be formed from a single layer or multiple layers of dielectric material. In some embodiments, the inner spacers 46 may include one of silicon nitride (SiN) and silicon oxide (SiO$_2$), SiONC, or a combination thereof. The inner spacer 46 may have a thickness T1 along the X direction. In some embodiments, the thickness T1 of the inner spacers 46 in a range from about 0.5 nm to about 15 nm. If the thickness T1 of the inner spacers 46 is thinner than 0.5 nm, the inner spacers 46 are not thick enough to insulate the source/drain features from the gate structure to be formed on either side of the inner spacers 46. If the thickness T1 of the inner spacers 46 is greater than 15 nm, the inner spacers 46 would take up too much channel length leading to insufficient amount of gate structure wrapping around the second semiconductor layers 16 without provide additional advantages.

Figure 10C:
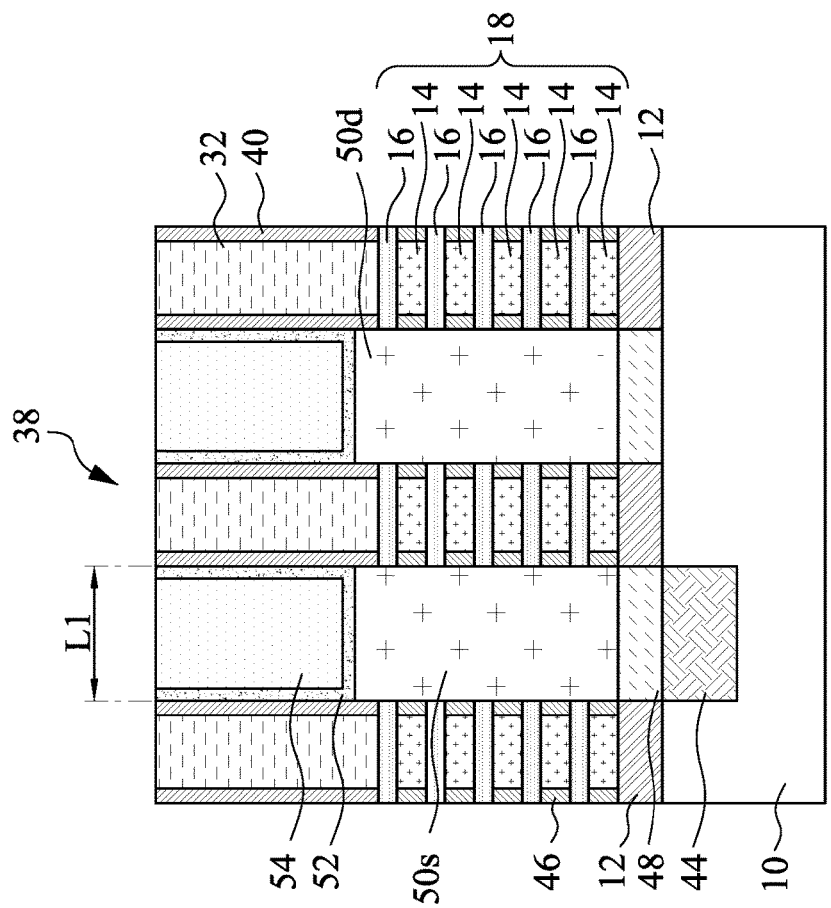

In operation 120, a transitional epitaxial layer 48 is formed in the bottom of the source/drain spaces 50v as shown in FIGS. 10A-10C. In some embodiments, a preclean process may be performed prior to epitaxial growth of the transitional epitaxial layer 48 in the source/drain spaces 50v. The transitional epitaxial layer 48 may grow epitaxially from the exposed surface of the backside contact alignment feature 44 in the source/drain space 50v and the exposed surface of the well portion 20w of the semiconductor fin 20. The transitional epitaxial layer 48 may also grow from the exposed surfaces of the semiconductor fins 20 under the sacrificial gate structure 38, such as the exposed surfaces of the buffer layer 12. The transitional epitaxial layer 48 functions to provide a bridge of lattice structures between the existing semiconductor features, such as the backside contact alignment feature 44 or the remaining portion of the semiconductor fin 20, and the epitaxial source/drain feature to be formed in the source/drain space 50v. In some embodiments, the transitional epitaxial layer 48 is formed from Si, SiGe, SiGeB, SiP, SiAs, and other silicon related epitaxial materials.

In some embodiments, material of the transitional epitaxial layer 48 is selected to have different etch and/or oxidation rate relative to the material of the substrate 10, the material of the buffer layer 12, and the backside contact alignment feature 44. In some embodiments, the transitional epitaxial layer 48 is formed from SiGeB when the backside contact alignment feature 44 is formed from SiGe.

According to embodiments of the present disclosure, the transitional epitaxial layer 48 is grown to fill the width of the source/drain space 50v along the Y direction as shown in FIG. 10A. Alternatively, the transitional epitaxial layer 48 may grow narrower than in the source/drain space 50v so that gaps are formed between the transitional epitaxial layer 48 and the hybrid fins 30.

In some embodiments, the transitional epitaxial layer 48 has a height H3 along the Z direction in a range between about 5 nm and about 50 nm. In some embodiments, the height H3 of the transitional epitaxial layer 48 is substantially similar to the thickness of the buffer layer 12.

In operation 122, epitaxial source/drain features 50s, 50d (collectively 50) are formed in the source/drain spaces 50v, as shown in FIGS. 10A-10C. The epitaxial source/drain features 50s are to be connected to a power rail from the backside of the substrate 10. The epitaxial source/drain features 50d will be connected to signal lines formed in a front side interconnect structure. In some embodiments, the epitaxial source/drain features 50s may function as source regions and the epitaxial source/drain features 50d may function as drain regions.

The epitaxial source/drain features 50 are formed over the transitional epitaxial layer 48 within the source/drain spaces 50v. In some embodiments, a preclean process may be performed prior to epitaxial growth of epitaxial source/drain features 50 in the source/drain spaces 50v. The epitaxial source/drain features 50 are formed by an epitaxial growth method using CVD, ALD or molecular beam epitaxy (MBE). The epitaxial source/drain features 50 may include one or more layers of Si, SiP, SiC and SiCP for NFET or Si, SiGe, Ge for a PFET. For the PFET, p-type dopants, such as boron (B), may also be included in the epitaxial source/drain features 50.

As shown in FIG. 10C, the epitaxial source/drain features 50 are formed in contact with the second semiconductor layers 16 under the sacrificial gate structure 38. In some embodiments, the epitaxial source/drain features 50 are grown pass the topmost semiconductor channel, i.e. the second semiconductor layer 16 under the sacrificial gate structure 38, to be in contact with the sidewall spacers 40. The first semiconductor layers 14 under the sacrificial gate structure 38 are separated from the epitaxial source/drain features 50 by the inner spacers 46.

According to embodiments of the present disclosure, the epitaxial source/drain features 50 are grown to fill the width of the source/drain space 50v along the Y direction as shown in FIG. 10A. Alternatively, the source/drain space 50v may grow narrower than in the source/drain space 50v so that air gaps are formed between the source/drain space 50v and the hybrid fins 30. The epitaxial source/drain features 50 have a width W4 along the Y direction. The width W4 can be smaller, larger and equal to the channel width W3, which is shown in FIG. 4. The epitaxial source/drain features 50 have a height H4 along the Z direction. The height H4 may be any suitable value suitable according to the design. In some embodiments, the height H4 is in a range between about 10 nm and about 70 nm.

In some embodiments, the width W4 is in a range between about 4 nm and about 60 nm. The epitaxial source/drain features 50 have a length L1 along the X direction. In some embodiments, the length L1 is in a range between about 5 nm and about 200 nm.

In operation 124, a contact etch stop layer (CESL) 52 and an interlayer dielectric (ILD) layer 54 are formed over the exposed surfaces as shown in FIGS. 10A-10C. The CESL 52 is formed on the epitaxial source/drain features 50, the sidewall spacers 40, and the hybrid fins 30. In some embodiments, the CESL 52 has a thickness in a range between about 1 nm and about 15 nm. The CESL 52 may include $Si_3N_4$, SiON, SiCN or any other suitable material, and may be formed by CVD, PVD, or ALD.

The interlayer dielectric (ILD) layer 54 is formed over the contract etch stop layer (CESL) 52. The materials for the ILD layer 54 include compounds comprising Si, O, C, and/or H, such as silicon oxide, SiCOH and SiOC. Organic materials, such as polymers, may be used for the ILD layer 54. After the ILD layer 54 is formed, a planarization operation, such as CMP, is performed to expose the sacrificial gate electrode layer 32 for subsequent removal of the sacrificial gate structures 38. The ILD layer 54 protects the epitaxial source/drain features 50 during the removal of the sacrificial gate structures 38.

Figure 11B:
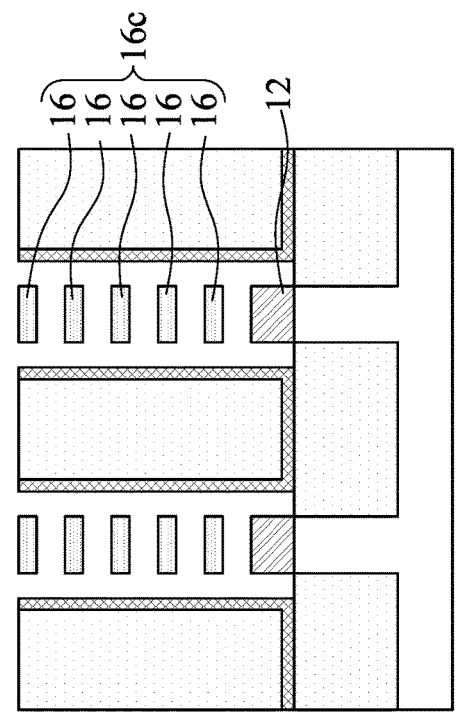
Figure 11A:
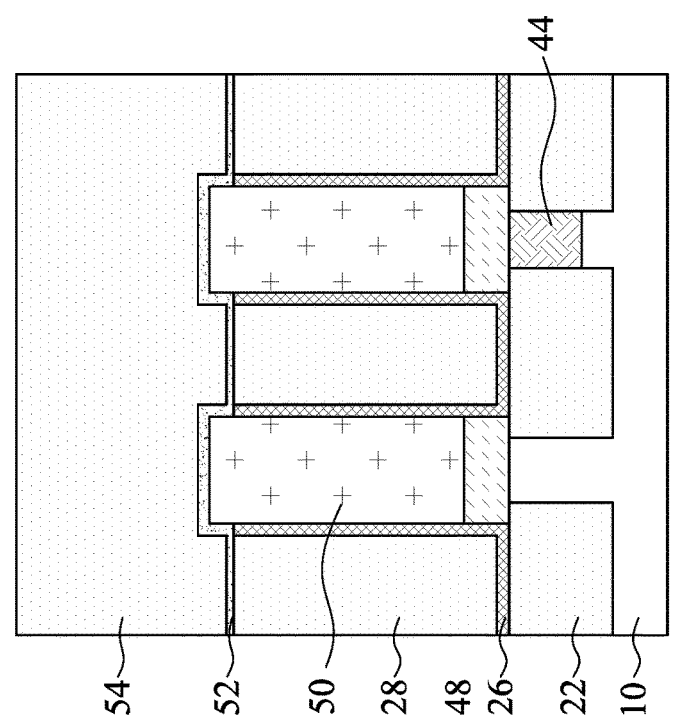
Figure 11C:
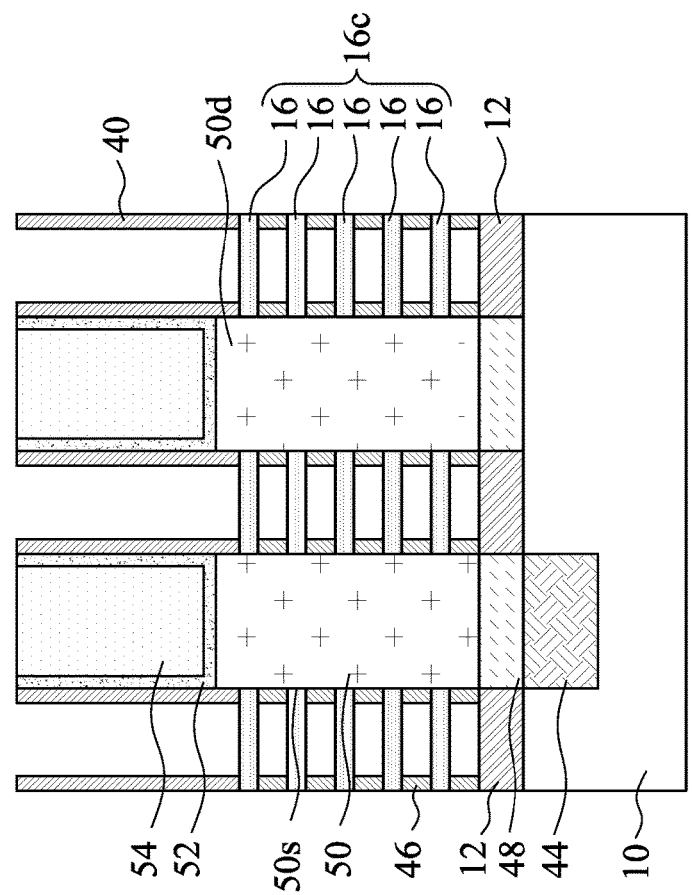

FIGS. 11A-11C are schematic cross-sectional views of the semiconductor device after operation 126, 128, and 130. In operation 126, the sacrificial gate electrode layer 32 is removed. The sacrificial gate electrode layer 32 can be removed using plasma dry etching and/or wet etching. When the sacrificial gate electrode layer 32 is polysilicon and the ILD layer 54 is silicon oxide, a wet etchant such as a Tetramethylammonium hydroxide (TMAH) solution can be used to selectively remove the sacrificial gate electrode layer 32 without removing the dielectric materials of the ILD layer 54, the CESL 52, and the sidewall spacers 40.

In operation 128, the cladding layer 24 is removed. After removal of the sacrificial gate electrode layer 32, the cladding layer 24 is exposed. The cladding layer 24 can be removed using plasma dry etching and/or wet etching. In some embodiments, an isotropic plasma etching with an etchant comprising fluorocarbons is used. In other embodiments, a suitable wet etch can be used to remove the cladding layer 24.

In operation 130, the first semiconductor layers 14 are removed, leaving the second semiconductor layers 16, as shown in FIGS. 11A-11C. After the sacrificial gate electrode layer 32 and the cladding layer 24 are removed, the first semiconductor layers 14 and second semiconductor layers 16 are exposed. The first semiconductor layers 14 can be selectively removed resulting in a semiconductor channel 16c including the second semiconductor layers 16 connecting the epitaxial source/drain features 50, as shown in FIG. 11O.

The first semiconductor layers 14 can be removed using an etchant that can selectively etch the first semiconductor layers 14 against the second semiconductor layers 16. When the first semiconductor layers 14 are Ge or SiGe and the second semiconductor layers 16 are Si, the first semiconductor layers 14 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solution.

Figure 12C:
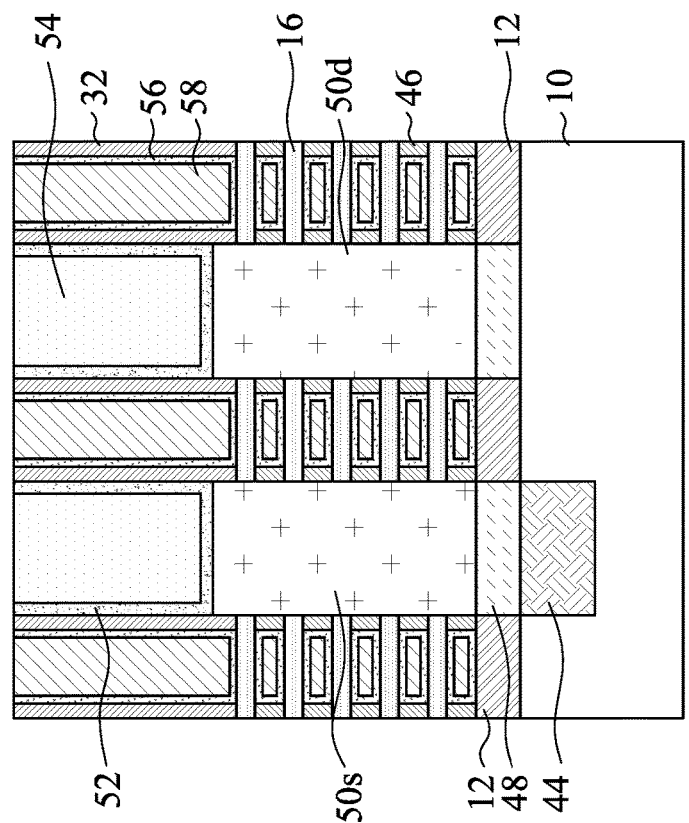

In operation 132, replacement gate structures are formed in place of the removed first semiconductor layers 14, the cladding layers 24, and the sacrificial gate electrodes 32. As shown in FIGS. 12A-12C, a gate dielectric layer 56 is formed around each of the second semiconductor layers 16. and a gate electrode layer 58 is formed on the gate dielectric layer 56. The gate dielectric layer 56 and the gate electrode layer 58 may be referred to as a replacement gate structure.

The gate dielectric layer 56 may be formed by CVD, ALD or any suitable method. In one embodiment, the gate dielectric layer 56 is formed using a highly conformal deposition process such as ALD in order to ensure the formation of a gate dielectric layer 56 having a uniform thickness around each of the second semiconductor layers 16. In some embodiments, the thickness of the gate dielectric layer 56 is in a range between about 1 nm and about 6 nm.

The gate dielectric layer 56 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

In some embodiments, an interfacial layer (not shown) is formed between the second semiconductor layer 16 and the gate dielectric layer 56. In some embodiments, one or more work function adjustment layers (not shown) are interposed between the gate dielectric layer 56 and the gate electrode layer 58.

The gate electrode layer 58 is formed on the gate dielectric layer 56 to surround each of the second semiconductor layer 16 (i.e., each channel) and the gate dielectric layer 56. The gate electrode layer 58 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 58 may be formed by CVD, ALD, electro-plating, or other suitable method. After the formation of the gate electrode layer 58, a planarization process, such as a CMP process, is performed to remove excess deposition of the gate electrode material and expose the top surface of the ILD layer 54.

Figure 13A:
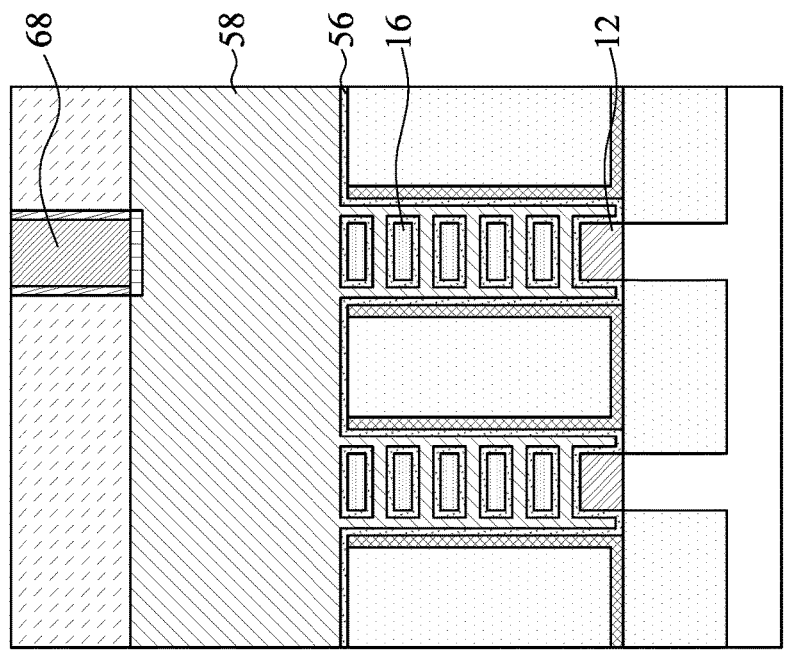
Figure 13B:
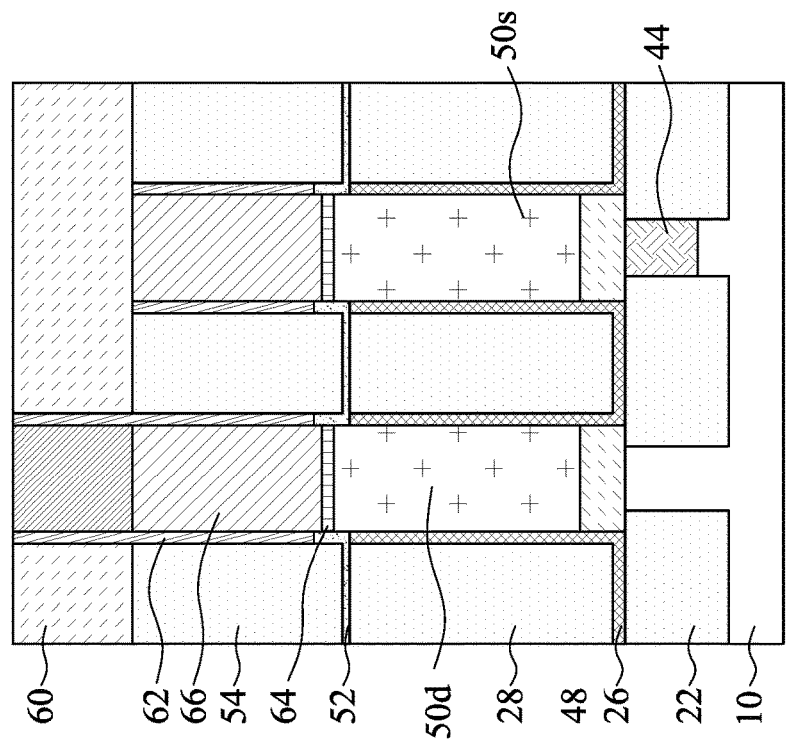
Figure 13C:
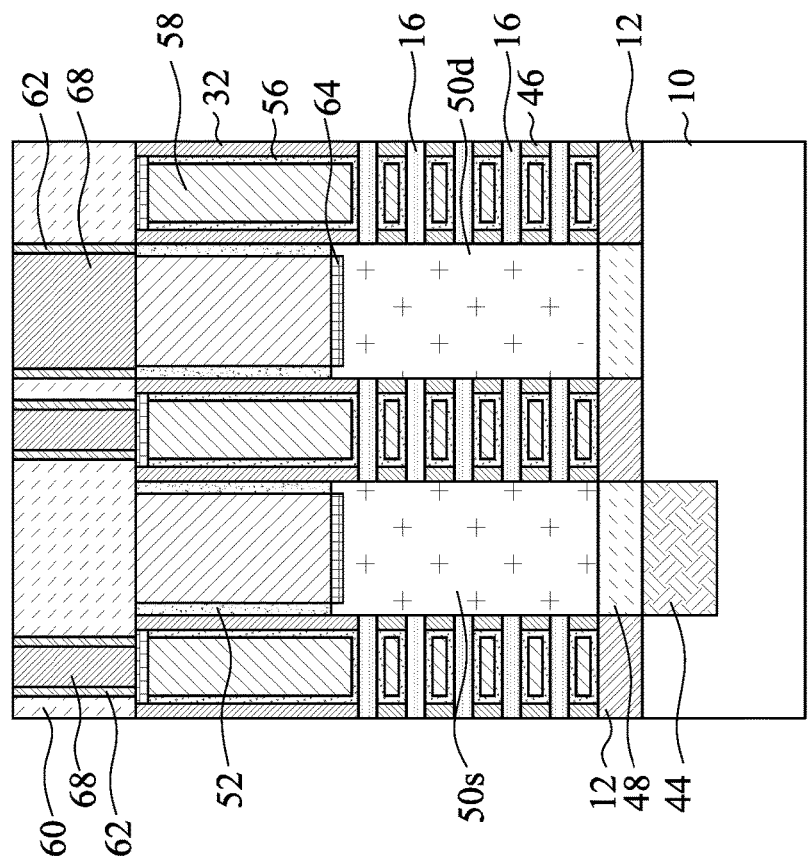

In operation 134, front side source/drain contacts 66 are formed in the ILD layer 54 as shown in FIGS. 13A-13C. Prior to forming the front side source/drain contacts 66, contact holes are formed in the ILD layer 54. Suitable photolithographic and etching techniques are used to form the contact holes through various layers, including the ILD layer 54 and the CESL 52 to expose the epitaxial source/drain features 50.

After the formation of the contact holes, a silicide layer 64 is selectively formed over an exposed top surface of the epitaxial source/drain features 50. The silicide layer 64 conductively couples the epitaxial source/drain features 50 to the subsequently formed front side source/drain contacts 66. The silicide layer 64 may be formed by depositing a metal source layer over the substrate 10 to cover the epitaxial source/drain features 50 and performing a rapid thermal annealing process. In some embodiments, the metal source layer includes a metal layer selected from W, Co, Ni, Ti, Mo, and Ta, or a metal nitride layer selected from tungsten nitride, cobalt nitride, nickel nitride, titanium nitride, molybdenum nitride, and tantalum nitride. After the formation of the metal source layer, a rapid thermal anneal process is performed, for example, a rapid anneal a rapid anneal at a temperature between about 700° C. and about 900° C. During the rapid anneal process, the portion of the metal source layer over the epitaxial source/drain features 50 reacts with silicon in the epitaxial source/drain features 50 to form the silicide layer 64. Unreacted portion of the metal source layer is then removed. In some embodiments, the silicide layer 64 includes one or more of WSi, CoSi, NiSi, TiSi, MoSi, and TaSi. In some embodiments, the silicide layer 64 has a thickness in a range between about 4 nm and 10 nm, for example between 5 nm and 6 nm.

After the silicide layer 64 is formed, the front side source/drain contacts 66 are formed in the contact holes by CVD, ALD, electro-plating, or other suitable method. The front side source/drain contacts 66 may be in contact with the silicide layer 64. The front side source/drain contacts 66 may include one or more of Co, Ni, W, Ti, Ta, Cu, Al, TiN and TaN. In some embodiments, a barrier layer 62 may be formed on sidewalls of the contact holes prior to forming the front side source/drain contacts 66.

The front side source/drain contacts 66 are selectively formed over some of the epitaxial source/drain features 50 according to circuit design. The front side source/drain contacts 66 formed over the epitaxial source/drain features 50*d* may be connected to signal lines in the subsequent formed front side interconnect structure. In some embodiments, the front side source/drain contacts 66 are not formed over the epitaxial source/drain features 50*s*, which is to be connected to a power rail, such as VDD or GND disposed on a backside of the substrate 10. In other embodiments, the front side source/drain contacts 66 are formed over the epitaxial source/drain features 50*s* for structural balance in the device. However, the front side source/drain contacts 66 that are in contact with the epitaxial source/drain features 50*s*, which are to be connected to a power rail, such as VDD or GND on the backside of the substrate 10, are not further connected to any contacts subsequently formed in a front side interconnect structure.

In operation 136, a second ILD layer 60 is formed over the first ILD layer 54, and conductive features 68 are formed in the second ILD layer 60, as shown in FIGS. 13A-13C. The conductive features 68 may be formed to provide electrical connection to some of the source/drain contacts 66 and/or to provide electrical connections to the gate electrode layers 58.

Figure 14B:
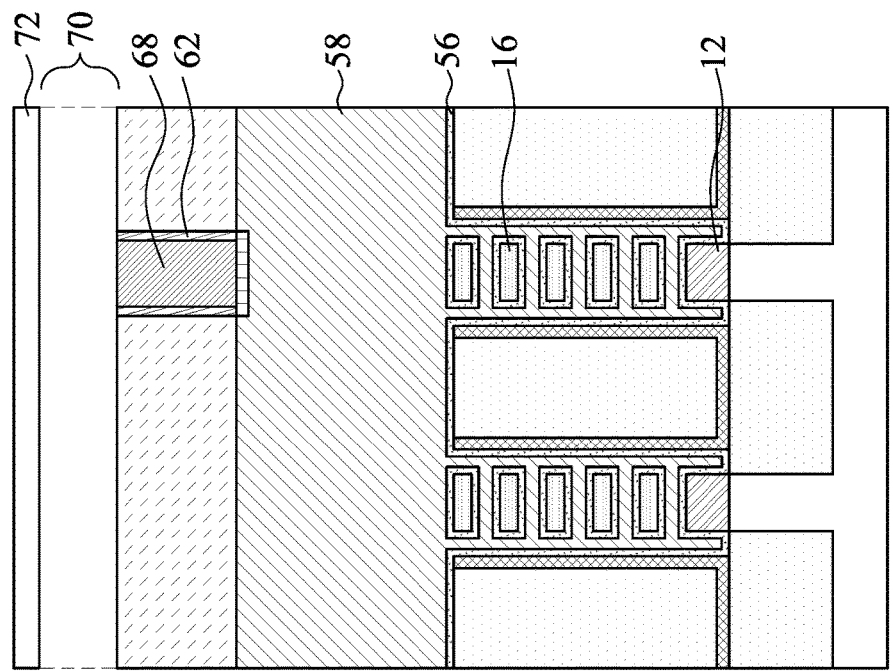
Figure 14A:
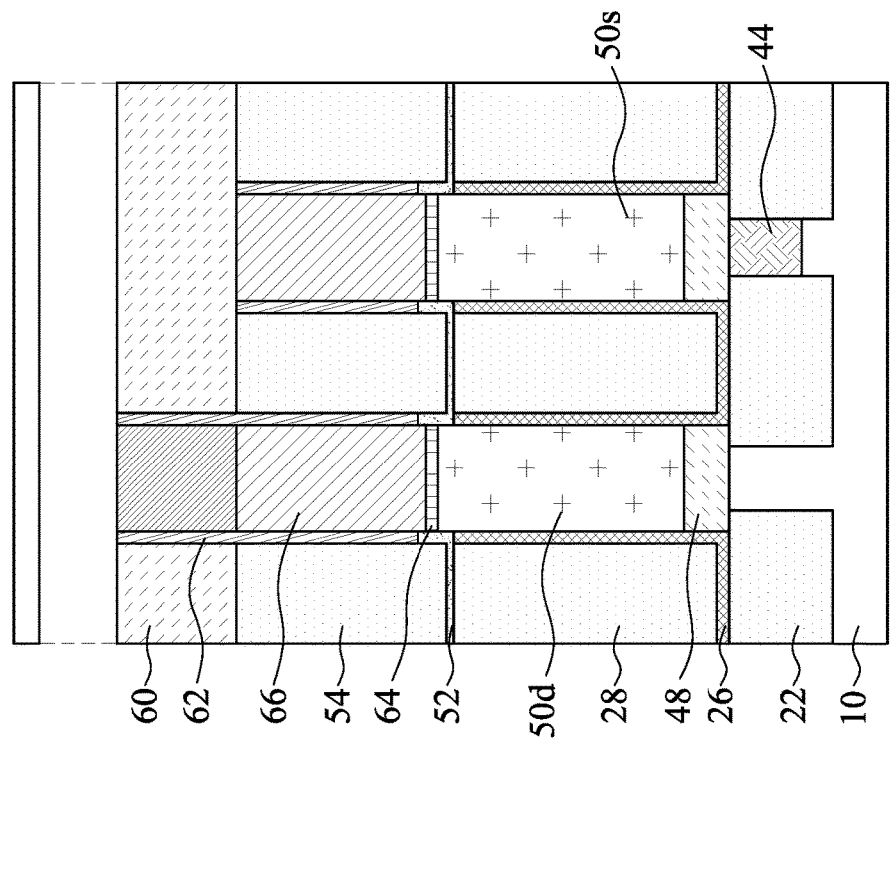
Figure 14C:
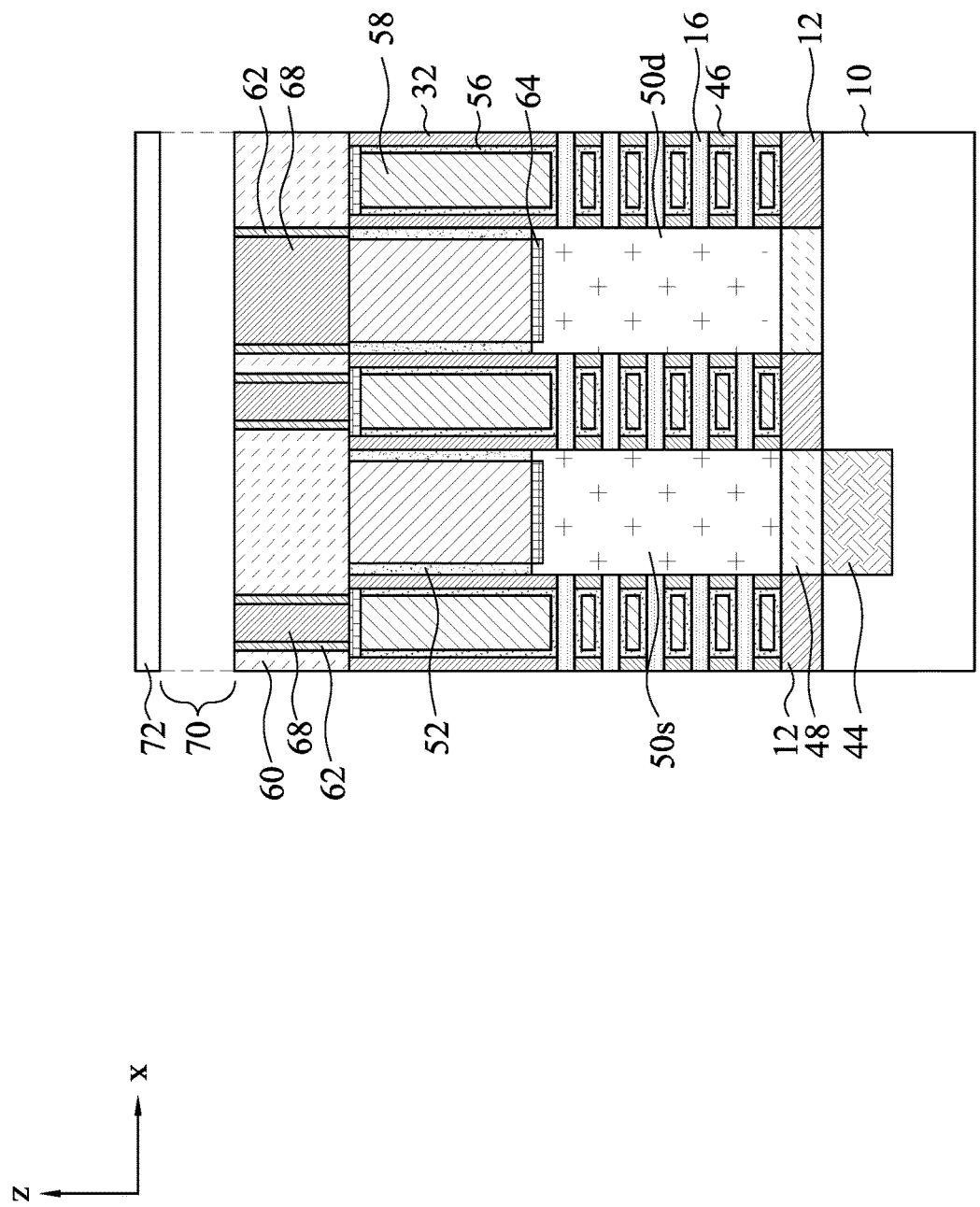
Figure 15B:
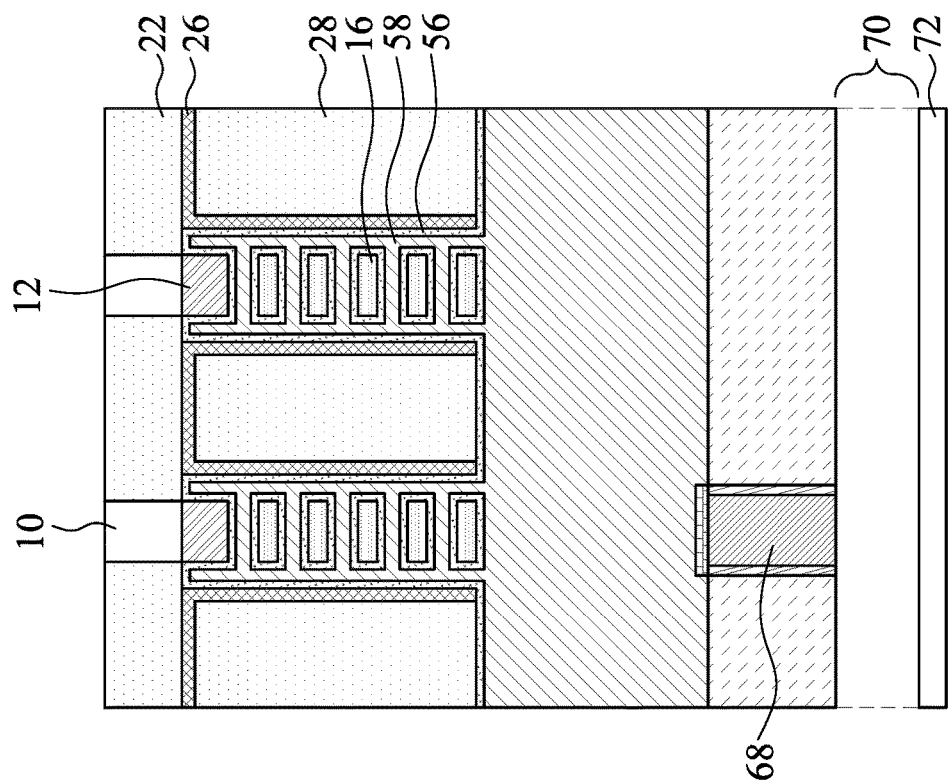
Figure 15A:
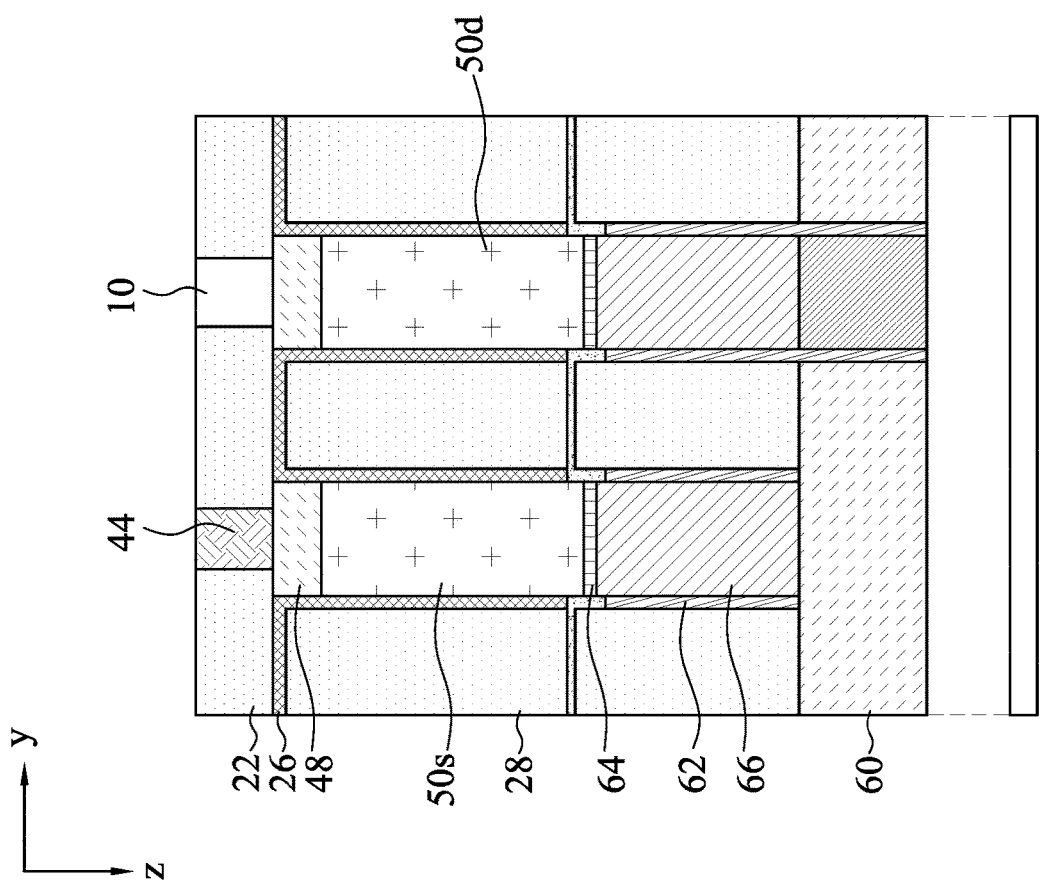
Figure 15D:
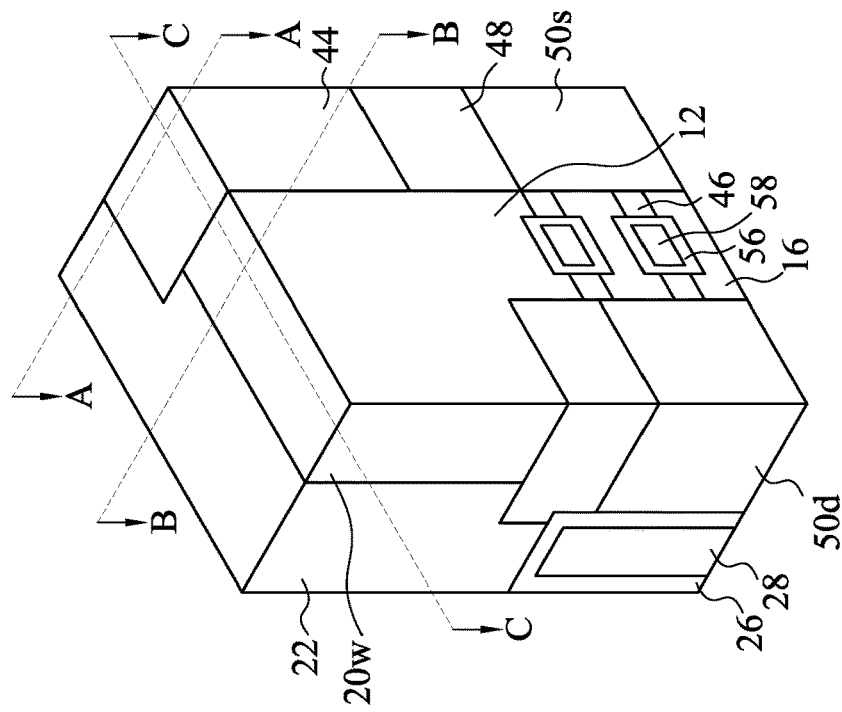
Figure 15C:
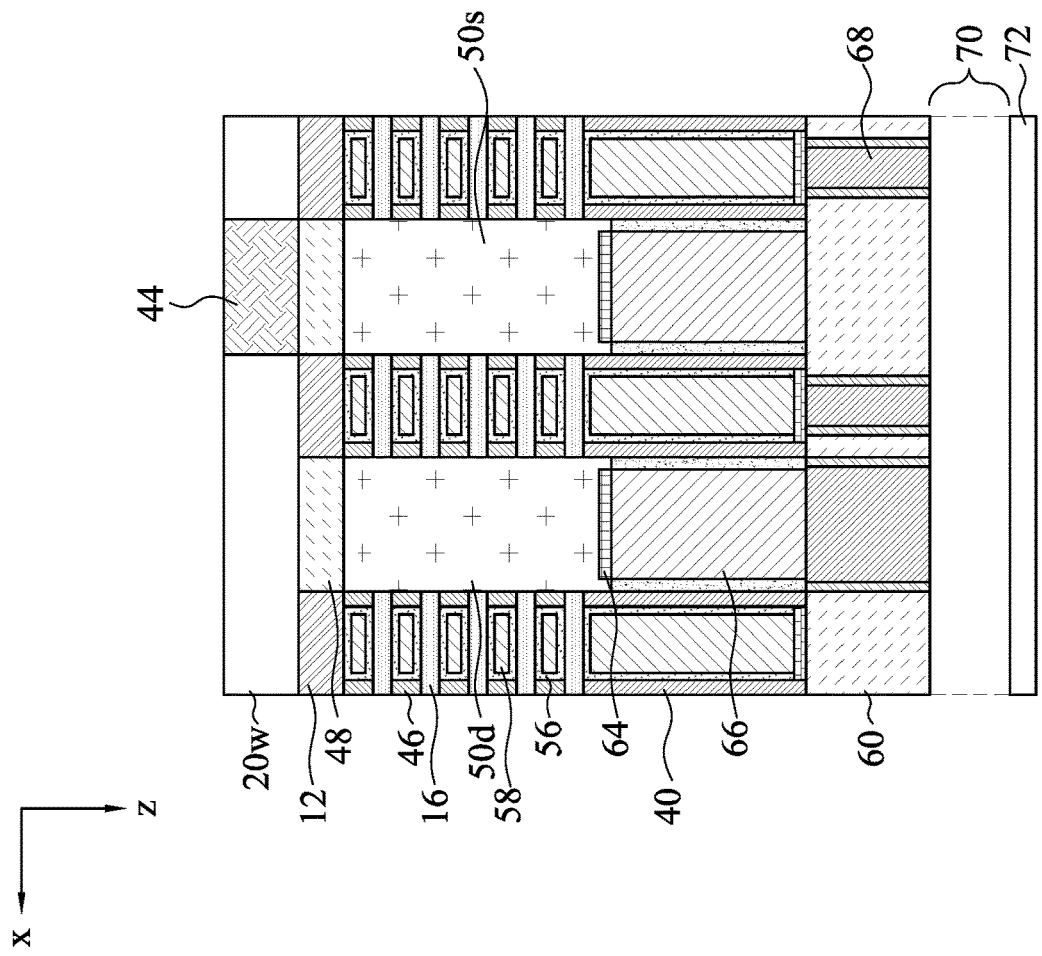
Figure 16B:
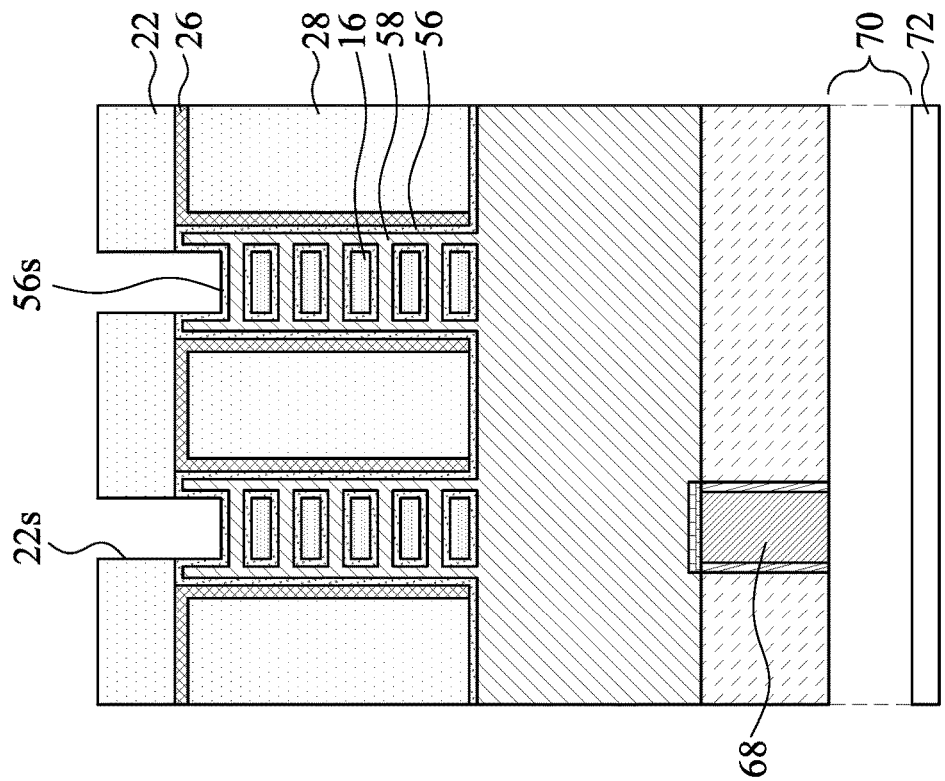
Figure 16A:
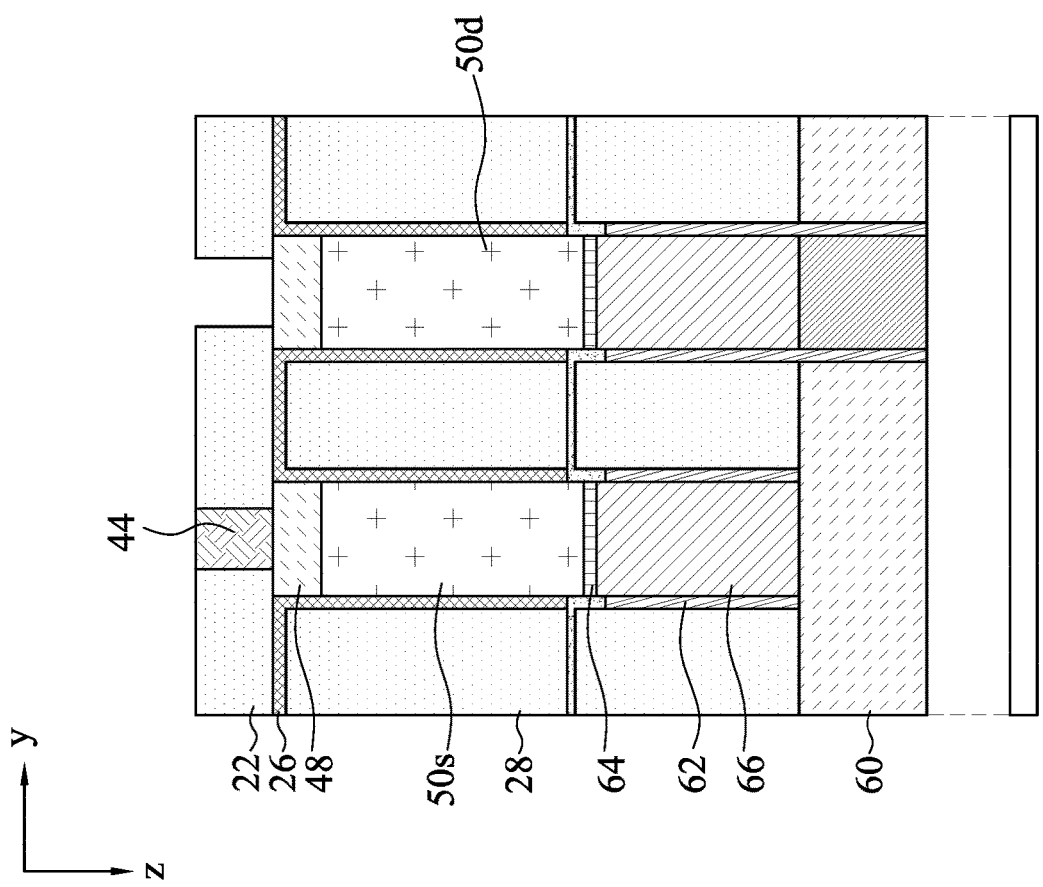
Figure 17B:
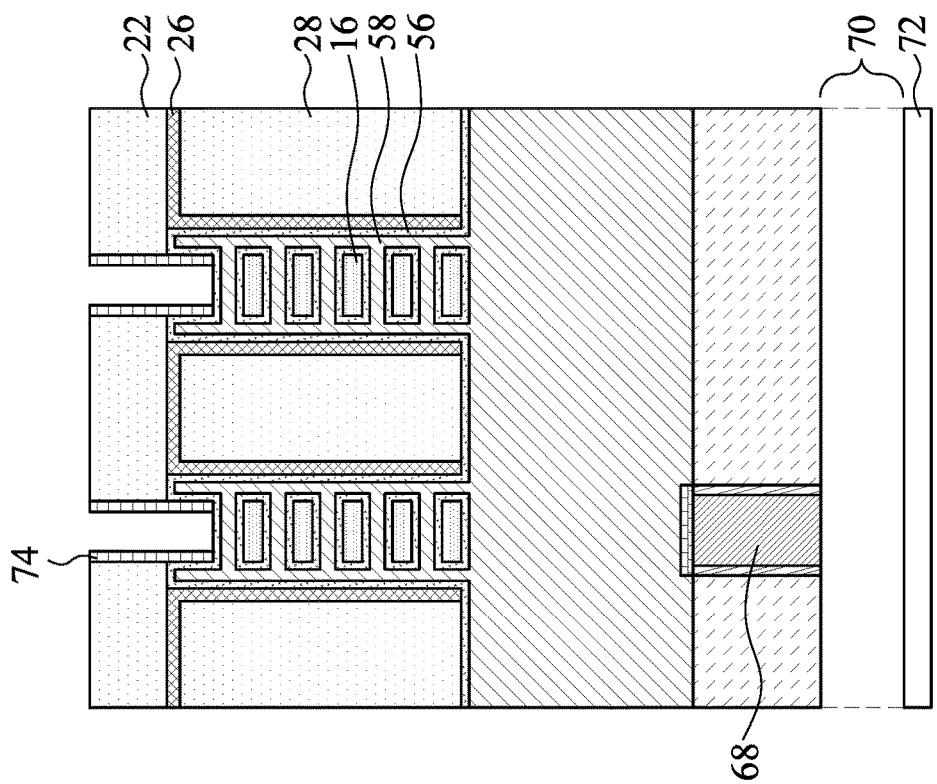
Figure 17A:
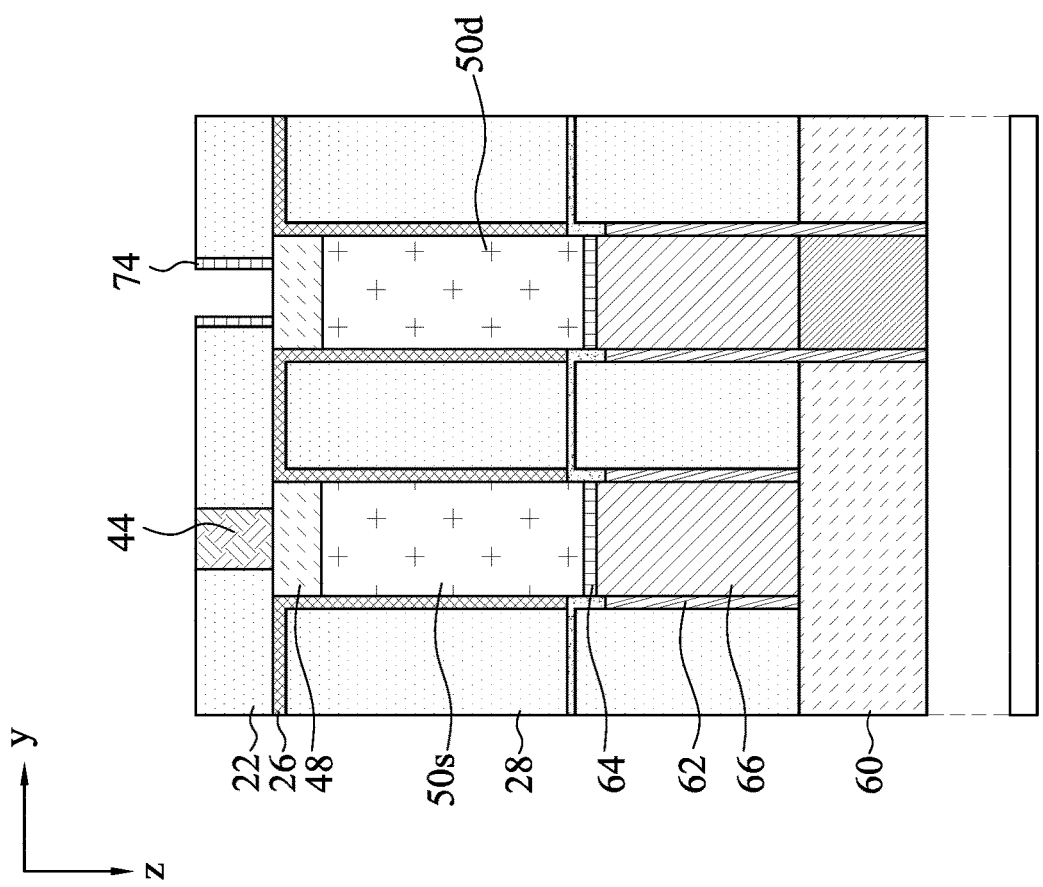
Figure 18B:
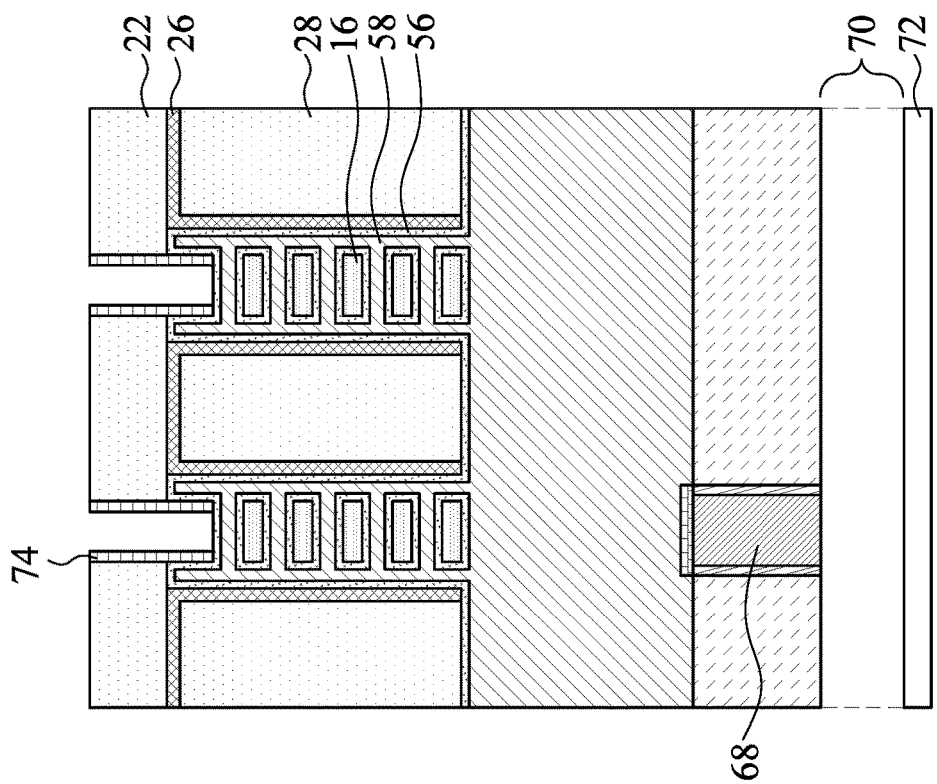
Figure 18A:
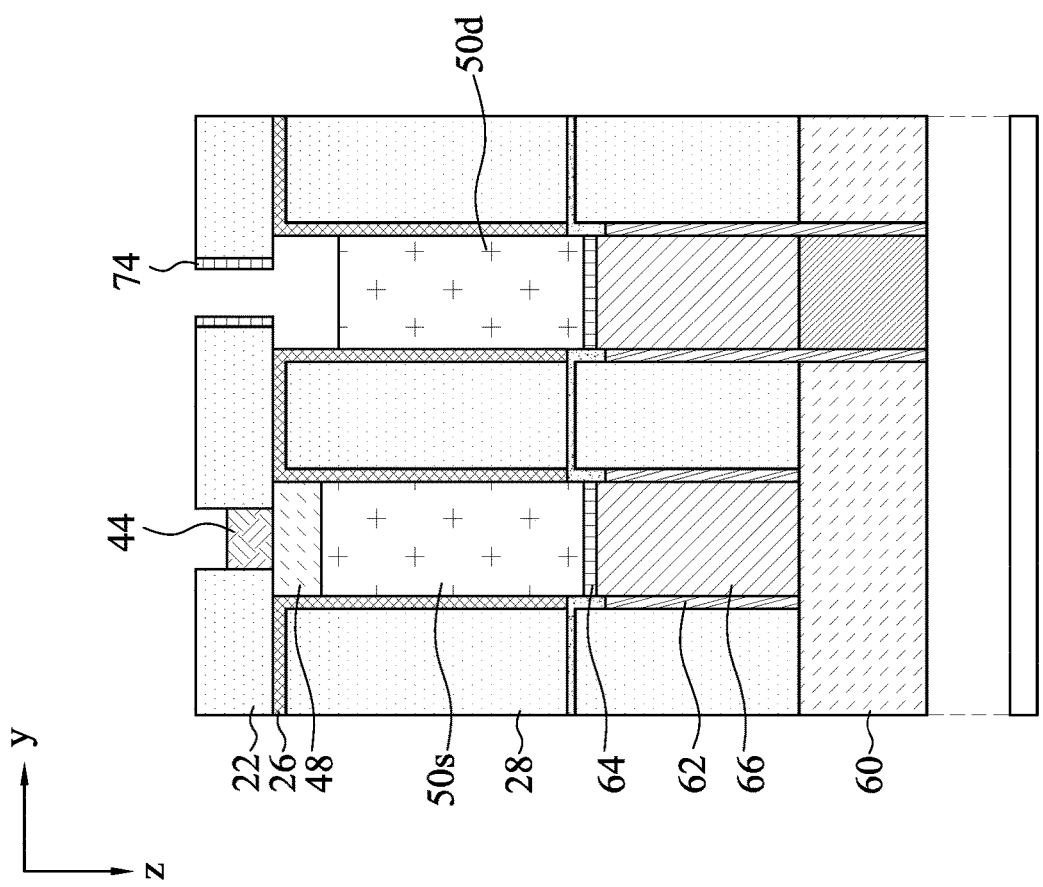
Figure 19B:
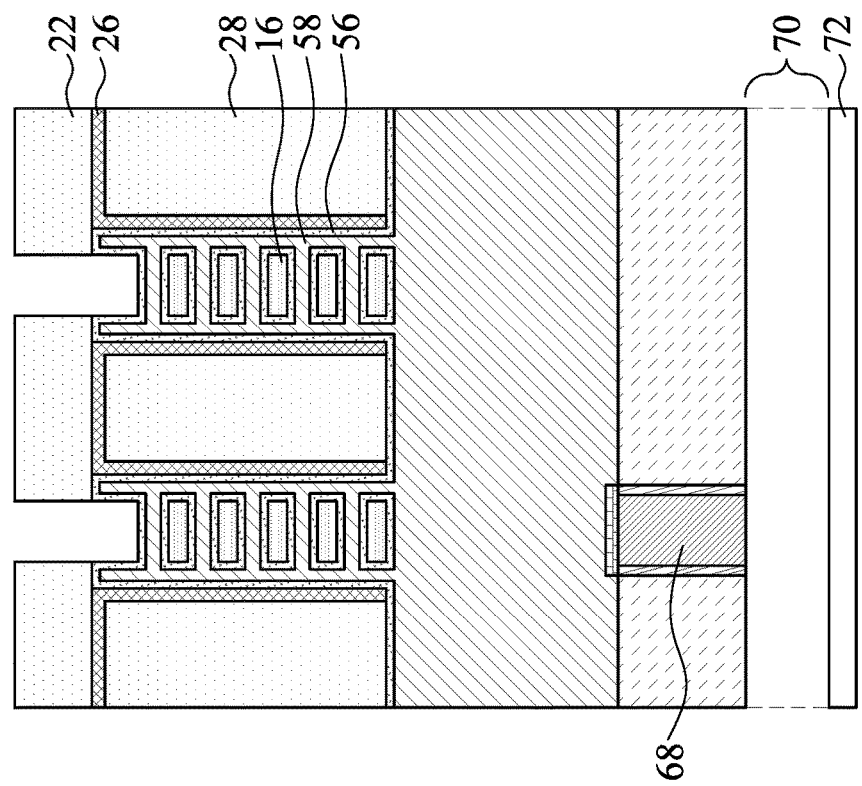
Figure 19A:
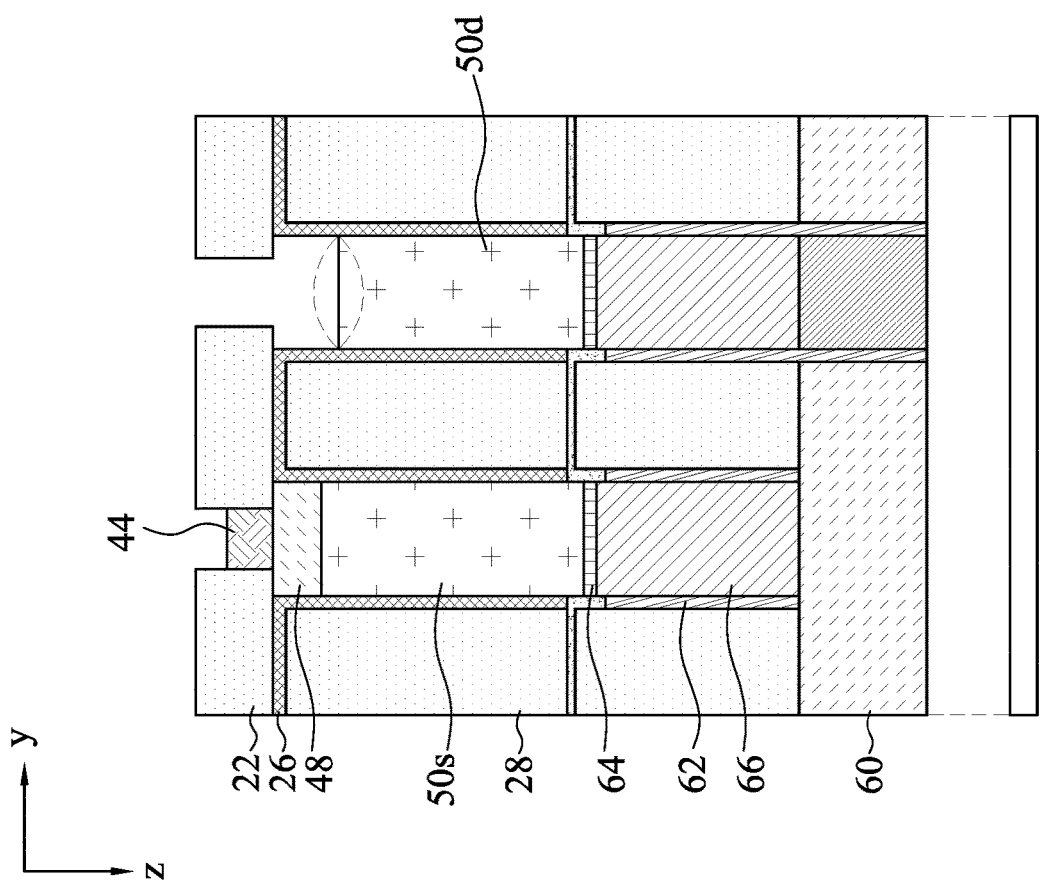
Figure 19D:
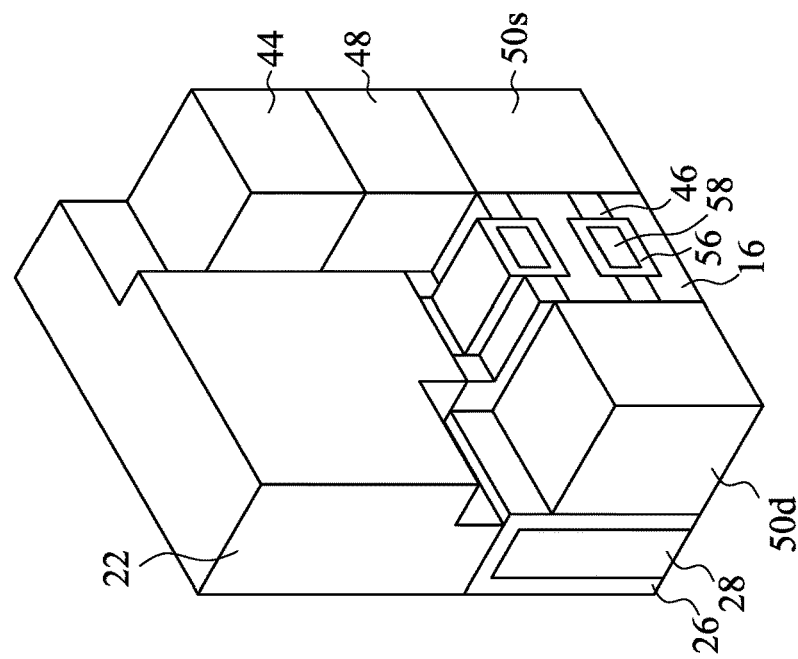
Figure 19C:
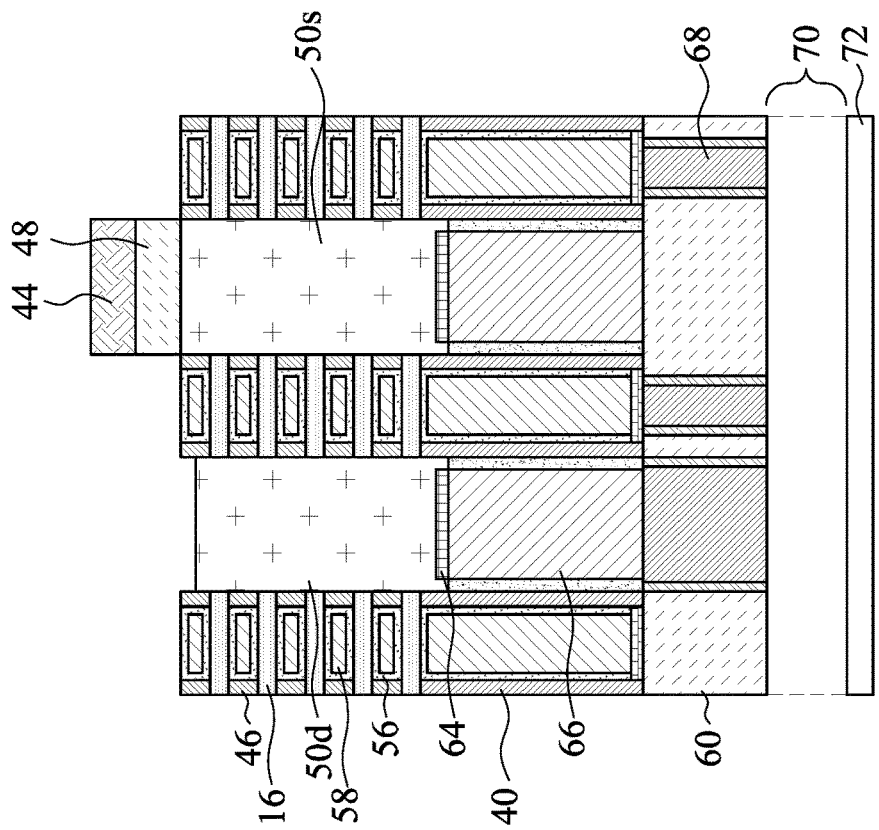

In operation 138, a front side interconnect structure 70 is formed over on the second ILD layer 60 and electrically connected to the active semiconductor devices on the substrate 10, as shown in FIGS. 14A-14C. The front side interconnect structure 70 includes multiple dielectric layers having metal lines and vias (not shown) formed therein. The metal lines and vias in the front side interconnect structure 70 may be formed of copper or copper alloys, and may be formed using one or more damascene processes. The front side interconnect structure 70 may include multiple sets of inter-layer dielectric (ILD) layers and inter-metal dielectrics (IMDs) layers.

In some embodiments, the front side interconnect structure 70 includes metal lines and vias for connecting signal lines only, but not connecting to power rails or connections to power rails. In other embodiments, the front side interconnect structure 70 incudes a portion of power rails. Power rails indicate conductive lines connecting between the epitaxial source/drain features 50 and a power source, such as VDD, and VSS (GND).

In operation 140, after the formation of the front side interconnect structure 70, a carrier wafer 72 is temporarily bonded to a top side of the front side interconnect structure 70, as shown FIGS. 14A-14C. The carrier wafer 72 serves to provide mechanical support for the front side interconnect structure 70 and devices formed on the substrate 10.

After the carrier wafer 72 is bond to the substrate 10, the carrier wafer 72 along with the substrate 10 is flipped over so that the backside of the substrate 10 (i.e., the back surface 10*b*) is facing up for backside processing as shown in FIGS. 15A-15D to 21A-21D. FIGS. 15A-21A are schematic cross-sectional views along lines A-A in FIG. 6. FIGS. 15B-21B are schematic cross-sectional views along lines B-B in FIG. 6. FIGS. 15C-21C are schematic cross-sectional view along lines C-C in FIG. 6. FIGS. 15D-21D are partial perspective sectional view of the semiconductor being manufactured at various stages.

In operation 142, a backside grinding is performed to expose the isolation layer 22, the well portion 20*w* of the semiconductor fin 20 and the backside contact alignment feature 44, as shown in FIGS. 15A-15D.

In operation 144, the exposed well portion 20w of the semiconductor fins 20 and the buffer layer 12 in contact with the gate dielectric layer 56 are removed from the backside by one or more etching processes, as shown in FIGS. 16A-16D.

The well portions 20w of the semiconductor fins 20 can be removed using an etch process having an etch selectivity for the material of the well portion 20w semiconductor fin 20 over the materials of the backside contact alignment feature 44 and the transitional epitaxial layers 48. In some embodiments, the well portions 20w of the semiconductor fins 20 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. The buffer layer 12 can be removed using the same or different etch process.

As shown in FIG. 16D, after removal of the semiconductor fins 20 and the buffer layer 12, a surface 56s of the gate dielectric layer 56 and a surface 46s of the inner spacers 46 are exposed. Vertical sidewalls 44s of the backside contact alignment feature 44 and vertical sidewalls 48s of the transitional epitaxial layer 48 are also exposed. Vertical sidewalls 22s of the isolation layer 22 are also exposed.

In operation 146, a sacrificial liner 74 is formed to cover exposed sidewalls 44s, 48s, and 22s, as shown in FIGS. 17A-17D. The sacrificial liner 74 may be first deposited conformally over all exposed surfaces by a suitable deposition process, such as by atomic layer deposition (ALD). An anisotropic etch is followed to remove the sacrificial liner 74 from horizontal surfaces, for example to expose the transitional epitaxial layer 48 not covered by the backside contact alignment feature 44.

In some embodiments, the sacrificial liner 74 may include a high-k material, such as $HfO_2$, $ZrO_2$, $HfAlO_x$, $HfSiO_x$, $Al_2O_3$, and the like, or other dielectric material. Material of the sacrificial liner 74 is selected to have etch selectivity relative to the material of the transitional epitaxial layer 48 to be removed. In some embodiments, the sacrificial liner 74 is a high-k metal oxide, such as $Al_2O_3$.

As shown in FIG. 17D, the sacrificial liner 74 covers the sidewalls 22s of the isolation layer 22, and sidewalls 44s of the backside contact alignment feature 44, while exposing the horizontal surface of the transitional epitaxial layer 48 without the coverage of the backside contact alignment feature 44.

In operation 148, one or more etch process is performed to remove the transitional epitaxial layer 48 to expose the source/drain features 50d underneath, as shown in FIGS. 18A-18D. The transitional epitaxial layer 48 is removed by any suitable etch process to expose a top surface of the epitaxial source/drain features 50d. In some embodiments, the transitional epitaxial layer 48 is removed by a dry etch method. For example, the transitional epitaxial layer 48 can be removed by an isotropic etch methods. In some embodiments, the transitional epitaxial layer 48 is removed by a dry etching process using fluorine-based etchant, such as $CF_4$, $NF_3$, $SF_6$.

As shown in FIG. 18D, after removal of the transitional epitaxial layer 48, surfaces 46s of the inner spacer 46, and sidewall 26s of the hybrid fin 30 are exposed. The backside contact alignment feature 44 is also etched back but maintains the coverage of the transitional epitaxial layer 48 below. Because the sacrificial liner 74 covers vertical sidewalls 44s of the backside contact alignment feature 44, the sidewalls 48s of the transitional epitaxial layer 48, and sidewalls 22s of the isolation layer 22, the backside contact alignment feature 44, the transitional epitaxial layer 48 under the backside contact alignment feature 44, and the isolation layer 22 maintain their dimensions during operation 148, thus, avoiding shape degradation.

Optionally, the epitaxial source/drain feature 50d may be recessed after removal of the transitional epitaxial layer 48. In some embodiments, the epitaxial source/drain feature 50d may be recessed by the same etch process used to remove the transitional epitaxial layer 48. In other embodiments, the epitaxial source/drain feature 50d may be recessed by a suitable and different etch process. Depending on the process recipe used to recess the epitaxial source/drain feature 50d, a recessed surface 50p of the epitaxial source/drain feature 50 may have a planar profile, or a non-planar profile, such as a concave profile (dishing), or a convex profile (protruded). In FIGS. 18A-18D, the recessed surface 50p of the epitaxial source/drain feature 50d has a substantially flat profile.

In some embodiments, after operation 148, the epitaxial source/drain feature 50d stops at the channel region at the Z direct at the level of the first segment 46f of the inner spacer 46 and remain full coverage of the topmost second semiconductor layer 16f of the semiconductor channel 16c. The amount of the epitaxial source/drain feature 50d being recessed along the Z direction is denoted by a recess thickness H5. In some embodiments, the recess thickness H5 is less than about 15 nm along the Z direction. If the epitaxial source/drain feature 50d is not recessed, the epitaxial source/drain feature 50 may extend beyond the topmost segment 46f of the inner spacer 46 and be in the direct line of sight of the gate electrode layer 58 without the inner spacer 46 threrebetween, and generating a high capacitance with portions of the gate electrode layer 58, negatively affecting device performance. If the epitaxial source/drain feature 50d is recessed for greater than 15 nm, the second semiconductor layer 16 may become exposed and the dimension of active region is unnecessarily reduced.

In operation 150, the sacrificial liner 74 is removed, as shown in FIGS. 19A-19D. The sacrificial liner 74 is removed by a suitable etch process, such as a wet etching process. In some embodiments, the sacrificial liner 74 is removed using wet etchant including $NH_4OH$ and $H2O2$. The removal process is a selective removal process to remove the sacrificial liner 74, while the other exposed materials, such as the inner spacers 46, the gate dielectric layer 56, and the isolation layer 22, are not affected.

In operation 152, a spacer liner 76 is formed over exposed surfaces as shown in FIGS. 20A-20D. In some embodiments, the spacer liner 76 is deposited by a conformal deposition. The spacer liner 76 can include a nitride material, such as silicon nitride, silicon oxynitride (SiON), silicon carbon nitride (SiCN), silicon carbon oxynitride (SiCON), or any combinations thereof, a silicon oxide, silicon oxycarbide (SiOC), or silicon carbide (SiC). The spacer liner 76 can be formed by, for example, ALD, CVD, PVD, PECVD, remote plasma CVD, or any suitable deposition technique. In some embodiment, the spacer liner 76 includes SiONC. In some embodiments, the spacer liner 76 is formed from the same material as the inner spacer 46. For example, the spacer liner 76 and the inner spacer 46 are both formed from SiONC.

In some embodiments, the spacer liner 76 has a thickness in a range between about 1 nm and about 10 nm. If the spacer liner 76 is thinner than 1 nm, the spacer liner 76 is not thick enough to provide protection to dielectric material filled within the spacer liner 76 during the subsequent etching process. If the spacer liner 76 is thicker than 10 nm, there will not be obvious improvement in protection and may pitch off space.

As shown in FIGS. 20A-20D, the spacer liner 76 is formed over the epitaxial source/drain feature 50*d*, the inner spacers 46, the gate dielectric layer 56, the isolation layer 22, the liner layer 26 of the hybrid fin 30, and the sidewalls 44*s* of the backside contact alignment feature 44, and the sidewalls 48*s* of the transitional epitaxial layer 48.

In operation 154, a refill dielectric layer 78 is formed in cavities defined by the spacer liner 76, as shown in FIGS. 20A-20D. The refill dielectric layer 78 is deposited over the spacer liner 76 to fill the cavities vacated by the well portions 20*w* of the semiconductor fins 20, the buffer layer 12 over the gate dielectric layer 56, the transitional epitaxial layer 48 on the epitaxial source/drain feature 50*d*, and the recessed portion epitaxial source/drain feature 50*d* if any. After the formation of the refill dielectric layer 78, a planarization process, such as CMP, is performed to expose the backside contact alignment feature 44.

In some embodiments, the refill dielectric layer 78 includes a silicon oxide, a material convertible to a silicon oxide, a silicate glass (USG), an alkoxysilane compound (e.g., tetraethoxysilane (TEOS), tetramethoxysilane (TMOS)), thermal oxide, or any suitable dielectric material, or any combination thereof, and can be formed by FCVD, a spin-on coating process, or any suitable deposition technique.

In some embodiments, the refill dielectric layer 78 is formed from the same material as the spacer liner 76. For example, the refilling dielectric layer 78 and the spacer liner 76 are both formed from SiONC. In some embodiments, the refill dielectric layer 78, the spacer liner 76, and the inner spacer 46 are formed from the same material.

Figure 20B:
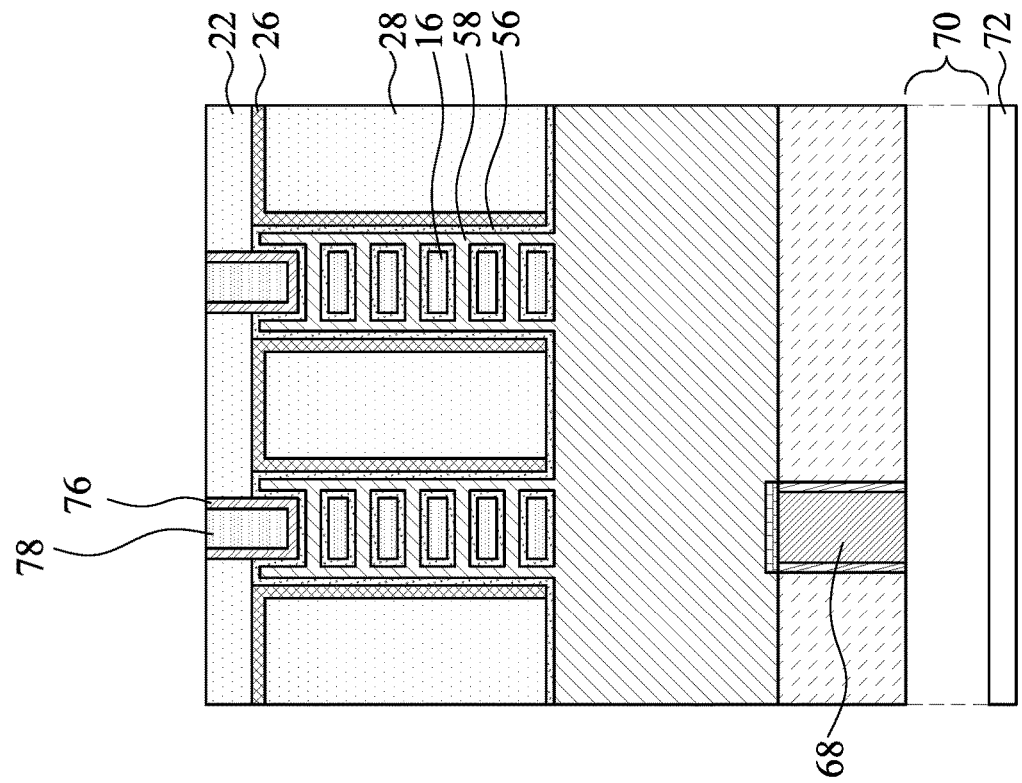
Figure 20A:
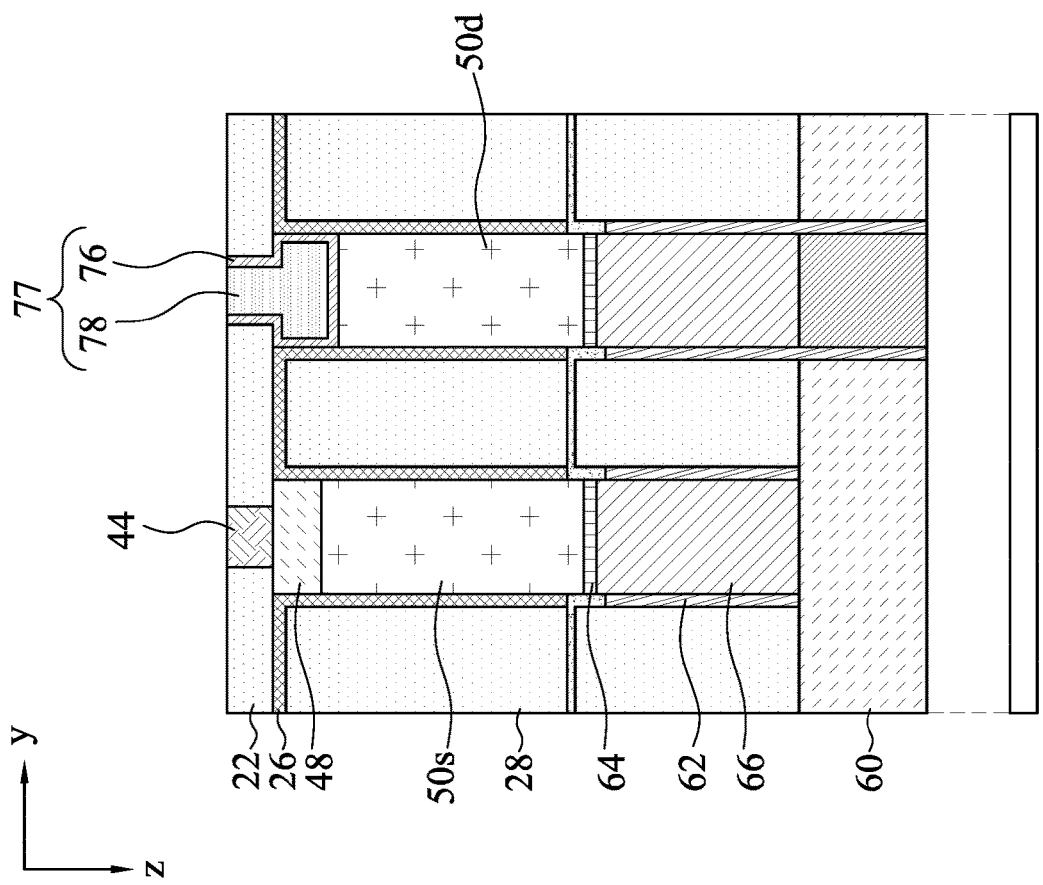
Figure 20D:
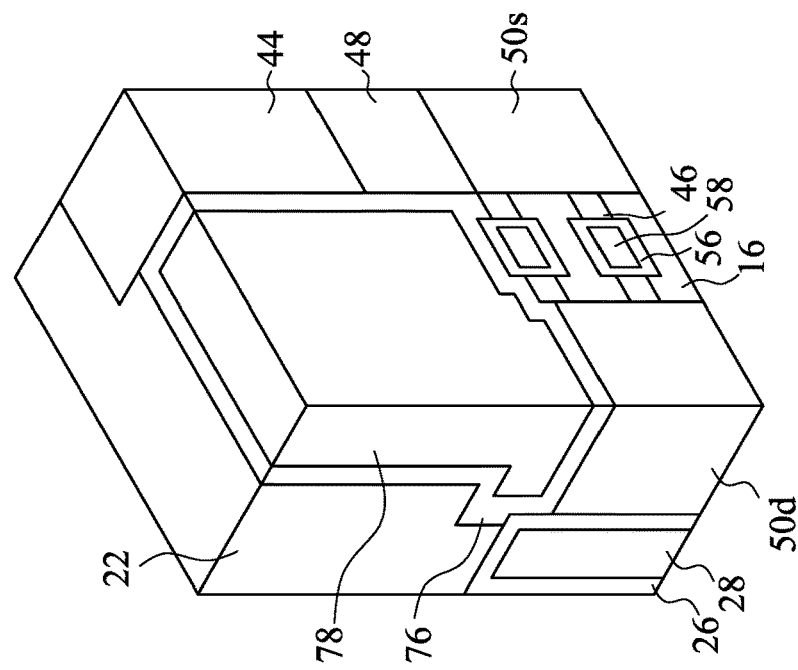

The spacer liner 76 and the refill dielectric layer 78 form a dielectric feature 77 flush against the epitaxial source/drain feature 50*d* and the gate structure formed between the epitaxial source/drain feature 50*s* and the epitaxial source/drain feature 50*d*. As shown in FIG. 20A, the dielectric feature 77 are formed in the isolation layer 22 and extending into the source/drain space between the hybrid fins 30. The dielectric feature 77 is in contact with the epitaxial source/drain feature 50*d*, which does not have a conductive contact on the backside. The dielectric feature 77 includes a first portion 77*u* formed in the isolation layer 22, and a second portion 77*l* formed between hybrid fins 30 and in contact with the epitaxial source/drain feature 50*d*. In some embodiments, the second portion 77*l* of the dielectric feature 77 is wider than the first portion 77*u* of the dielectric feature 77. In some embodiments, the second portion of the dielectric feature 77 expands between the hybrid fins 30 and are in contact with the sidewalls 30*s* of the hybrid fins 30.

Figure 20C:
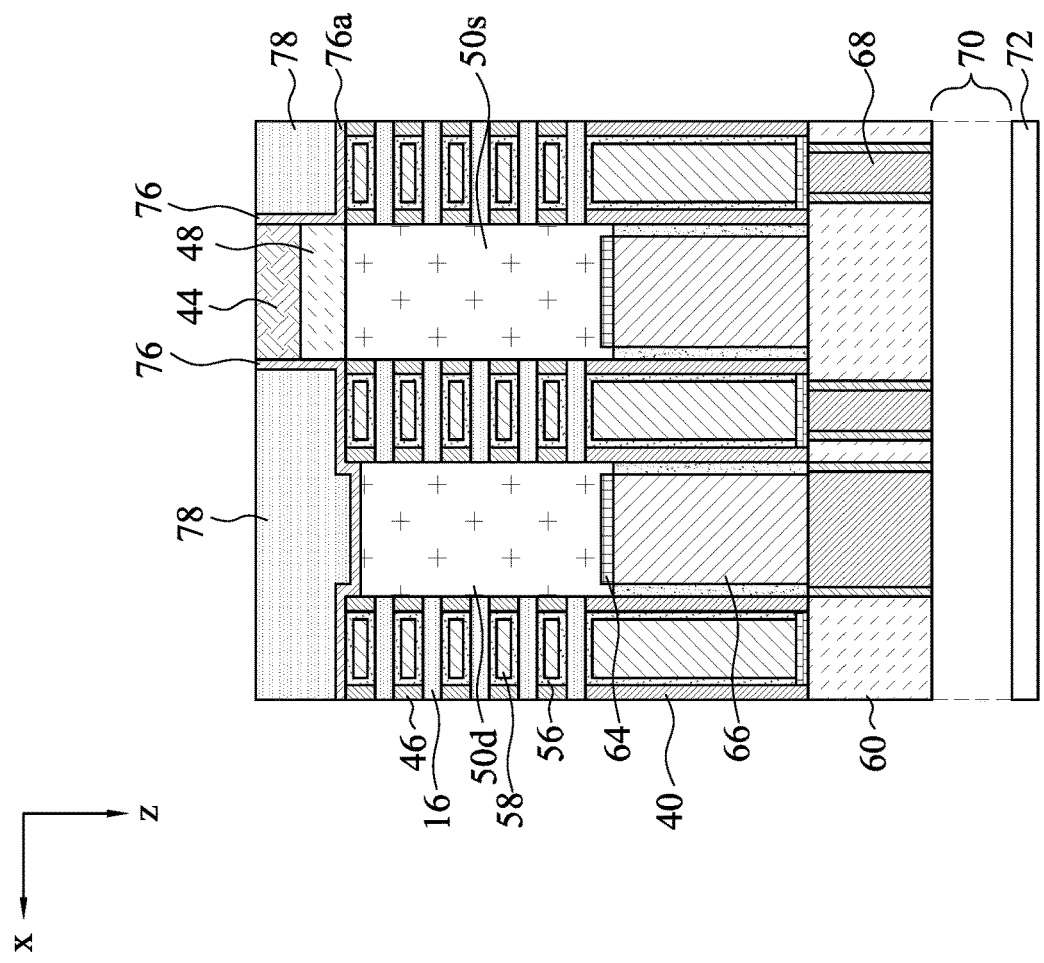
Figure 21B:
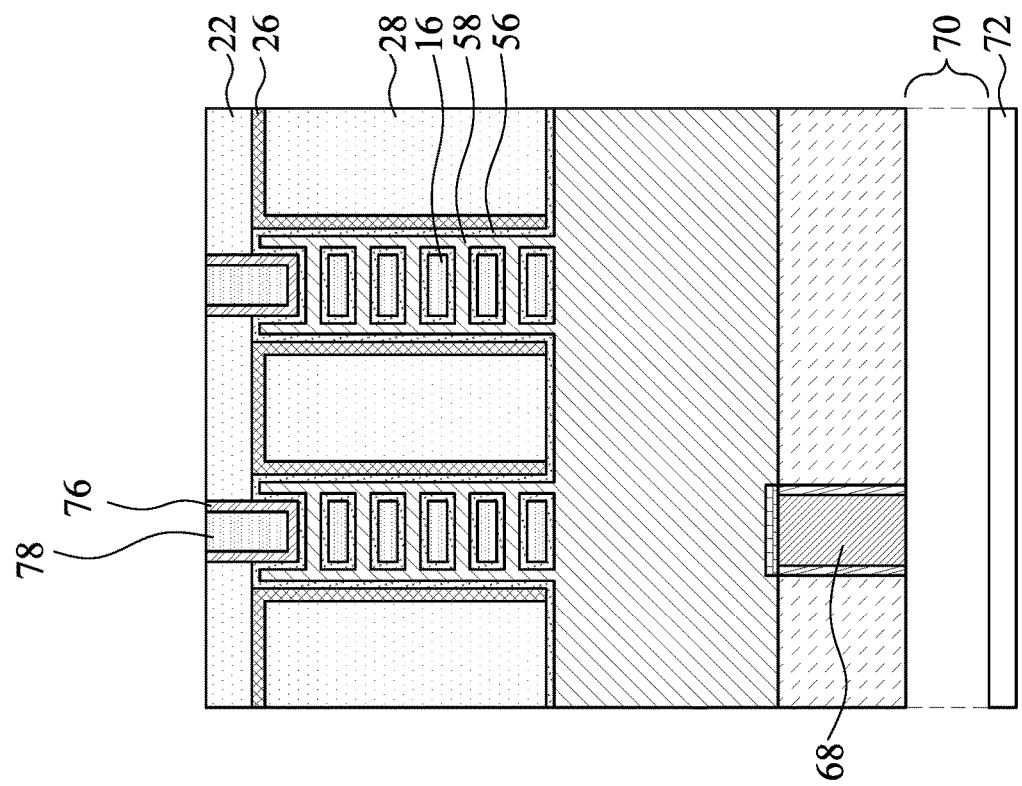
Figure 21A:
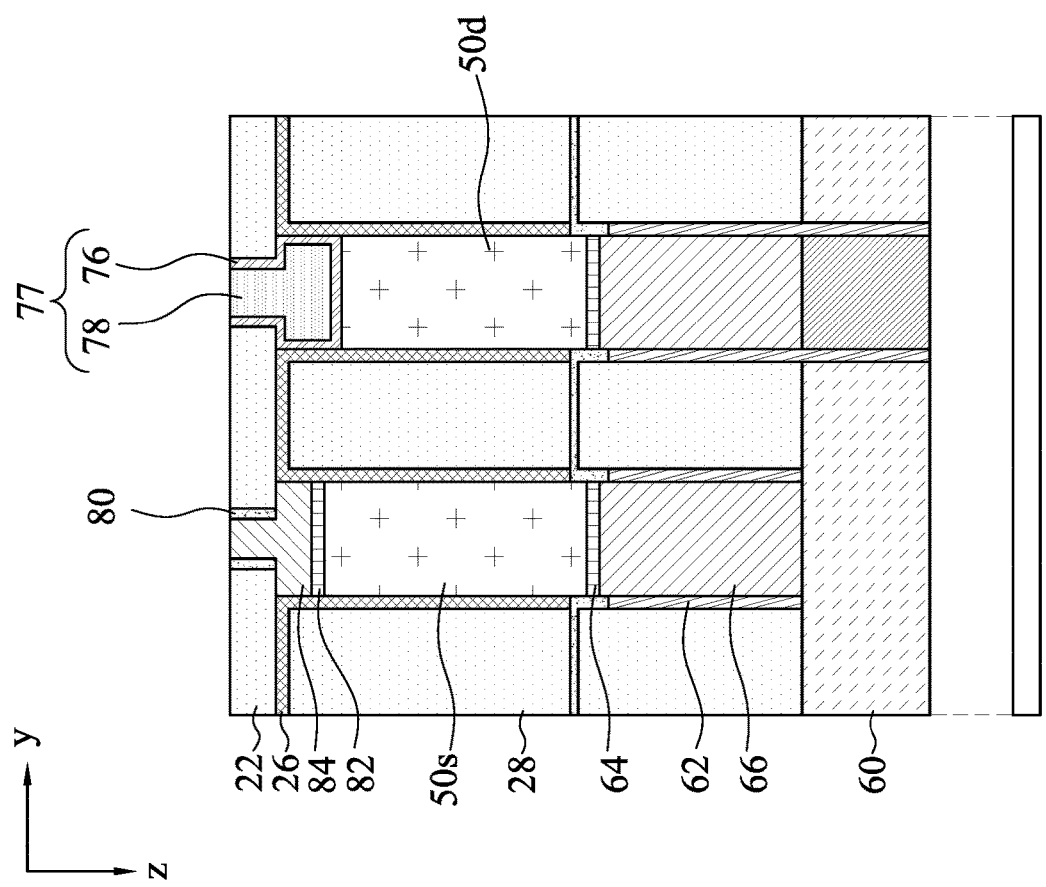
Figure 21D:
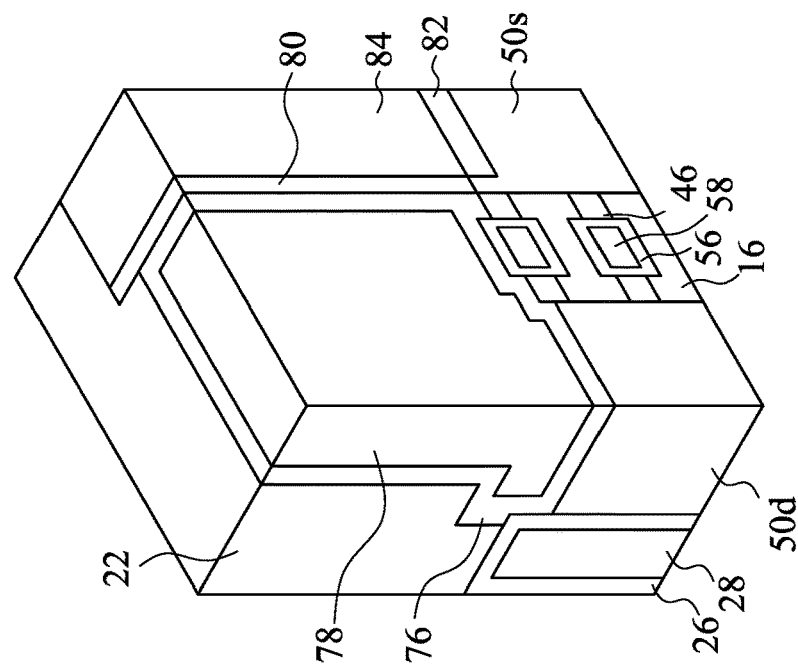
Figure 21C:
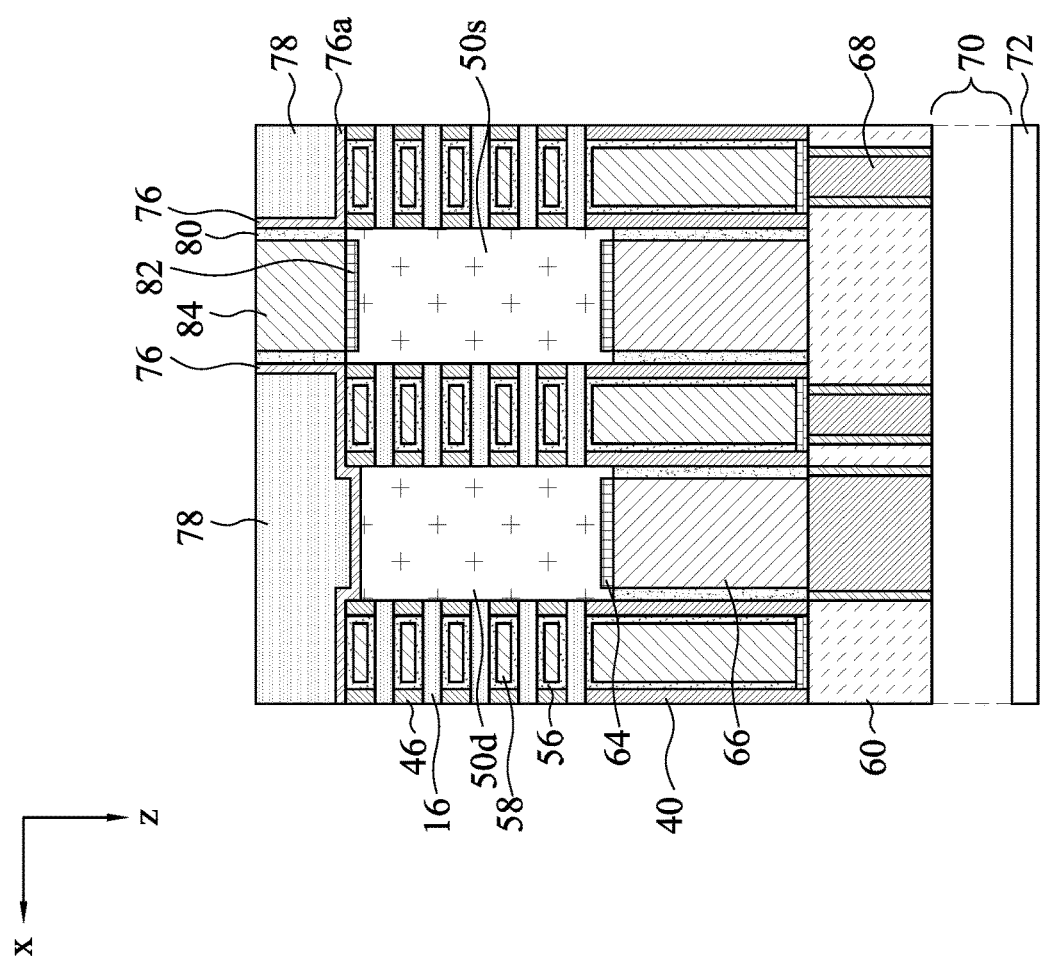

As shown in FIG. 20C, the spacer liner 76 overlaps with the topmost segment 46*f* of the inner spacers 46, increasing the amount of dielectric materials between the gate electrode layer 58 and the epitaxial source/drain feature 50*d*.

In operation 156, the backside contact alignment feature 44 and the transitional epitaxial layer 48 are removed to form contact holes and expose the epitaxial source/drain feature 50*s* underneath for metal formation.

The backside contact alignment feature 44 is removed to expose the transitional epitaxial layer 48. Any suitable etch processes can be used to remove the backside contact alignment feature 44. Since the transitional epitaxial layer 48 is formed on the backside contact alignment feature 44, and the epitaxial source/drain feature 50*s* is formed on the transitional epitaxial layer 48, the backside contact alignment feature 44 is aligned with the corresponding epitaxial source/drain feature 50*s*. Contact holes vacated by the backside contact alignment feature 44 are aligned with the epitaxial source/drain feature 50*s* without using any photolithography and patterning process.

The transitional epitaxial layers 48 are removed by a suitable etch process to expose top surfaces of the epitaxial source/drain features 50*s*. In some embodiments, the transitional epitaxial layers 48 are removed by a dry etch method. For example, the transitional epitaxial layers 48 can be removed by a dry etching process using fluorine-based etchant, such as $CF_4$, $NF_3$, $SF_6$.

In operation 158, backside source/drain contacts 84 are formed in the contact holes, as shown in FIGS. 21A-21D. In some embodiments, a preclean process is performed prior to depositing the backside source/drain contacts 84 to remove residue left after the removal of the transitional epitaxial layer 48. The preclean process may be performed using a plasma process.

After preclean, a diffusion barrier layer 80 may be formed on surfaces of the contact holes. The diffusion barrier layer 80 may include W, Co, Ni, Ti, Mo, and Ta, or a metal nitride layer selected from tungsten nitride, cobalt nitride, nickel nitride, titanium nitride, molybdenum nitride, and tantalum nitride. The deposition of the diffusion barrier layer 80 is followed by a rapid thermal annealing process at a temperature in a range from about 700° C. to about 900° C. to form a silicide layer 82 on the exposed surface of the epitaxial source/drain feature 50*s* using the diffusion barrier layer 80 as a metal source layer. In some embodiments, the silicide layer 82 includes one or more of WSi, CoSi, NiSi, TiSi, MoSi, and TaSi. In some embodiments, the silicide layer 82 has a thickness in a range between about 4 nm and 10 nm, for example between 5 nm and 6 nm.

The backside source/drain contact 84 is then formed by filling a conductive material in the cavity defined by the diffusion barrier layer 80 and the silicide layer 82. The conductive material may be one or more of Co, W, Mo, Ru, Al, or compounds thereof. In some embodiments, the conductive material is filled in the contact holes by CVD, ALD, electro-plating, or other suitable method. In some embodiments, a planarization process, such as CMP, may be performed after filling the contact holes to form the backside source/drain contacts 84.

Figures 22A, 22B:
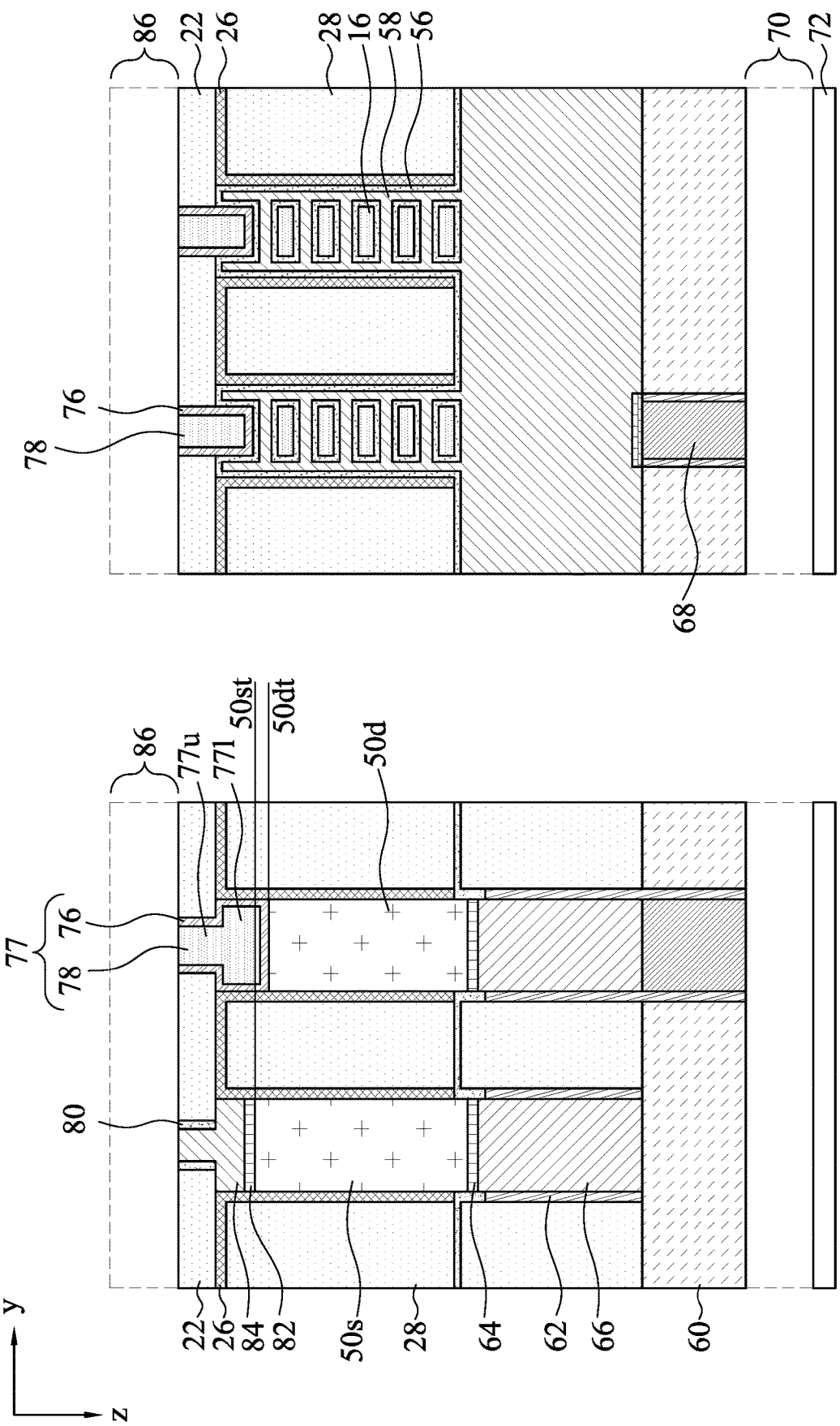
Figure 22C:
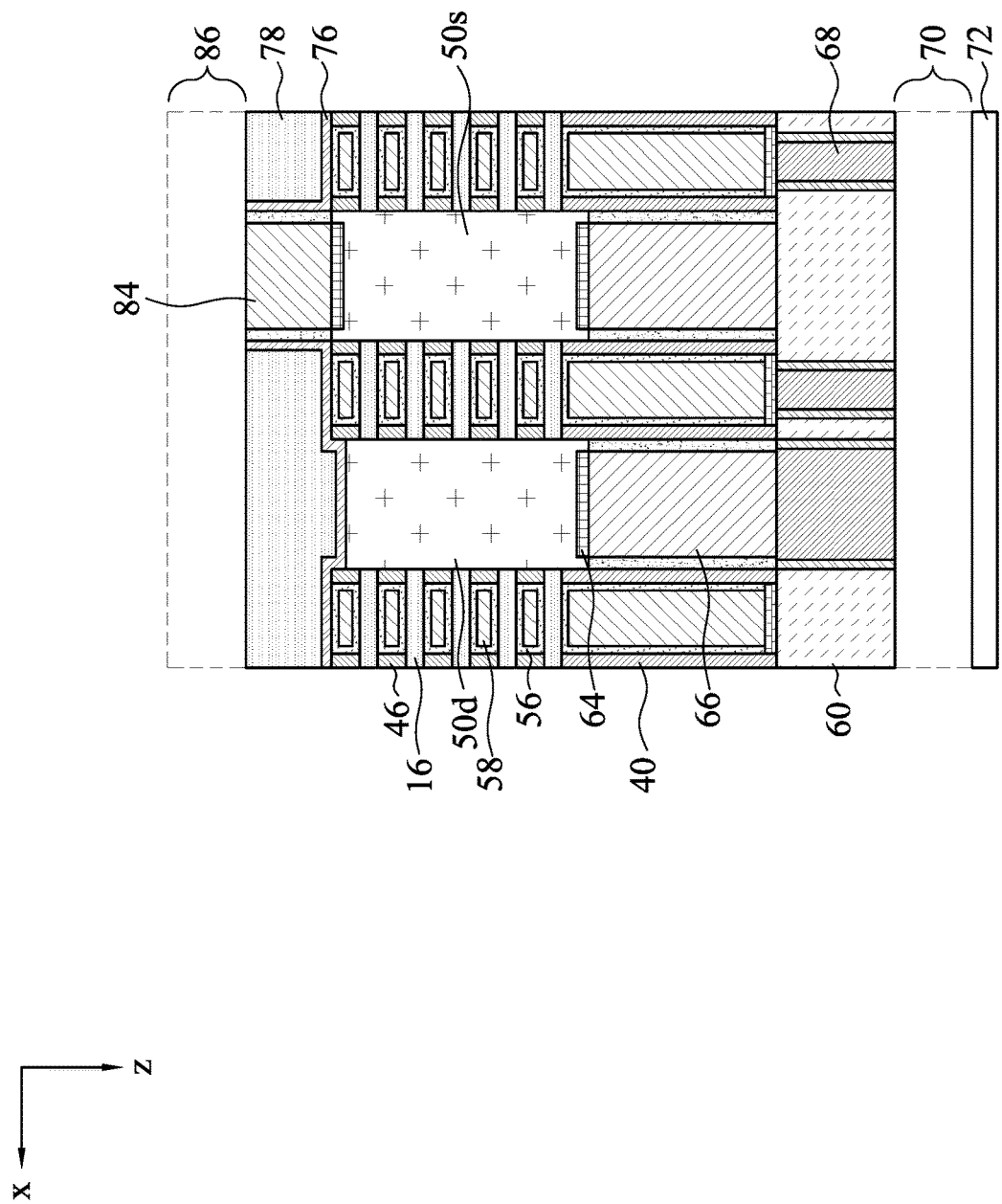

In operation 160, a backside interconnect structure 86 is formed to provide connection to the backside source/drain contacts 84, as shown in FIGS. 22A-22C. In some embodiments, the backside source/drain contacts 84 are configured to connect the epitaxial source/drain feature 50*s* to power rails, such as a positive voltage rail (VDD) and a ground rail (GND) through the backside interconnect structure 84.

After formation of the backside source/drain contact 84, a top surface 50*dt* of the epitaxial source/drain feature 50*d* and a top surface 50*st* of the epitaxial source/drain feature 50*s* are at different levels along the Z direction, as shown in FIG. 22A. In some embodiments, the top surface 50*dt* of the epitaxial source/drain feature 50*d* is lower than the top surface 50*st* of the epitaxial source/drain feature 50*s* along the Z-direction because the epitaxial source/drain feature 50*d* has been recessed prior to formation of the spacer liner 76. In other embodiments, the top surface 50*dt* of the epitaxial source/drain feature 50*d* is higher than the top surface 50*st* of the epitaxial source/drain feature 50*s* along the Z-direction. In other embodiments, the top surface 50*dt* of the epitaxial source/drain feature 50*d* and the top surface 50*st* of the epitaxial source/drain feature 50*s* are at the same level.

Figure 23B:
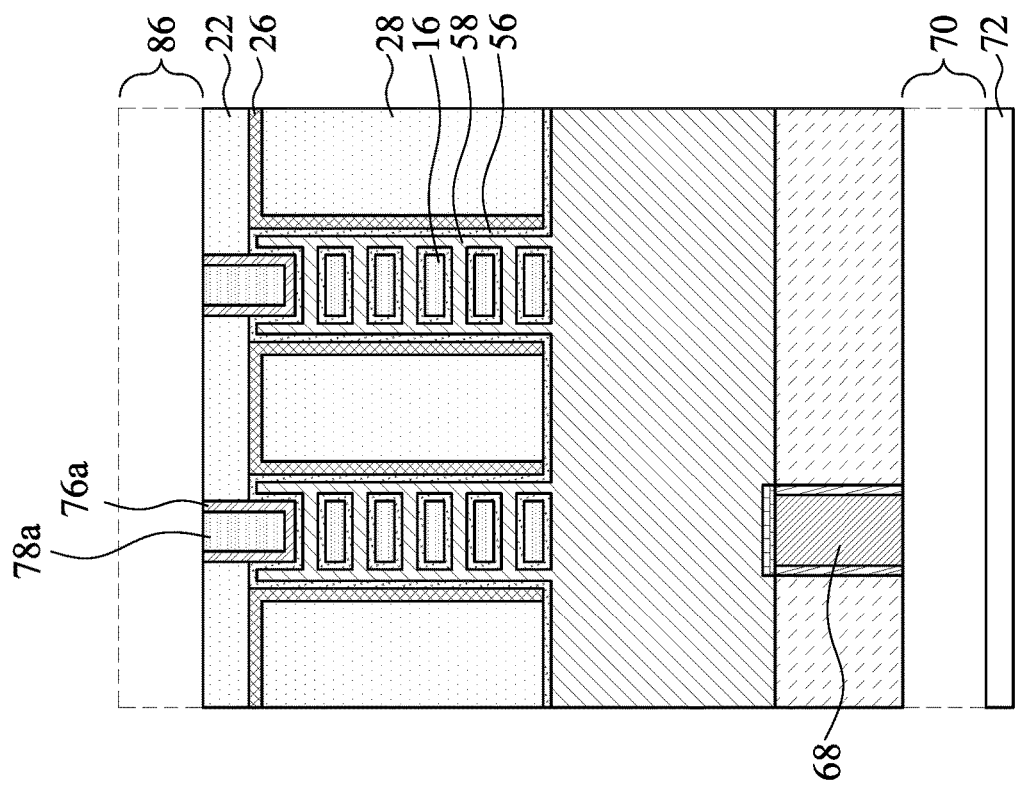
FIGS. 23A-23C schematically illustrate a semiconductor device according to one embodiment of the present disclosure.
Figure 23A:
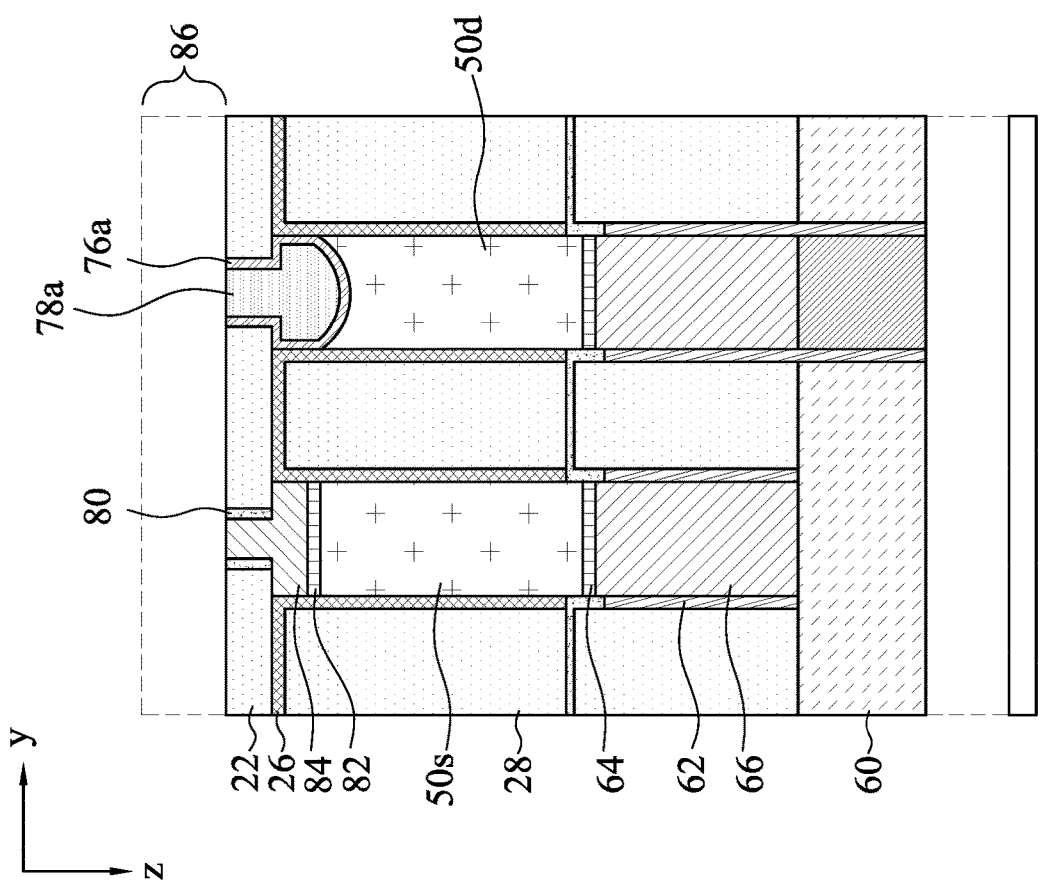
Figure 23C:
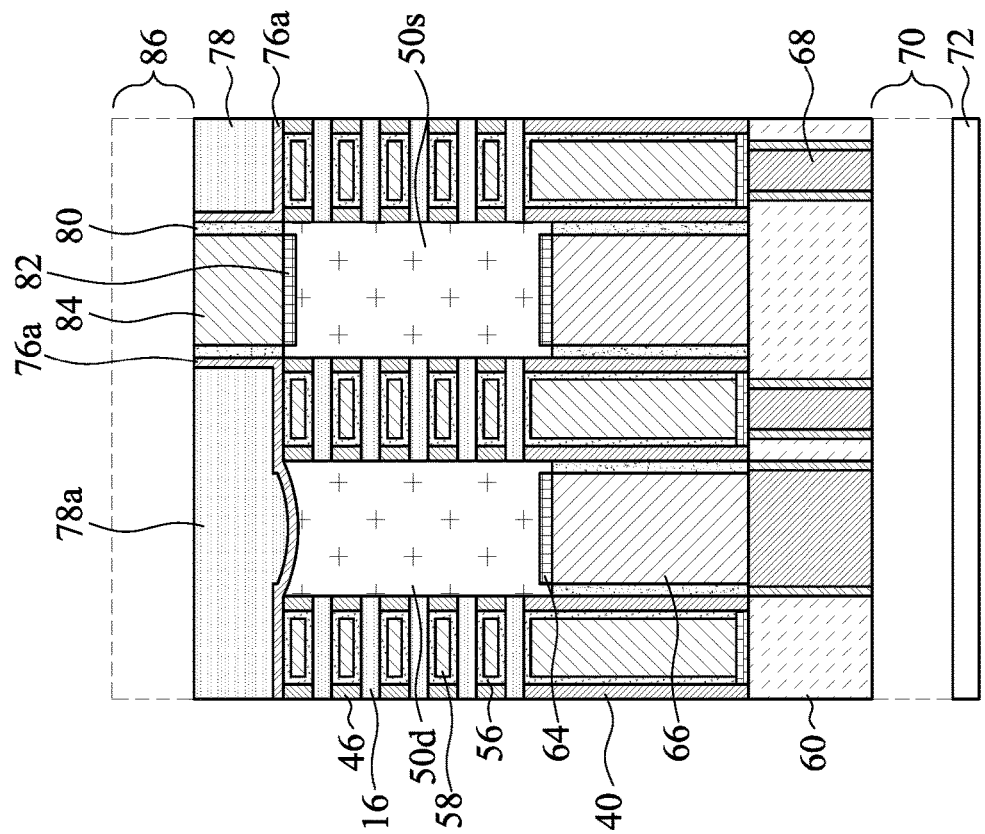
Figure 24B:
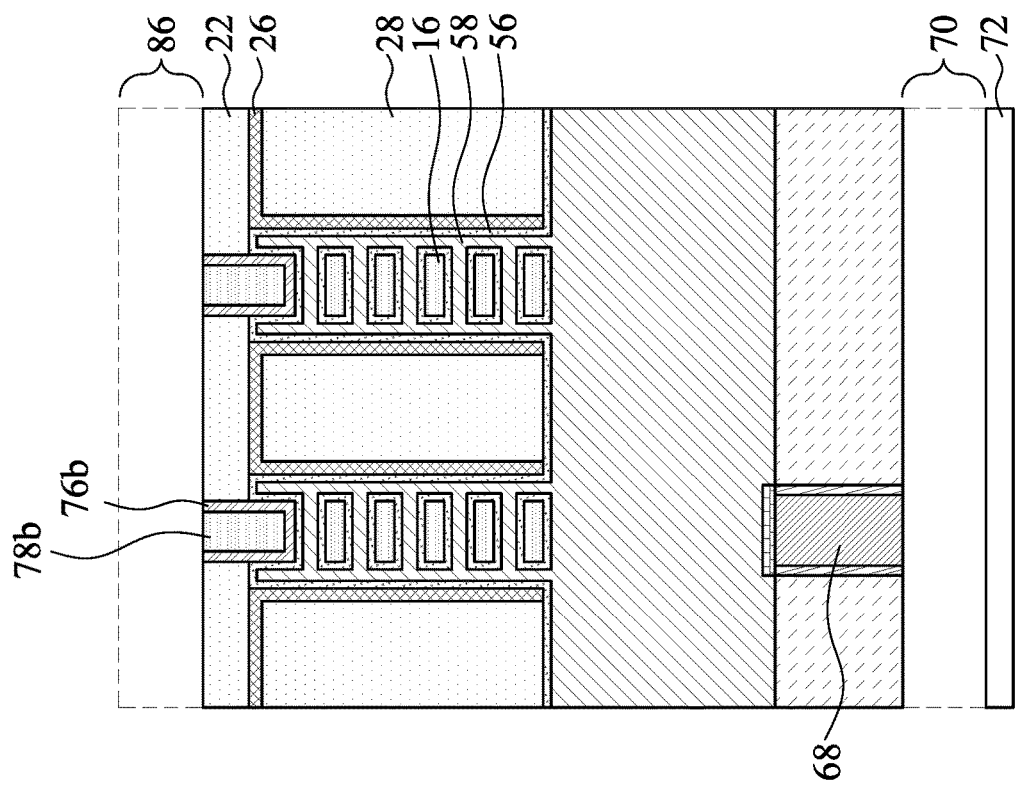
FIGS. 24A-24C schematically illustrate a semiconductor device according to one embodiment of the present disclosure.
Figure 24A:
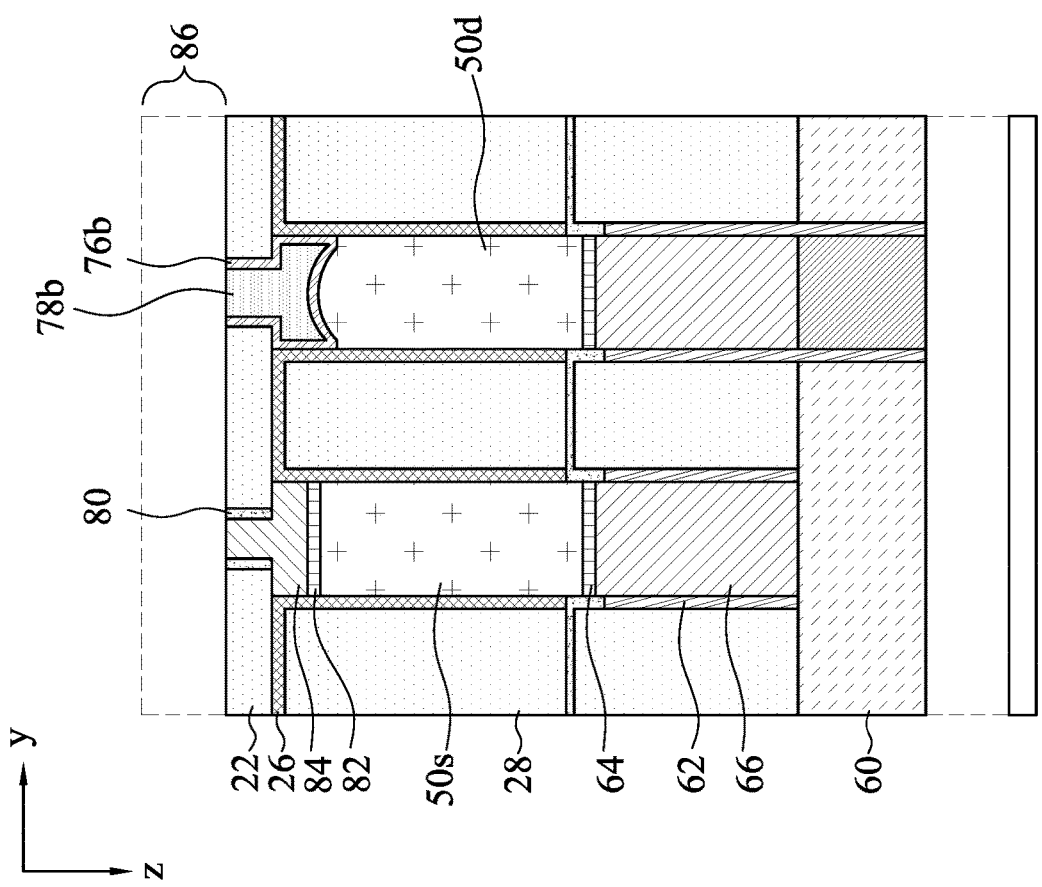
Figure 24C:
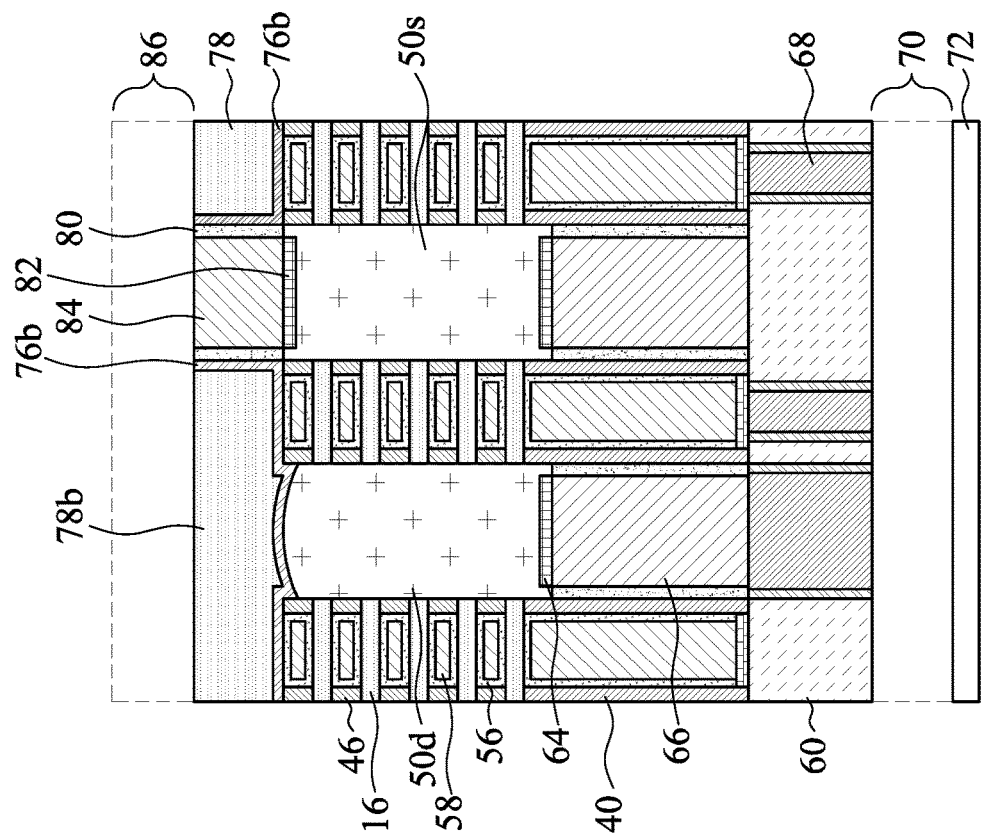

As discussed in FIGS. 18A-18D, the recessed surface 50p of the epitaxial source/drain feature 50d may have a planar profile, or non-planar profile, such as a concave profile (dishing), or a convex profile (protruded). The dielectric feature composed of the spacer liner 76 and the fill dielectric layer 78 shape varies depending on the profile of the recessed surface 50p. FIGS. 23A-23C schematically illustrate the semiconductor device including a dielectric structure with a spacer liner 76a and a fill dielectric layer 78a when the recess surface 50p is a concave surface. FIGS. 24A-24C schematically illustrate a semiconductor device including a dielectric structure with a spacer liner 76b and a fill dielectric layer 78b when the recess surface 50p is a convex surface.

Various embodiments or examples described herein offer multiple advantages over the state-of-art technology. Embodiments of the present disclosure provide a method for forming backside metal contacts with reduced $C_{gd}$ and increased speed. Particularly, source/drain features on the drain side, or source/drain features without backside metal contact, are recessed from the backside to the level of the inner spacer to reduce $C_{gd}$. Some embodiments of the present disclosure use a sacrificial liner to protect backside alignment feature during backside processing, thus, preventing shape erosion of metal conducts and improving device performance.

It will be understood that not all advantages have been necessarily discussed herein, no particular advantage is required for all embodiments or examples, and other embodiments or examples may offer different advantages.

Some embodiments of the present provide a semiconductor device. The semiconductor device. The semiconductor device includes a first source/drain feature, a second source/drain feature, a semiconductor channel between the first and second source drain features, a gate dielectric layer on the semiconductor channel, an inner spacer formed between the gate dielectric layer and the second source/drain feature, a first conductive feature formed on the first source/drain feature, and a spacer liner in contact with the inner spacer, the gate dielectric layer, and the second source/drain feature.

Some embodiments of the present provide a semiconductor device. The semiconductor device. The semiconductor device includes an isolation layer, first and second dielectric fins in contact with the isolation layer, a first source/drain feature formed between the first and second dielectric fins, a second source/drain feature formed between the first and second dielectric fins, a first conductive feature formed in the isolation layer and extending between the first and second dielectric fins to contact the first source/drain feature, and a dielectric feature in contact with the second source/drain feature, wherein the dielectric feature includes a first portion formed in the isolation layer, and a second portion formed between the first and second dielectric fins, and the second portion is wider than the first portion.

Some embodiments provide a method for forming a semiconductor device. The method includes forming a semiconductor fin on a semiconductor substrate, forming an isolation layer to cover a portion of the semiconductor fin, forming a contact alignment feature in the portion of semiconductor fin covered by the isolation layer, forming a first source/drain feature and a second source/drain feature over the semiconductor fin, wherein the first source/drain feature is aligned with the contact alignment feature, after forming the first and second source/drain features, removing the portion of the semiconductor fin in the isolation layer, forming a sacrificial liner to cover vertical sidewalls of the isolation layer and the contact alignment feature, and performing an etch process to expose the second source/drain feature with the sacrificial liner covering the sidewalls of the isolation layer and the alignment feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device, comprising:
   forming a semiconductor fin on a semiconductor substrate;
   forming an isolation layer to cover a portion of the semiconductor fin;
   forming a contact alignment feature in the portion of semiconductor fin covered by the isolation layer;
   forming a first source/drain feature and a second source/drain feature over the semiconductor fin, wherein the first source/drain feature is aligned with the contact alignment feature;
   after forming the first and second source/drain features, removing the portion of the semiconductor fin in the isolation layer;
   forming a sacrificial liner to cover vertical sidewalls of the isolation layer and the contact alignment feature; and
   performing an etch process to expose the second source/drain feature with the sacrificial liner covering the sidewalls of the isolation layer and the alignment feature.

2. The method of claim 1, wherein performing an etch process comprises recess etching the second source/drain feature.

3. The method of claim 2, further comprising:
   removing the sacrificial liner; and
   forming a spacer liner over the second source/drain feature.

4. The method of claim 3, further comprising:
   removing the contact alignment feature to expose the first source/drain feature; and
   forming a conductive feature over the first source/drain feature.

5. The method of claim 3, further comprising depositing a fill dielectric material over the spacer liner.

6. The method of claim 2, wherein the recess etching the second source/drain feature comprises recess etching the second source/drain feature to expose a portion of an inner spacer formed between the second source/drain feature and a gate structure.

7. The method of claim 1, where forming the semiconductor fin comprises:
   forming a semiconductor stack on a front side of the substrate, wherein the semiconductor stack comprises:
      two or more first semiconductor layers; and
      two or more second semiconductor layers alternatively stacked with the first semiconductive layer; and
   etching the semiconductor stack and a portion of the substrate to form the semiconductor fin.

8. The method of claim 7, further comprising: prior to removing a portion of semiconductor fin in contact with the isolation layer,
- removing the two or more first semiconductor layers disposed between the first and second source/drain features;
- forming a gate dielectric layer on the two or more semiconductor layers disposed the first and second source/drain features; and
- forming a gate electrode layer on the gate dielectric layer.

9. The method of claim 8, further comprising:
- forming a front contact feature in connection with the second source/drain feature.

10. The method of claim 1, wherein forming the sacrificial liner comprises:
- depositing a conformal layer over all exposed surfaces; and
- anisotropically etching the conformal layer to expose horizontal surfaces.

11. The method of claim 10, wherein the sacrificial liner comprises a metal oxide.

12. A method, comprising:
- processing a front side of a substrate to form a structure comprising:
  - a first source/drain feature;
  - a second source/drain feature;
  - a semiconductor channel between the first and second source drain features;
  - a gate dielectric layer on the semiconductor channel; and
  - an inner spacer formed between the gate dielectric layer and the second source/drain feature;
- processing a back side of the substrate for form:
  - a spacer liner in contact with the inner spacer, the gate dielectric layer, and a top surface of the second source/drain feature; and
  - a first conductive feature formed on a top surface of the first source/drain feature, wherein the top surface of the first source/drain feature is higher than the top surface of the second source/drain feature.

13. The method of claim 12, further comprising depositing a fill dielectric material formed over the spacer liner.

14. The method of claim 12, wherein the first source/drain feature contacts the first conductive feature along a first surface, the second source/drain feature contacts the spacer liner along a second surface, and the first surface and the second surface are at different levels.

15. The method of claim 12, further comprising:
- forming a first hybrid fin and a second hybrid fin parallel to the first hybrid fin, wherein the first source/drain feature, the second source/drain feature, and the semiconductor channel are disposed between the first and second hybrid fins, and the spacer liner is in contact with sidewalls of the first and second hybrid fins.

16. The method of claim 12, wherein processing the front side of the substrate further comprises forming a second conductive feature in contact with the second source/drain feature.

17. A method for forming a semiconductor device, comprising:
- forming a semiconductor fin on a semiconductor substrate;
- forming an isolation layer to cover a portion of the semiconductor fin;
- forming first and second dielectric fins in contact with the isolation layer;
- forming first source/drain feature and second source/drain features between the first and second dielectric fins; and
- forming a dielectric feature in contact with the second source/drain feature, wherein the dielectric feature includes a first portion formed in the isolation layer, and a second portion formed between the first and second dielectric fins, and the second portion is wider than the first portion; and
- forming a first conductive feature in the isolation layer and extending between the first and second dielectric fins to contact the first source/drain feature.

18. The method of claim 17, wherein forming the dielectric feature comprising:
- depositing a spacer liner; and
- depositing a fill dielectric material over the spacer liner, wherein the spacer liner contacts the sidewalls of the first and second dielectric fins.

19. The method of claim 17, further comprising:
- forming two or more semiconductor channels from a portion of the semiconductor fin, wherein the semiconductor channel is in contact with the first and second sourced/drain feature; and
- forming a gate dielectric layer surrounding the two or more semiconductor channels, wherein the dielectric feature is in contact with the gate dielectric layer.

20. The method of claim 19, further comprising
- forming inner spacers between the two or more semiconductor channels, wherein the dielectric feature is in contact with one of the inner spacers.

* * * * *